US009236393B1

(12) United States Patent
Cernea

(10) Patent No.: US 9,236,393 B1
(45) Date of Patent: Jan. 12, 2016

(54) 3D NAND MEMORY WITH SOCKETED FLOATING GATE CELLS

(71) Applicant: SanDisk Technologies, Inc., Plano, TX (US)

(72) Inventor: Raul Adrian Cernea, Santa Clara, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/494,869

(22) Filed: Sep. 24, 2014

(51) Int. Cl.
  *H01L 27/115* (2006.01)
  *H01L 29/423* (2006.01)
  *H01L 29/788* (2006.01)
  *H01L 29/04* (2006.01)

(52) U.S. Cl.
  CPC .... *H01L 27/11556* (2013.01); *H01L 27/11524* (2013.01); *H01L 27/11551* (2013.01); *H01L 29/42324* (2013.01); *H01L 29/788* (2013.01); *H01L 29/04* (2013.01)

(58) Field of Classification Search
  CPC .................. H01L 27/11556; H01L 29/42328
  USPC ......................................................... 365/185
  See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,726 B1 | 4/2001 | Cha |
| 7,558,141 B2 | 7/2009 | Katsumata et al. |
| 7,626,864 B2 * | 12/2009 | Wang ................... H01L 27/115 257/315 |
| 8,405,142 B2 | 3/2013 | Katsumata et al. |
| 2006/0270156 A1 * | 11/2006 | Kim ................. H01L 21/28273 438/257 |

(Continued)

OTHER PUBLICATIONS

Eitan et al. "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Julio J Maldonado
*Assistant Examiner* — Omar Mojaddedi
(74) *Attorney, Agent, or Firm* — Davis Wright Tremaine LLP

(57) ABSTRACT

A 3D NAND memory has vertical NAND strings across multiple memory planes above a substrate, with each memory cell of a NAND string residing in a different memory layer. Word lines in each memory plane each has a series of socket components aligned to embed respective floating gates of a group memory cells. In this way, the word line to floating gate capacitive coupling is enhanced thereby allowing a 4 to 8 times reduction in cell dimension as well as reducing floating-gate perturbations between neighboring cells. In one embodiment, each NAND string has source and drain switches that each employs an elongated polysilicon gate with metal strapping to enhance switching. The memory is fabricated by an open-trench process on a multi-layer slab that creates lateral grottoes for forming the socket components.

20 Claims, 54 Drawing Sheets

(56) References Cited

U.S. PATENT DOCUMENTS

| | | | |
|---|---|---|---|
| 2011/0309429 A1* | 12/2011 | Kiyotoshi | B82Y 30/00 257/321 |
| 2012/0220088 A1 | 8/2012 | Alsmeier | |
| 2012/0314468 A1 | 12/2012 | Siau et al. | |
| 2013/0083601 A1* | 4/2013 | Liu | H01L 27/11521 365/185.17 |
| 2013/0107628 A1 | 5/2013 | Dong et al. | |
| 2013/0153984 A1* | 6/2013 | Ramaswamy | H01L 27/11551 257/324 |
| 2013/0194871 A1 | 8/2013 | Lin et al. | |
| 2014/0252363 A1 | 9/2014 | Liu et al. | |

OTHER PUBLICATIONS

Non-Final Office Action issued in U.S. Appl. No. 14/494,877, mailed Jul. 31, 2015, 11 pages.

* cited by examiner

2D NAND MEMORY

3D NAND MEMORY

3D NAND MEMORY WITH SOCKETED FLOATING GATE CELLS

BACKGROUND

This application relates to three dimensional memory systems such as semiconductor flash memory, and more particularly to having memory cells, each with a charge-storage floating gate embedded by a socket structure of a word line.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric. 3D NAND memory devices using dielectric layer for storing charge have been described in U.S. Pat. Nos. 7,558,141 and 8,405,142.

SUMMARY

A 3D NAND memory has vertical NAND strings across multiple memory planes above a substrate, with each memory cell of a NAND string residing in a different memory layer. Word lines in each memory plane each has a series of socket components aligned to embed respective floating gates of a group memory cells.

Significant reduction in memory cell size is achieved by the present 3D NAND memory when a floating gate of each memory cell is embedded by a socket component of a word line. The 3D NAND memory has an array of memory cells arranged in a three-dimensional pattern defined by rectangular coordinates having x-, y-, z-directions. The memory cells are organized into NAND strings in the z-direction to form a 2D array of NAND strings in an x-y plane. Each NAND string is a daisy chain of memory cells with a channel terminated by a source-side transistor at a first end of the string and a drain-side transistor at a second end of the string. The respective memory cells of each NAND string are in corresponding memory planes which are stacked in the z-direction. The floating gate of each memory cell is aligned in the y-direction with a first end against the word line and a second end against the channel. The word line along a group of memory cells has a socket component for each memory cell where a respective floating gate has its first end embedded by a respective socket component and the second end at an open end of the socket component.

In this way, the floating gates surrounded by the socket word line have high coupling ratios, while maintaining small-cell dimension. This could allow a 4 to 8 times reduction in cell dimension as well as reduction in floating-gate perturbations between neighboring cells.

The memory is fabricated by an open-trench process on a multi-layer slab that creates lateral grottoes for forming the socket components.

A process of fabricating the 3D NAND memory includes forming a multi-layer slab on top of a semiconductor substrate with layers corresponding to structures of an array of vertically aligned NAND strings, and wherein the layers includes memory cell layers for forming memory cells of the NAND strings and for forming word lines with socket components; opening trenches in the multi-layer slab to expose the memory cell layers; forming grottoes at where memory cells are to be formed in the memory cell layers exposed by the trenches, each grotto having walls; forming in each grotto a socket component of a word line by lining the walls with deposition of a word line material; coating the word line material in each grotto with insulating material while leaving a remaining space in each grotto; filling the remaining space of each grotto with floating gate material to form a floating gate embedded in each grotto; forming other structures of the NAND strings and a plurality of bit lines through the trenches; and partitioning the multi-layer slab by an isolation material into individual memory cells accessible by respective word lines and bit lines.

Various aspects, advantages, features and embodiments of the present subject matters are included in the following description of exemplary examples thereof, which description should be taken in conjunction with the accompanying drawings. All patents, patent applications, articles, other publications, documents and things referenced herein are hereby incorporated herein by this reference in their entirety for all

DETAILED DESCRIPTION

Memory System

Figure 1:
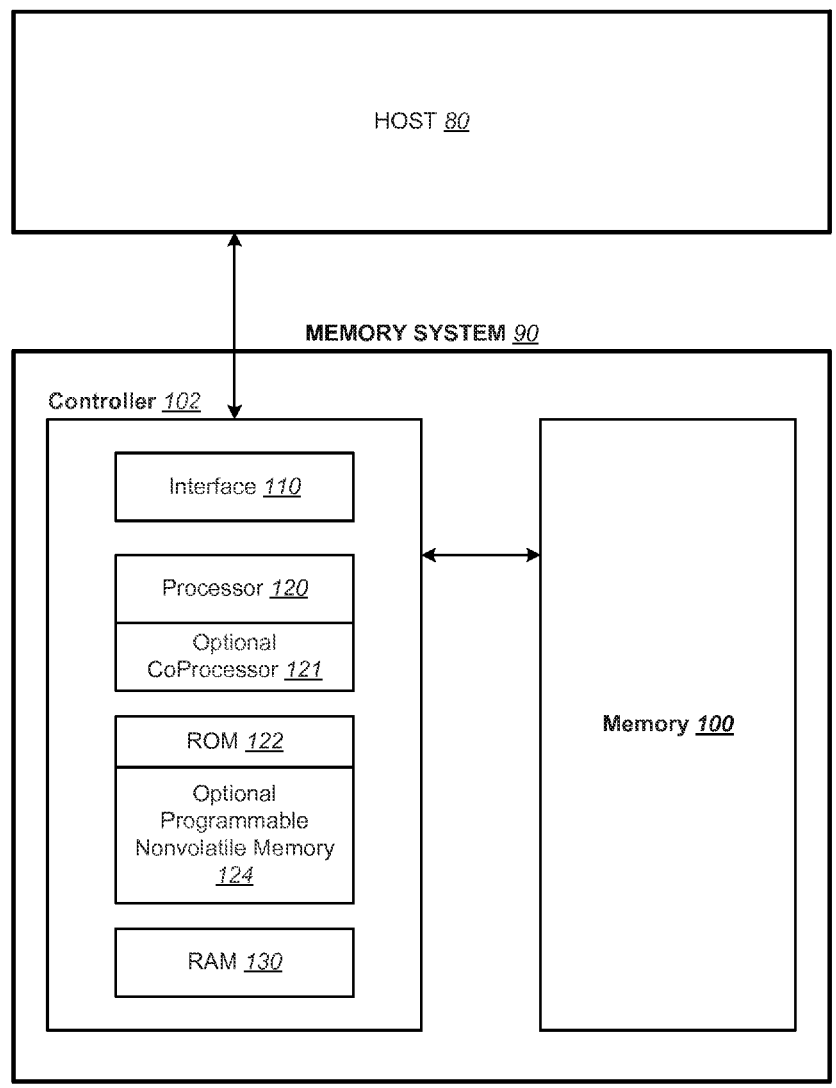
FIG. 1 illustrates schematically the main hardware components of a memory system suitable for implementing the present subject matter.

FIG. 1 illustrates schematically the main hardware components of a memory system suitable for implementing the present subject matter. The memory system 90 typically operates with a host 80 through a host interface. The memory system may be in the form of a removable memory such as a memory card, or may be in the form of an embedded memory system. The memory system 90 includes a memory 100 whose operations are controlled by a controller 102. The memory 100 comprises one or more array of non-volatile memory cells distributed over one or more integrated circuit chip. The controller 102 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The three dimensional exemplary structures described cover all relevant memory structures within the spirit and scope of the subject matter as described herein.

Physical Memory Structure

Figure 2:
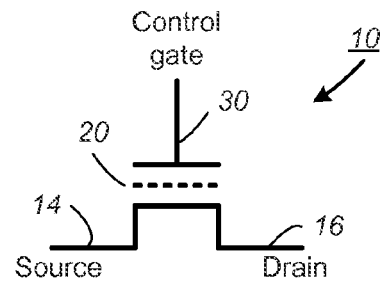
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
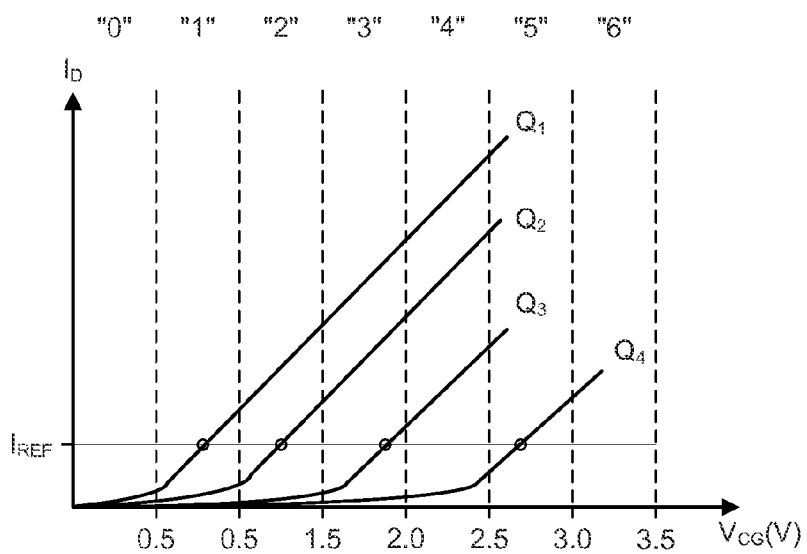
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5". In general, depending on the state partitioning of the threshold voltage window, a memory cell may be configured to store either one bit of data or more than one bit of data.

As can be seen from the description above, the more states a memory cell is made to store, the more finely divided is its threshold voltage window. For example, a memory device may have memory cells having a threshold voltage window that ranges from –1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
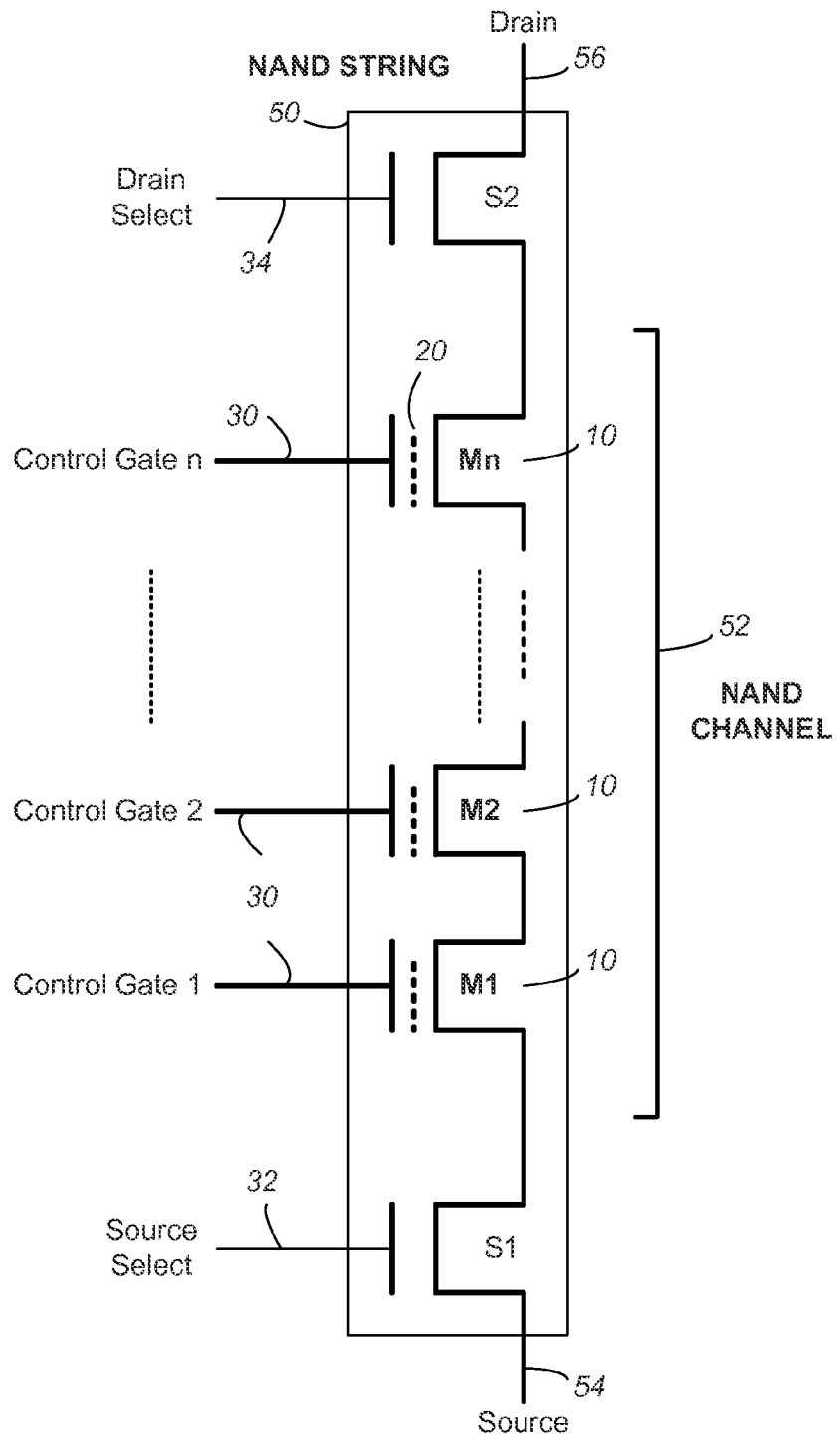
FIG. 4A illustrates schematically a string of memory cells organized into a NAND string.

FIG. 4A illustrates schematically a daisy chain of memory cells organized into a NAND string. A NAND string 50 comprises a series of memory transistors M1, M2, ... Mn (e.g., n=4, 8, 16 or higher) daisy-chained by their sources and drains. A pair of select transistors S1, S2, respectively on the source side and the drain side of the string, controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state.

A control gate 30 of each memory transistor allows control over read and write operations. As will be seen in FIG. 4B, the control gates 30 of corresponding memory transistors of a row of NAND string are all connected to the same word line 40. Similarly, a control gate 32 of the select transistor S1, and a control gate 34 of the select transistor S2, provide control access to the NAND string via its source terminal 54 and drain terminal 56 respectively. Likewise, the control gates 32 of corresponding select transistors S1 of a row of NAND string are all connected to the same select line 42. The control gates 34 of corresponding select transistors S2 of a row of NAND string are all connected to the same select line 44.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path along a NAND channel 52 is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
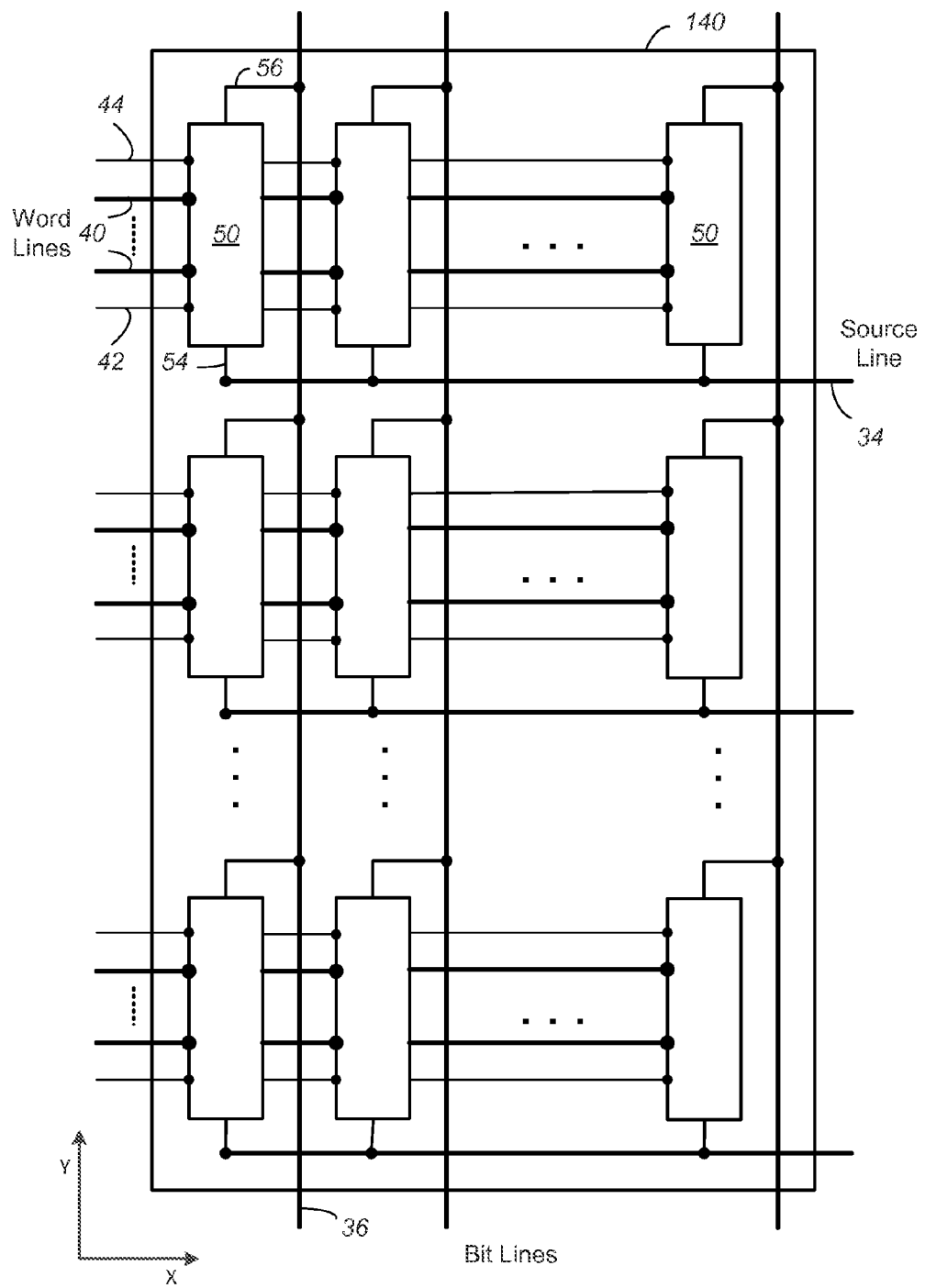
FIG. 4B illustrates an example of a NAND array of memory cells, constituted from NAND strings such as that shown in FIG. 4A.

FIG. 4B illustrates an example of a NAND array 140 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates 30 along a row of memory cells in a bank of NAND strings are connected to a word line such as word line 40. The control gates 32 along a row of select transistors S1 in a bank of NAND strings are connected to a select line such as select line 42. The control gates 34 along a row of select transistors S2 in a bank of NAND strings are connected to a select line such as select line 44. An entire row of memory cells in a bank of NAND strings can be addressed by appropriate voltages on the word lines and select lines of the bank of NAND strings.

Figure 5:
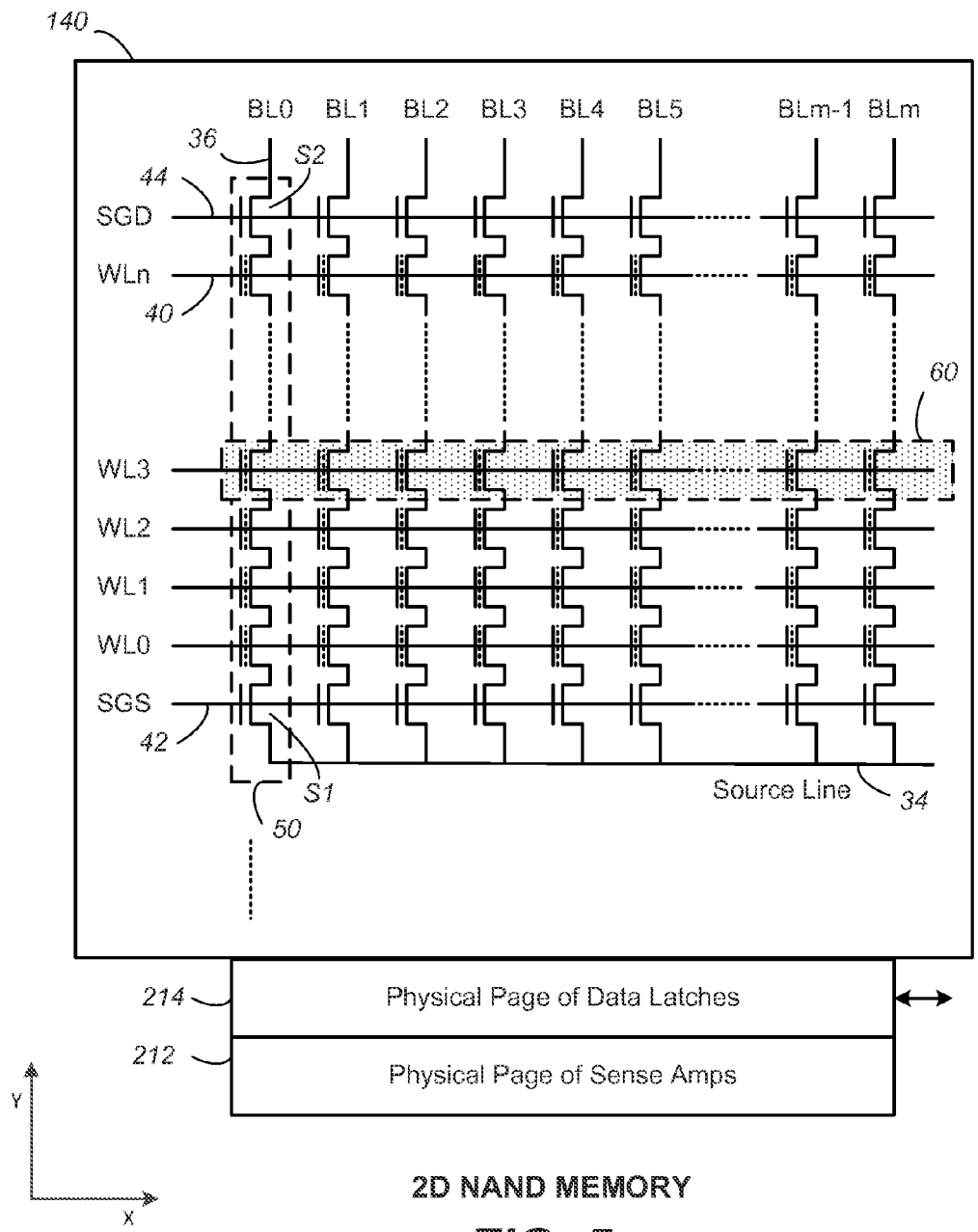
FIG. 5 illustrates a 2D NAND memory in the x-y plane.

FIG. 5 illustrates a 2D NAND memory in the x-y plane. The planar NAND memory is formed in a substrate. The memory is organized into pages, with each page of memory cells being sensed or programmed in parallel. FIG. 5A essentially shows a bank of NAND strings 50 in the memory array 140 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 150. The sensed results are latched in a corresponding set of latches 160. Each sense amplifier can be coupled to a NAND string via a bit line. The page is enabled by the control gates of the cells of the page connected in common to a word line 40 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Organization of the Memory into Erase Blocks

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
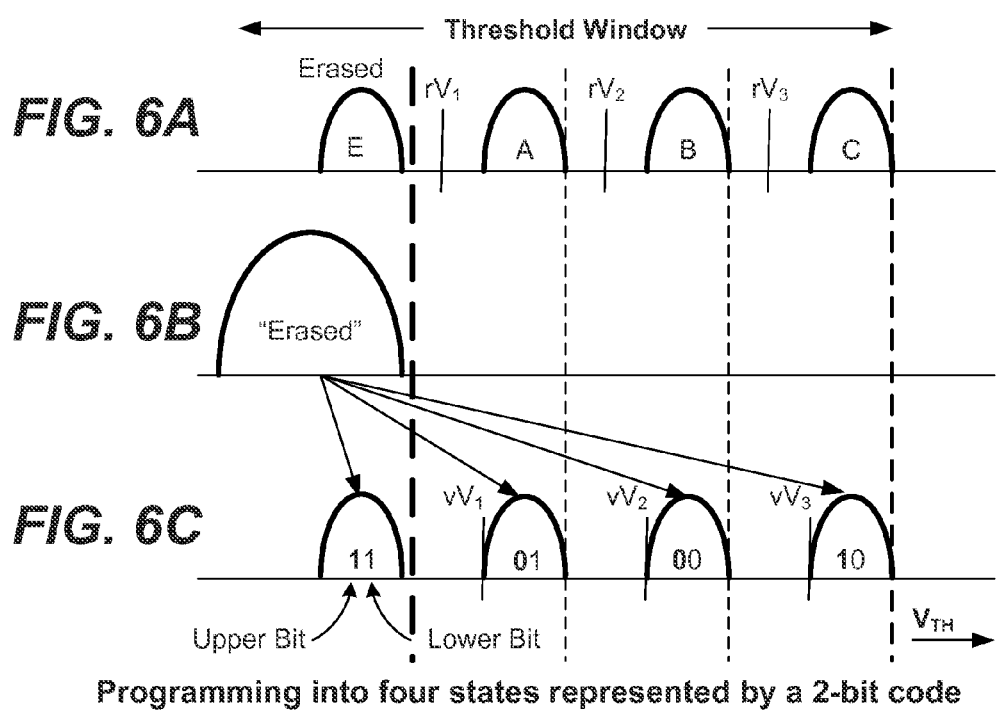
FIG. 6A illustrates the population of memory cells programmable into four distinct distributions of threshold voltages respectively representing memory states "E", "A", "B" and "C".
FIG. 6B illustrates the initial distribution of "erased" threshold voltages for an erased memory.
FIG. 6C illustrates an example of the memory after many of the memory cells have been programmed.

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

Figure 7:
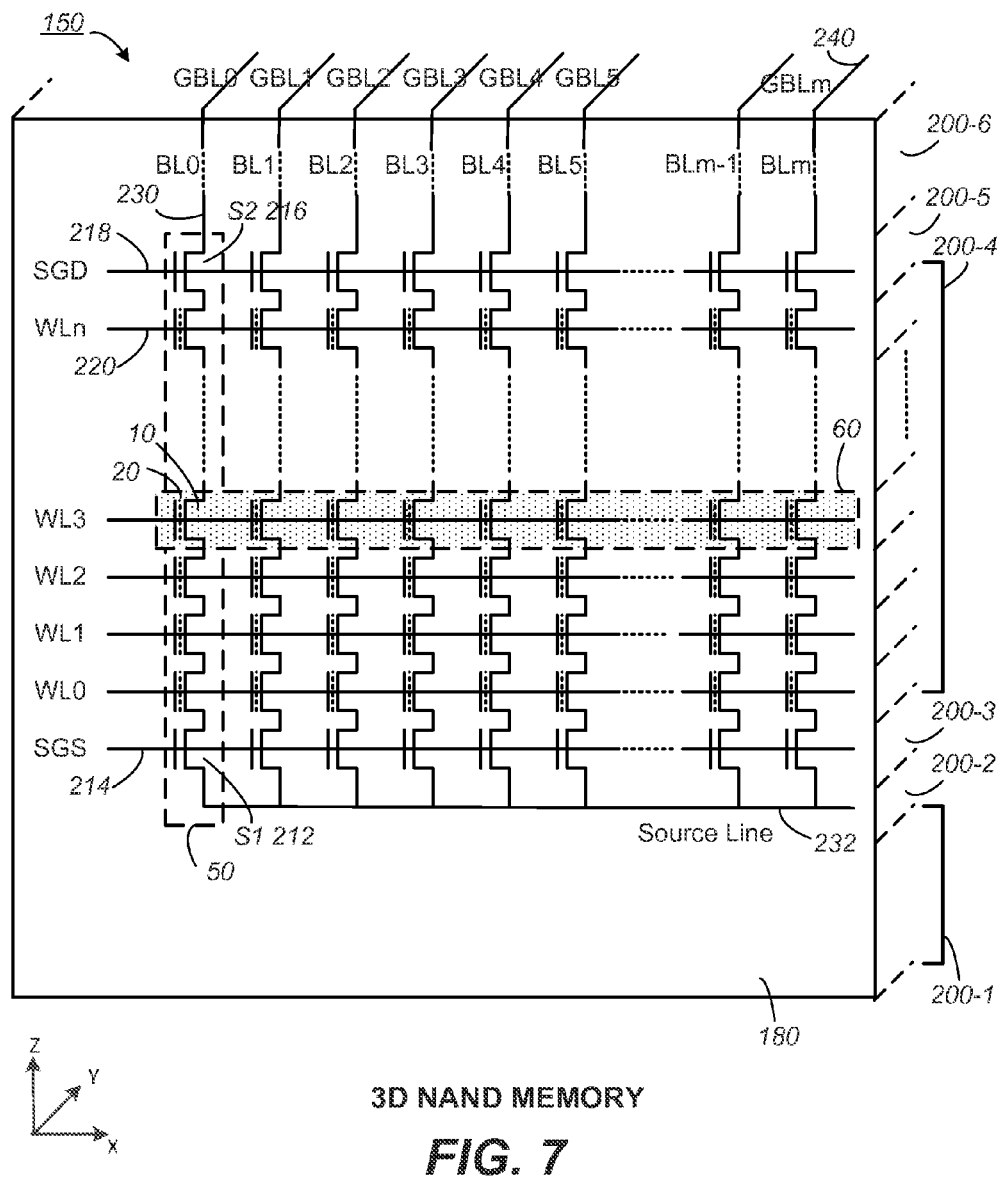
FIG. 7 is a schematic illustration of a 3D NAND memory, according to an architecture of the present subject matter.

FIG. 7 is a three-dimensional (3D) NAND array, which further extends a conventional two-dimensional (2D) NAND array illustrated in FIG. 5. In contrast to 2D NAND arrays, which are formed in a substrate of a planar surface of a semiconductor wafer, 3D arrays are formed on stacks of memory layers extend up from the substrate. Various 3D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Pat. No. 7,558,141, U.S. Pat. No. 8,405,142, U.S. Patent Publication Number 2012/0220088 and in U.S. Patent Publication Number 2013/0107628.

FIG. 7 is a schematic illustration of a 3D NAND memory, according to an architecture of the present subject matter. The 3D NAND memory 150 has NAND strings 50 line up in the z-direction. The NAND strings 50 form a 2D array of vertical strings in the x-y plane on top of the substrate 180. Memory cells 10 are at crossings where a vertical bit line (local bit line, e.g., BL0, BL1, etc.) 230 crosses a word line 220 (e.g. WL0, WL1, etc.). In the present embodiment, the vertical bit line 230 are doped polysilicon that forms the NAND channel 52 (see FIG. 4A) as well as part of the switches S1 and S2 of the NAND string. The page of vertical bit lines BL0-BLm 230, crossed by the same word line 220, are switchably connected to sense amplifiers (not shown) via corresponding global bit lines GBL0-GBLm 240. The global bit lines 240 are running along the y-direction and spaced apart in the x-direction. In one embodiment, the word lines 220 and the global bit lines 240 are metal lines.

As with planar NAND strings, select transistors S1 212, S2 216, are located at either end of the string to allow the NAND string to be selectively connected to, or isolated from external elements. For example, the select transistor S1 212, in response to a signal on a control line SGS 214, switches the source side of a NAND string to a common source line. The select transistor S2 216, in response to a signal on a control line SGD 218, switches the drain side of a NAND string to a local bit line 230, which in turn may be switched to a global bit line 240.

Vertical NAND strings may be operated in a similar manner to planar NAND strings and both SLC and MLC operations are possible. While FIG. 7 shows explicitly one bank of vertical NAND strings, it will be understood that similar banks are spaced apart in the y-direction.

The 3D NAND memory 150 forms multiple layers on top of a substrate 180. As the NAND strings are aligned vertically, each of the multiple layers corresponds to a structure of the vertical NAND string. For example, the substrate 180 forms a bottom substrate layer 200-1. On top of the substrate layer 200-1 is a first metal line layer 200-2, which corresponds to the source lines 222. The metal line layer 200-1 is followed by a source-side switch layer 200-3, which corresponds to the source-side switch S1 212 and control line SGS 214. The source-side switch layer 200-3 is followed by a memory layer 200-4 where the memory cells and word lines of the NAND string will reside. The memory layer 200-4 is followed by a drain-side switch layer 200-5, which corresponds to the drain-side switch S2 216 and control line SGD 218. The drain-side switch layer 200-5 is followed by a second metal line layer 200-6, which corresponds to the global bit lines 240.

The memory layer 200-4 further comprises of multiple memory cell layers corresponding to respective memory cells in the NAND string 50. The respective memory cells of each NAND string are in corresponding memory cell layers, which are stacked in the z-direction. Thus, each memory cell layer is a 2D array of memory cells from respective memory cells of the 2D array of vertical NAND strings in the x-y plane. For example, a first memory cell layer is contributed from all the first memory cells above the S1 switch of every NAND string. A second memory cell layer is contributed from all the memory cells above the first memory cells in the NAND strings.

Floating Gate Charge Storage Element Coupled to a Word Line with a Socket Structure Existing 3D NAND memories employ a charge trapping layer between the local bit line and the word line to store charge to modify the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

One difference between a three dimensional memory array and a two dimensional memory array is that certain physical dimensions of memory cells may vary with the location of the memory cells in the vertical direction. While memory cells in a planar array may be made by process steps that generally have uniform effect across the plane of the substrate, some steps in formation of three dimensional memory arrays are not uniform from layer to layer and may also have significant non-uniformity laterally across a substrate. For example, memory holes may be formed by etching down through multiple layers using an appropriate anisotropic etch. However, such holes may not be perfectly uniform from top to bottom because of the high aspect ratio that is typical of such memory holes. In general, such memory holes are wider towards the top than the bottom. Or, they may be widest somewhere near the top with some narrowing towards the top. This problem is more serious with the scaling of the memory to higher density. As the number of memory cells in a NAND string increases, so is the number of layers and the higher is the aspect ratio.

The present 3D NAND memory affords significant reduction in memory cell size allowing a 4 to 8 times reduction in cell dimension compared to existing 3D NAND memories. Instead of using a charge trapper layer with a annular geometry of small curvature to increase capacitive coupling with a word line, the present memory cell employs a floating gate 20 to trap charges. In particular, the size of the memory cells is reduced without having to use a conventional floating gate to ensure sufficient capacitive coupling with the word line. This is accomplished by each floating gate being embedded by a socket component of a word line, which increases capacitive coupling. In addition, this geometry has the benefit that floating-gate to floating-gate disturb (Yupin effect) between neighboring memory cells are diminished.

Figure 8:
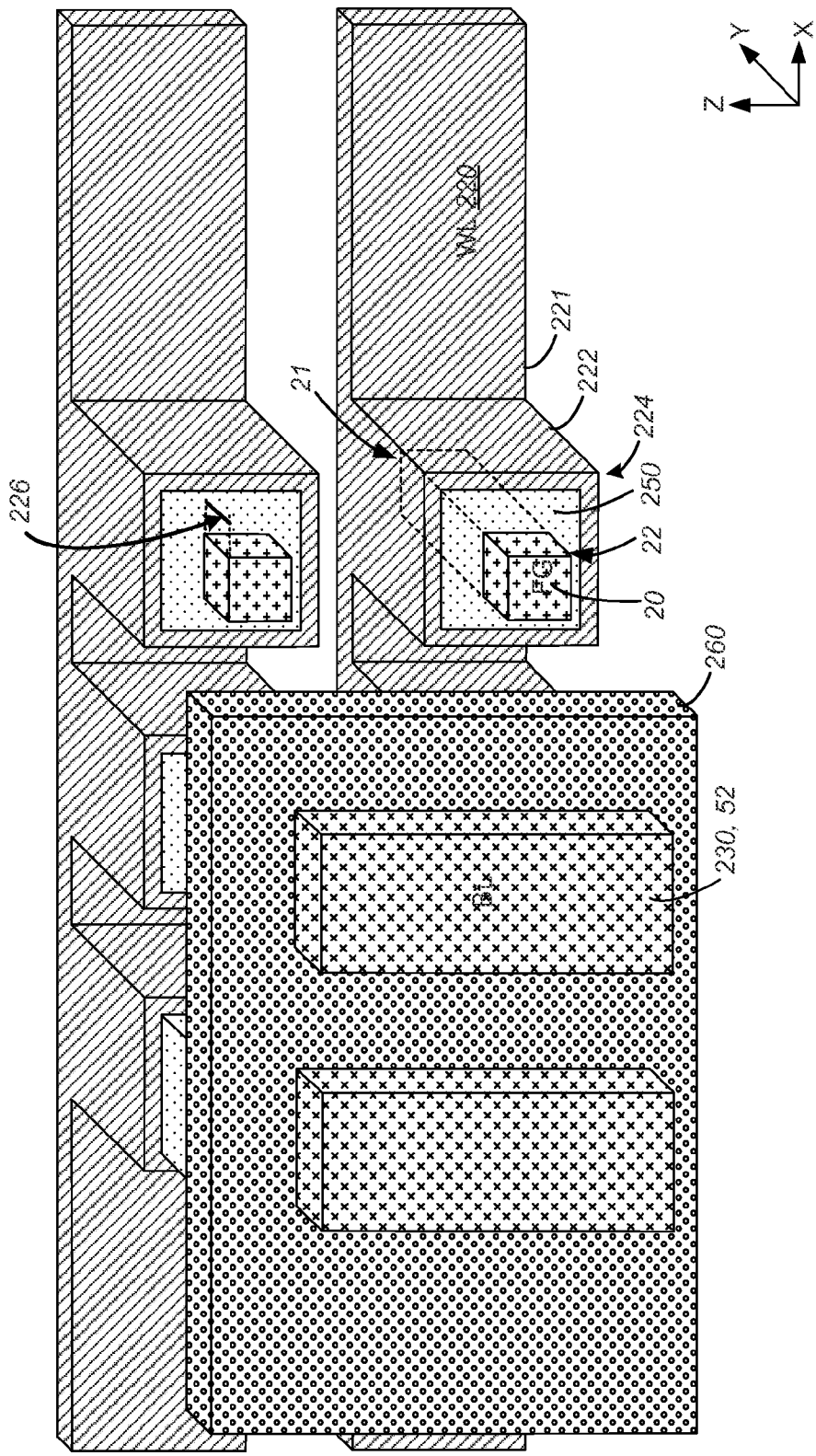
FIG. 8 illustrates details of the 3D NAND memory with word lines each having a series of socket components to receive individual floating gates of a group of memory cells.

FIG. 8 illustrates details of the 3D NAND memory with word lines each having a series of socket components to receive individual floating gates of a group of memory cells. The floating gate 20 of each memory cell is aligned in the y-direction with a first end 21 against the word line 220 and a second end 22 against the channel 52 of the NAND string 50, which forms part of the bit line 230. The word line 220 along a group (page 60) of memory cells (see FIG. 7) has a back plate 221 and series of socket components 222, one for each memory cell of the group. Each socket component 222 is aligned in the y-direction with an opening 224. At each memory cell, its floating gate 20 has a first end 21 embedded by a respective socket component 222 and a second end 22 sticking out from the opening 224 of the respective socket component 222 with an offset 226.

The floating gate 20 of each memory cell is isolated from the respective socket component 222 by a dielectric material 250. The channel 52 or bit line 230 is isolated from the floating gate 20 and the word line 210 by a tunnel oxide 260.

Figures 9A, 9B:
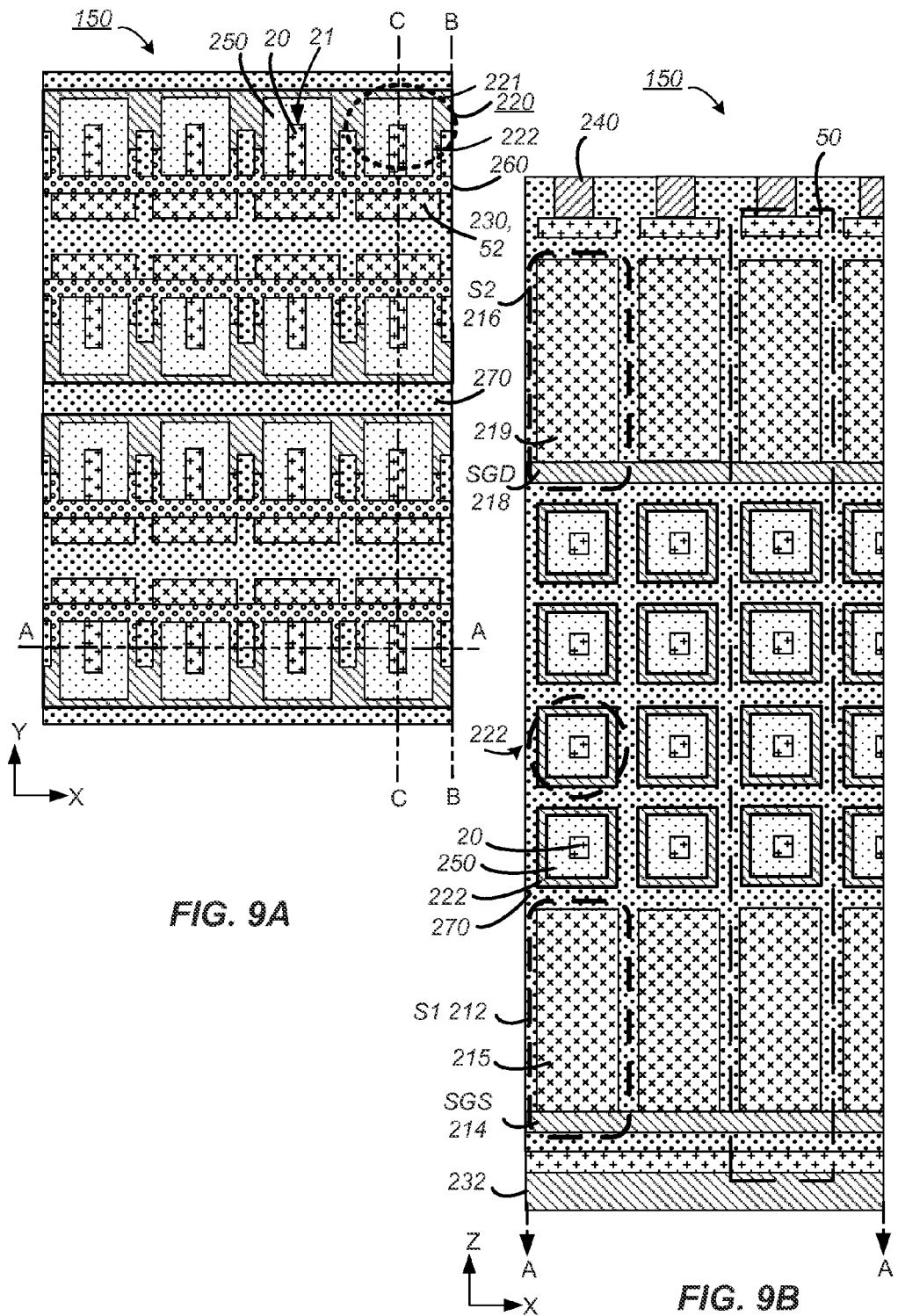
FIG. 9A is a plan view of a portion of the 3D NAND memory in the x-y plane.
FIG. 9B is a sectional view of a portion of the 3D NAND memory in the x-z plane along the cut A-A shown in FIG. 9A.

FIG. 9A is a plan view of a portion of the 3D NAND memory in the x-y plane. As is consistent with the orientation of the memory shown in FIGS. 7 and 8, the NAND string 50 and therefore the NAND channel 52 is along the z-direction, the word line 220 is along the x-direction and the floating gate 20 is along the y-direction. FIG. 9A illustrates the memory layout looking along the z-direction. Only four word lines 220 spaced apart in the y-direction are shown. The four word lines 220 are isolated from each other by an isolation oxide 270. Each word line run horizontally along the x-direction and show four socket components 222. It will be seen that at each memory cell location, the first end 21 of the floating gate 20 is embedded in a respective socket component 222. The floating gate 20 of each memory cell is isolated from the respective socket component 222 by a dielectric material 250. The channel 52 or bit line 230 is isolated from the floating gate 20 and the word line 220 by a tunnel oxide 260.

FIG. 9A also shows three reference cuts for further references. A cut A-A is in the x-z plane at a given y location, which cuts through the center of the series of socket components 222 of a word line. A cut B-B is in the x-z plane at a boundary between two adjacent memory cells and therefore between two adjacent socket components 222 along the x-direction. A cut C-C is in the x-z plane right through the center of a memory cell and therefore through the center of a socket component 222 along the x-direction.

FIG. 9B is a sectional view of a portion of the 3D NAND memory in the x-z plane along the cut A-A shown in FIG. 9A. In this view, four NAND strings 50 are shown aligned in the z-direction. For expediency, each NAND string 50 is shown with four memory cells in the chain. Again, as in FIG. 9A, a socket component 222 of a word line 220 at each memory cell allows a floating gate 20 to be embedded into the socket component. At the source side of the NAND chain 50, the daisy chain of memory cells is connected to the source-side switch S1 212 (see FIG. 9C) with the control line SGS 214. The drain side of the NAND chain 50 is connected to the drain-side switch S2 216 (see FIG. 9C) with the control line SGD 218. The channel of the NAND chain 50 forms part of a bit line 230. The source-side switch S1 212 switches the source terminal of a NAND string 50 to the common metal source line 232. The drain-side switch S2 216 switches the drain terminal of the NAND string 50 to a metal global bit line 240.

In this view in the x-z plane, the word lines, are running along the x-direction, horizontally row-by-row. In each row, the socket components 222 associated with a word line 220 are electrically connected by the word line through a base plate as can be seen in FIG. 9A. Each socket component 222 is aligned in the y-direction and embeds a floating gate 20, which is isolated by the dielectric material 250.

Figure 9C:
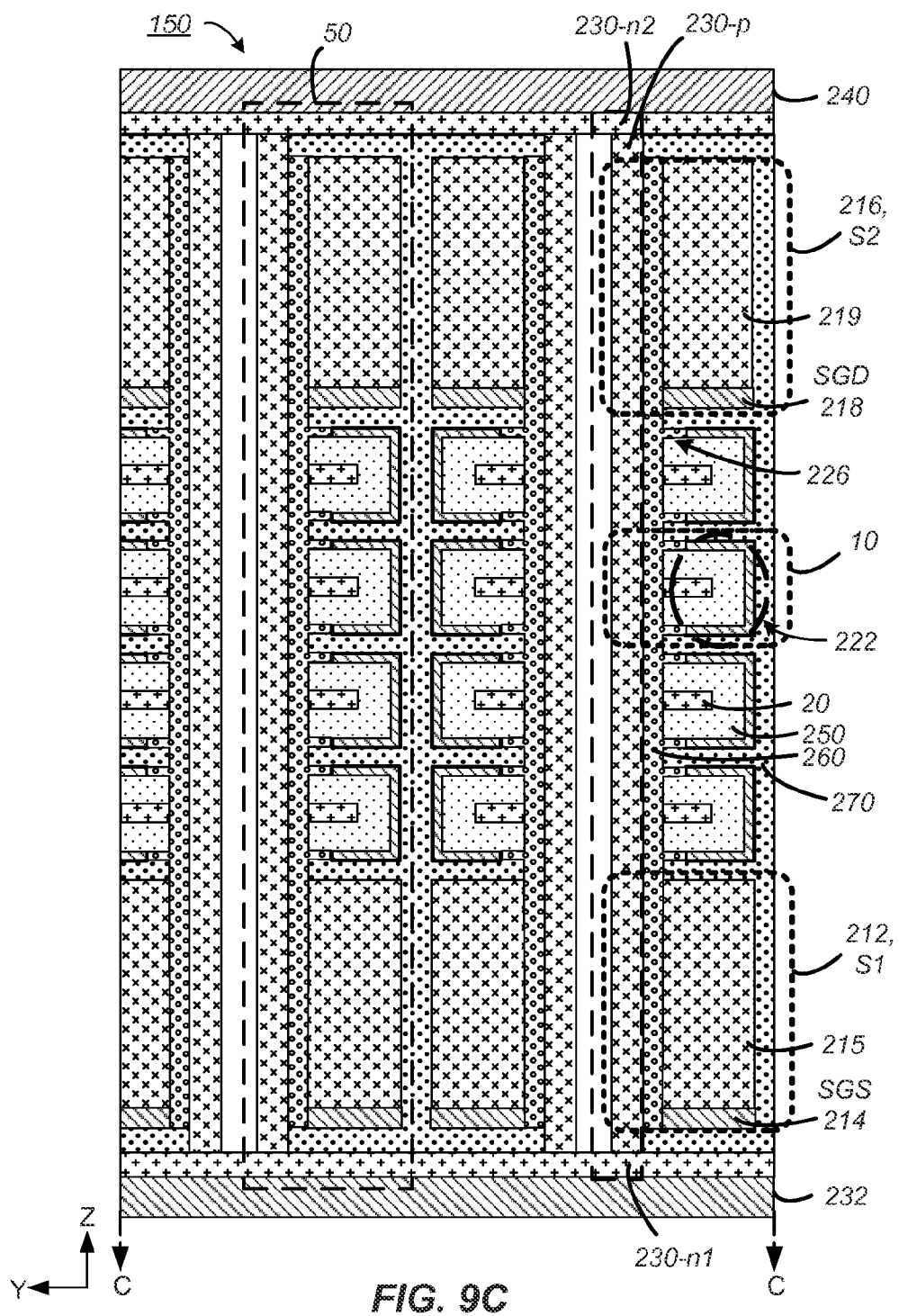
FIG. 9C is a sectional view of a portion of the 3D NAND memory in the y-z plane along the cut C-C shown in FIG. 9A.

FIG. 9C is a sectional view of a portion of the 3D NAND memory in the y-z plane along the cut C-C shown in FIG. 9A. In this view, each NAND string 50 is shown aligned in the z-direction, straddling between the common source line 232 and a global bit line 240. The NAND string 50 is illustrated with four memory cells in the chain and terminated on the source side by the source-side transistor switch S1 212 and on the drain side by the drain-side transistor switch S2 216. Again, as in FIG. 9A, a socket component 222 of a word line 220 at each memory cell allows a floating gate 20 to be embedded into the socket component 222.

The channel 52 of the NAND string 50, which is part of the bit line 230, can be clearly seen. The bit line 230 comprises different portions of the channel, such as channel portion 230-n1, channel portion 230-p, and channel portion 230-n2, which together straddle in series between the source line 232 and the global bit line 240. In an embodiment, the different portions of the channel portions are of polysilicon ("poly") with different doping. For example, the channel portion 220-p adjacent the memory cells and the switches S1 and S2 are of p-doped poly. The channel portion 220-n1 between the channel portion 220-p and the common source line is of n-doped poly. The channel portion 220-n2 between the channel portion 220-p and the global bit line is of n-doped poly. In this way, an n-p-n channel is formed. Application of voltages on the various gates (word lines 220, SGS 214, SGD 218) will exert electric field on the channel portion 230-p to possibly cause a local inversion to n-type. When all the gates are turned on, the entire channel portion 230-p will be inverted into an n-type channel, thereby causing conduction along the entire channel 52 and bit line 230.

As can be seen from FIG. 9C, the vertical NAND strings are arranged in pairs, with each pair back-to-back (the closed end of their socket components adjacent each other and their channels facing out).

NAND String with Source- and Drain-Side Transistor Switches Having an Elongated Polysilicon Gate According to one aspect of the present 3D NAND memory, each NAND string has a source-side and a drain-side transistor switch, which employ an elongated polysilicon gate with metal strapping to enhance switching.

The 3D NAND memory includes a 3D array of memory cells arranged in a three-dimensional pattern on top of a semiconductor substrate; the 3D array of memory cells being organized into a 2D array of NAND strings aligned vertically relative to the substrate, and each NAND string further including a daisy-chain of vertically stacked memory cells; a channel having first and second ends terminated by a source-side transistor on the first end and a drain-side transistor on the second end; and said source-side transistor having a source-side control gate, which comprises a source-side metal gate strapped to a vertical, elongated source-side doped polysilicon gate.

In contrast, prior art 3D NAND memory has a NAND string where the source- and drain-side transistor switches are implemented by controlling a small bank of dedicated memory cells near each end of the string. The dedicated memory cells in the small bank have their floating gates programmed appropriately to allow the small bank of dedicated memory cells to act as a switch. However, since each NAND string is part of an erase block, every time the block is erased through use, additional system management will be require to reprogram these small bank of dedicated memory cells.

FIG. 9C shows the NAND strings with a source-side transistor switch or a drain-side transistor switch having an elongated polysilicon gate. The source-side transistor switch S1 212 and the drain-side transistor switch S2 216 each has an elongated gate. The source-side transistor switch S1 212 has a polysilicon gate 215 strapped with the metal line SGS 212. The drain-side transistor switch S2 216 has a polysilicon gate 219 strapped with the metal line SGD 218. The polysilicon gate is fabricated from conductive, doped polysilicon. The length of the gate is designed to provide the required switching capacity for the operating current in the NAND string 50. To enhance the conductivity of the polysilicon gate, the metal line, such as metal line 214 or metal line 218 is used to strap the polysilicon gate.

A Self-Aligned Process of Fabricating the 3D NAND Memory

The 3D NAND memory shown in FIGS. 9A, 9B and 9C essentially has the vertical (z-direction) NAND strings forming a 2D array in the x-y plane. Each NAND string includes a chain of memory cells and a bit line (230-n1, 230-p, 230-n2) aligned in the z-direction, each memory cell 10 accessible by word lines 220 (see also FIG. 8) in the x-direction. Each word line has a back plate 221 and, at each memory cell's location, a socket component 222. A floating gate 20 is formed at each memory cell 10 between the bit line 230 and the word line 220 and is inserted into the socket component 222 of each memory cell.

In one embodiment, the word lines in the x-direction in each cell memory plane are grouped in pairs in the y-direction, with the socket component openings 224 of one of the pair facing that of the other of the pair. This architecture allows the NAND strings associated with the pair of word lines to be processed at the same time via a trench between the two word lines. Thus, in a memory cell plane, each pair of word lines have their socket components 222 facing each other and back plates 221 of a word line of each pair faces a back plate from an adjacent pair (see FIG. 9A).

Figure 10:
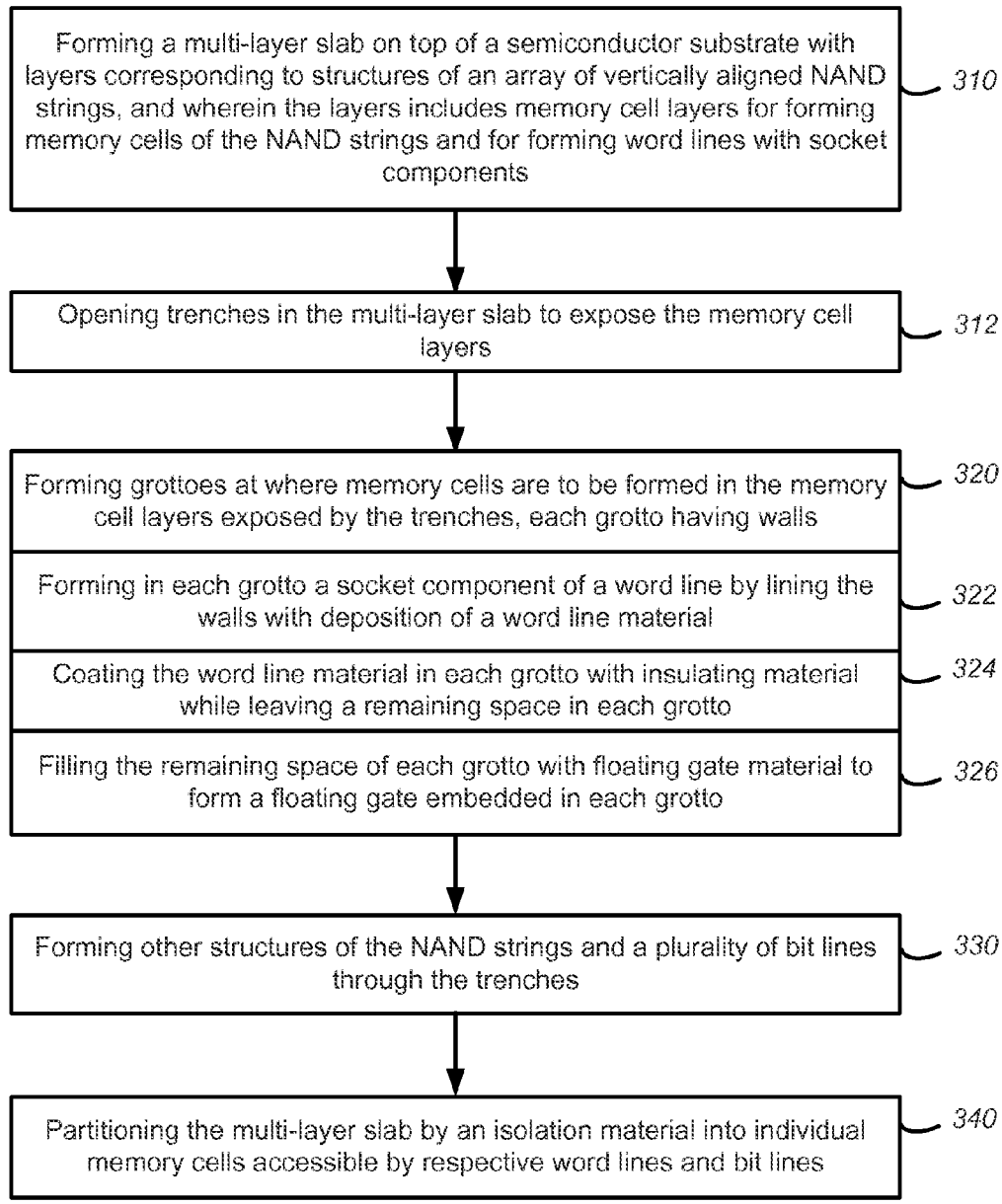
FIG. 10 illustrates a gross scheme of fabricating such a 3D NAND memory that includes the following process steps.

FIG. 10 illustrates a gross scheme of fabricating such a 3D NAND memory that includes the following process steps.

STEP 310: Forming a multi-layer slab on top of a semiconductor substrate with layers corresponding to structures of an array of vertically aligned NAND strings, and wherein the layers includes memory cell layers for forming memory cells of the NAND strings and for forming word lines with socket components.

STEP 312: Opening trenches in the multi-layer slab to expose the memory cell layers.

STEP 320: Forming grottoes at where memory cells are to be formed in the memory cell layers exposed by the trenches, each grotto having walls.

STEP 322: Forming in each grotto a socket component of a word line by lining the walls with deposition of a word line material.

STEP 324: Coating the word line material in each grotto with insulating material while leaving a remaining space in each grotto.

STEP 326: Filling the remaining space of each grotto with floating gate to form a floating gate embedded in each grotto.

STEP 330: Forming other structures of the NAND strings and a plurality of bit lines through the trenches.

STEP 340: Partitioning the multi-layer slab by an isolation material into individual memory cells accessible by respective word lines and bit lines.

FIGS. 11A to 52B illustrate in more detail the process steps of fabricating the 3D NAND memory with socketed word lines and NAND strings having switching transistors with elongated polysilicon gates.

Figure 11A:
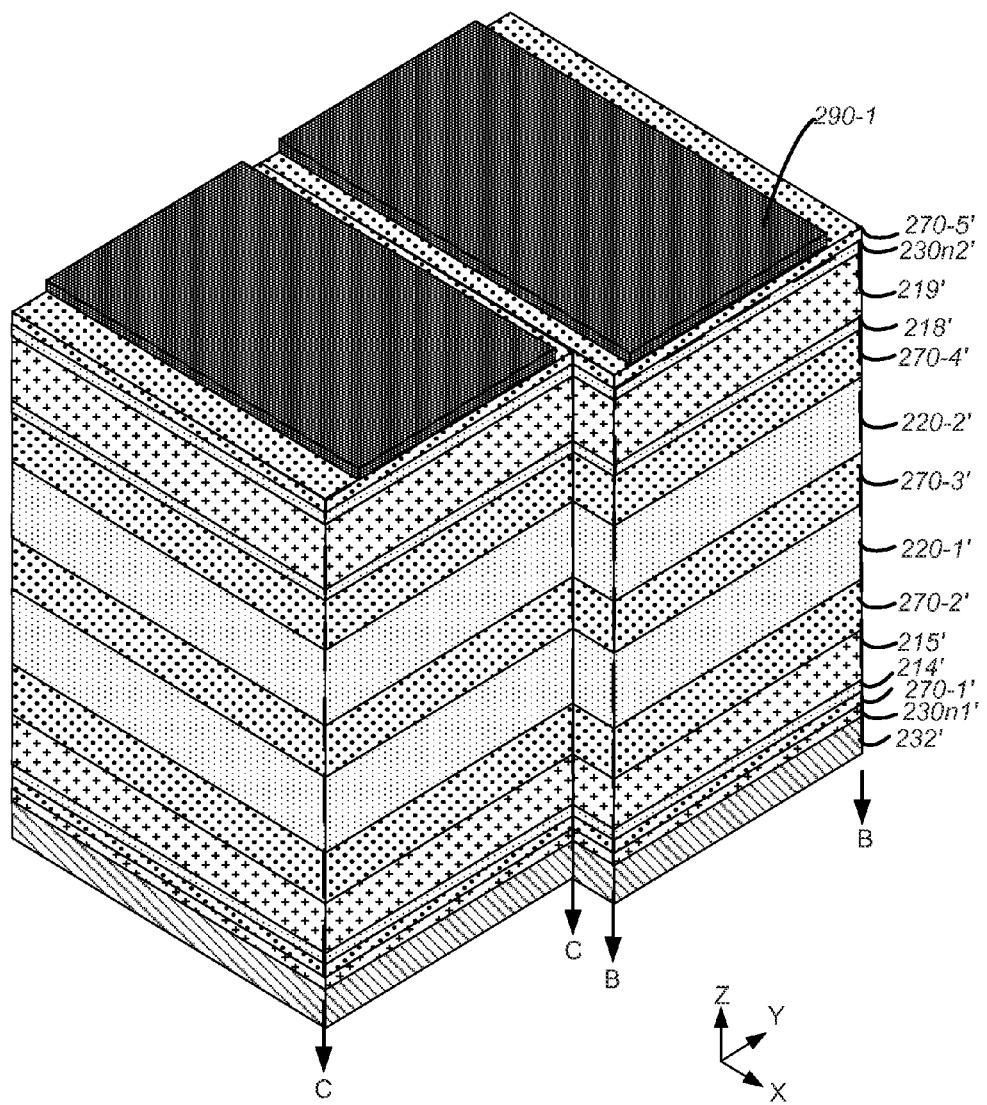
FIG. 11A is a 3D perspective view of the multi-layer slab. The slab comprises multiple layers formed on top of a substrate (not shown).

FIG. 11A is a 3D perspective view of the multi-layer slab. The slab comprises multiple layers formed on top of a substrate (not shown). Each layer corresponds to a structure of the vertical NAND string shown in FIG. 9C. Thus, the following layers are deposited from the bottom in turn: a first metal layer 232' for the common source line; an n-doped polysilicon 230n1' for the bottom n-portion of the NAND channel/bit line 230; an isolation oxide 270-1'; a nitride layer 214' (as a place-holder and sacrificial layer for metal select lines SGS 214); a doped polysilicon layer 215' for the elongated polysilicon gates 215; an isolation oxide layer 270-2'; a nitride layer 220-1' (as a place-holder and sacrificial layer for a first layer of memory cells including metal word lines 220 with socket components 222); an isolation layer 270-3'; a nitride layer 220-2' (as a place-holder and sacrificial layer for a second layer of memory cells including metal word lines 220 with socket components 222); an isolation layer 270-4'; a nitride layer 218' (for the metal line SGD 218); a doped polysilicon layer 219' for the elongated polysilicon gates 219; a nitride layer 230n2' (for n-doped portion of the bit line 230n2); an isolation oxide layer 270-5'. At the top layer is a mask 290-1.

For expediency, only two memory cell layers are illustrated in FIG. 11A. It will be understood if the NAND string 50 has a chain of n memory cells, there will be n number of memory cell layers.

Figure 11B:
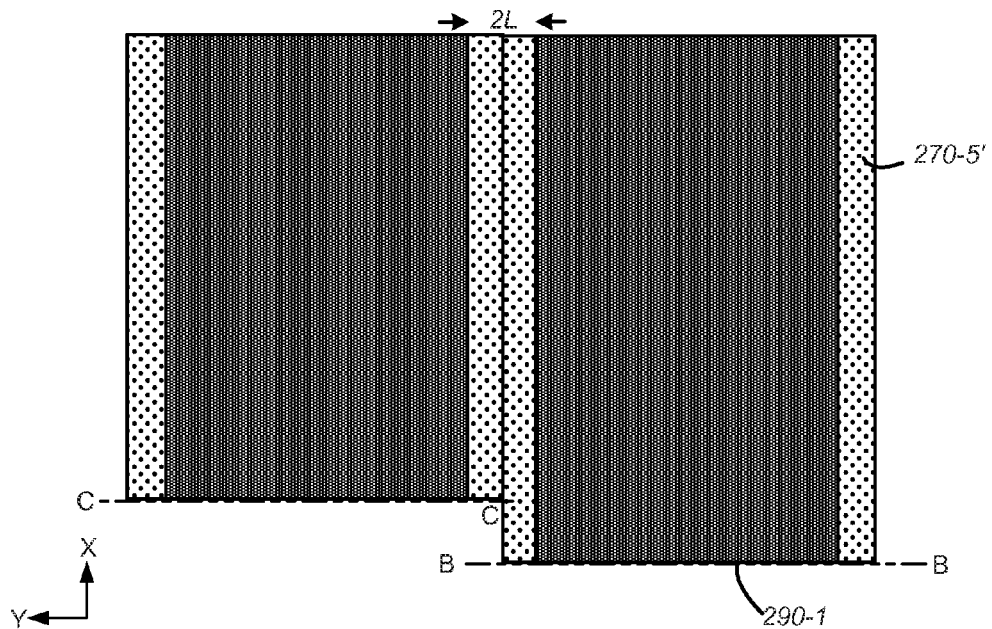
FIG. 11B is a top view of the multi-layer slab shown in FIG. 11A.

FIG. 11B is a top view of the multi-layer slab shown in FIG. 11A. Two panes are shown side-by-side. The right pane corresponds to the portion of the slab with a section taken at the cut B-B, which is also shown in FIG. 9A. The left pane corresponds to the portion of the slab with a section taken at the cut C-C, which is also shown in FIG. 9A. The mask 290-1 exposes strips of width 2L along the x-direction between where two back-to-back NAND strings are to be formed (see FIG. 9C).

Figure 11C:
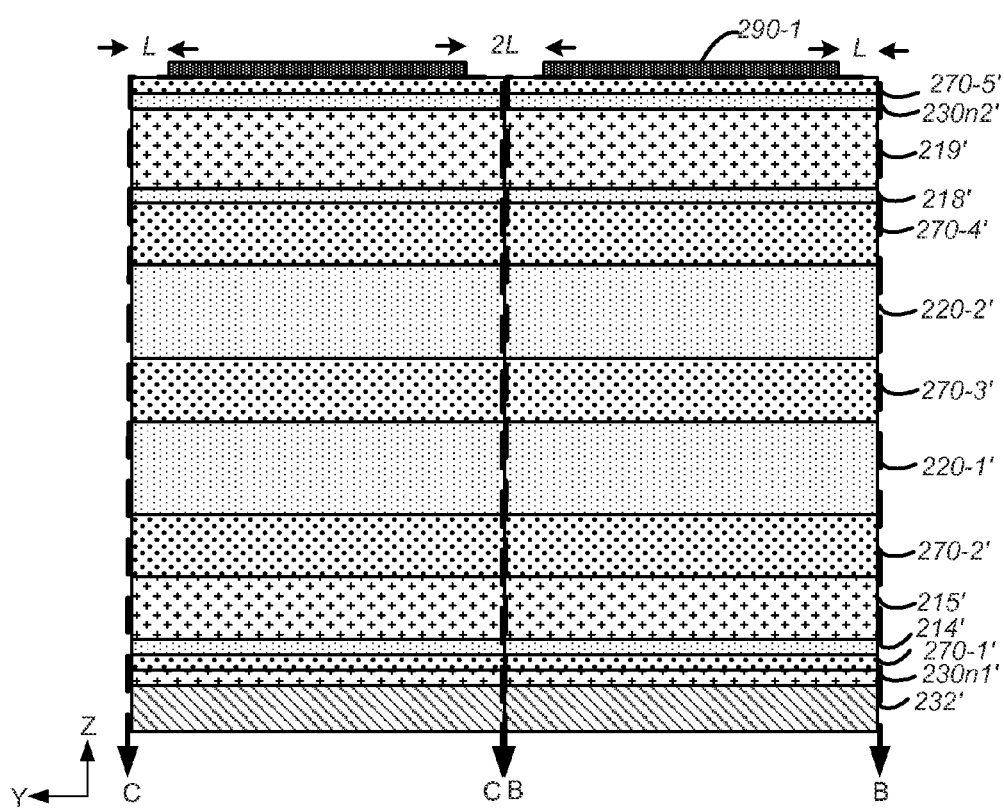
FIG. 11C is a sectional view in the y-z plane of the multi-layer slab shown in FIG. 11A and FIG. 11B.

FIG. 11C is a sectional view in the y-z plane of the multi-layer slab shown in FIG. 11A and FIG. 11B. Two sections are shown side-by-side. The right section corresponds to the section taken at the cut B-B, which is shown in FIG. 9A and FIG. 11B. The left section corresponds to the section taken at the cut C-C, which is shown in FIG. 9A and FIG. 11B. The mask 290-1 exposes strips along the x-direction parallel to the word lines. Each strip is of width 2L, where for example, L is of dimension 16 nanometers.

Figure 12A:
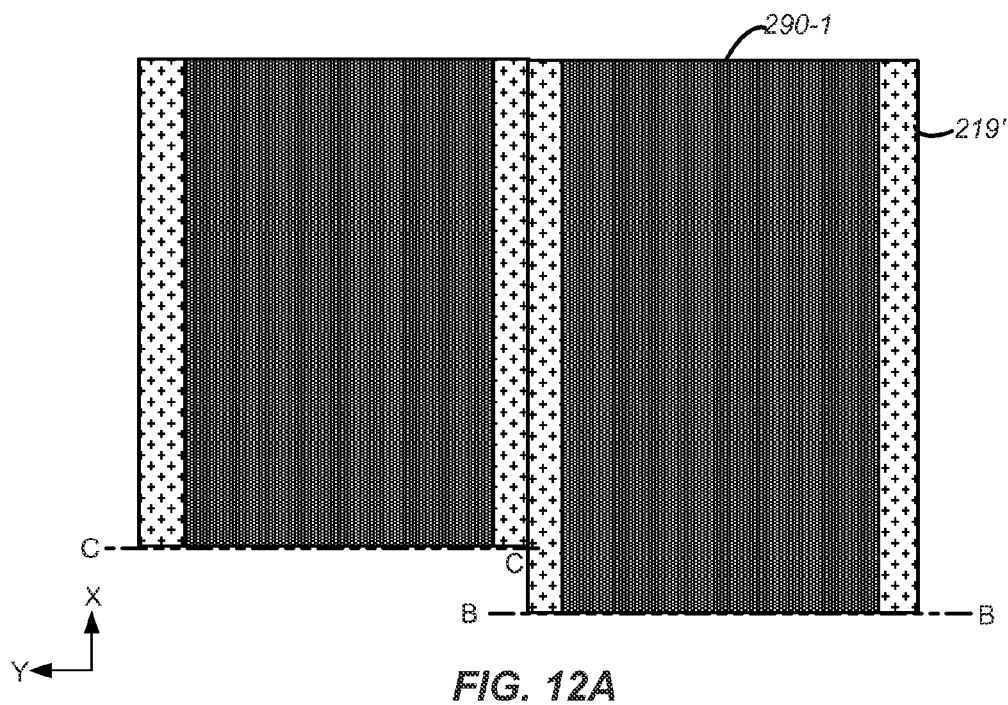
FIG. 12A is a top view of the multi-layer slab after an anisotropic etch through the exposed strips of the mask 290-1.

FIG. 12A is a top view of the multi-layer slab after an anisotropic etch through the exposed strips of the mask 290-1 through the layers 270', 280 to expose the doped polysilicon layer 219'.

Figure 12B:
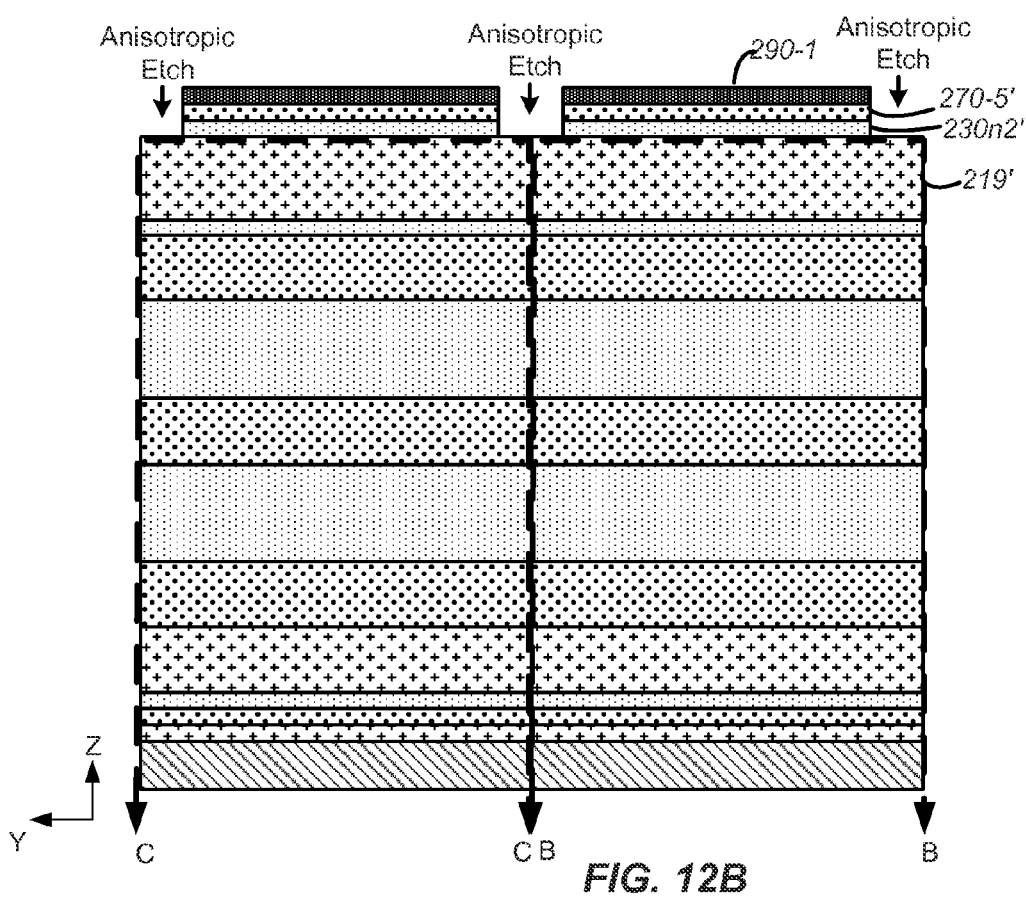
FIG. 12B is a sectional view in the y-z plane of the multi-layer slab shown in FIG. 12A.

FIG. 12B is a sectional view in the y-z plane of the multi-layer slab shown in FIG. 11A. As in FIG. 11C, the right section corresponds to the section taken at the cut B-B, which is shown in FIG. 9A and FIG. 12A. The left section corresponds to the section taken at the cut C-C, which is shown in FIG. 9A and FIG. 12A. The isotropic etch creates a trench through each exposed strip that stops at the doped polysilicon layer 219'.

Figure 13A:
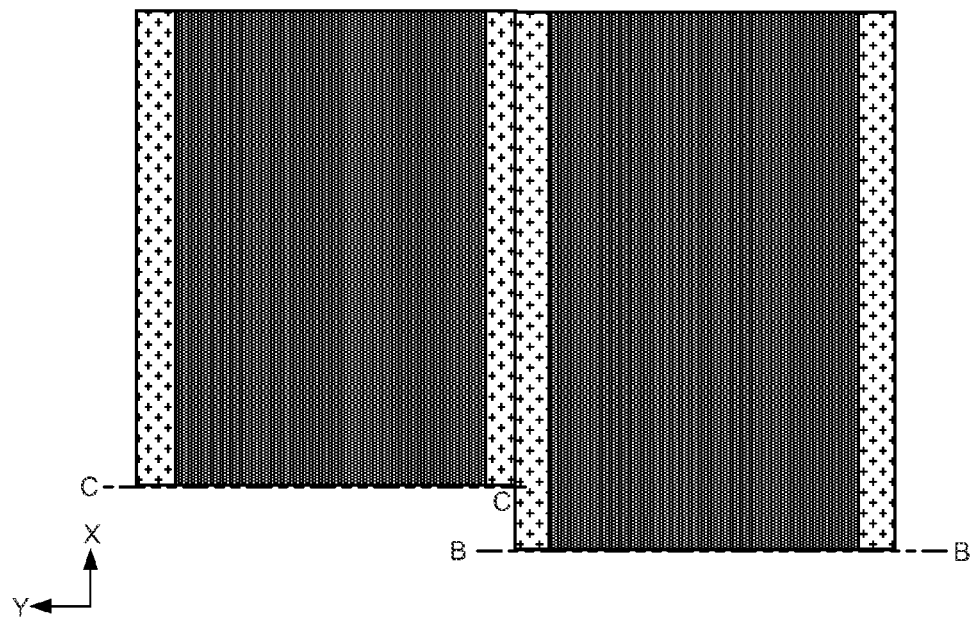
FIG. 13A is a top view of the multi-layer slab after a selective isotropic etch through the trench created in the anisotropic etch illustrated in FIG. 12B.

FIG. 13A is a top view of the multi-layer slab after a selective isotropic etch through the trench created in the anisotropic etch illustrated in FIG. 12B. The isotropic etch selectively etch back the nitride layer 230n2' by a predetermined width of L on either sides of the trench. This trims off an additional empty strip 292 of width L for the nitride layer 230n2' on either side of the trench along the x-direction.

Figure 13B:
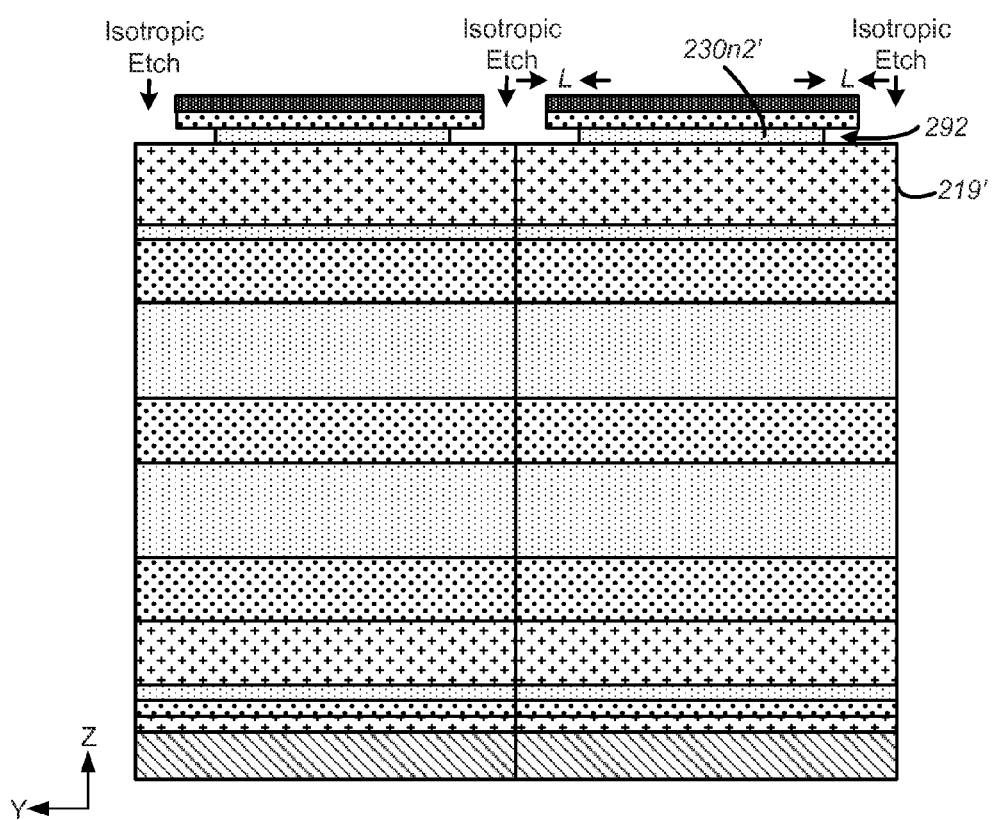
FIG. 13B is a sectional view in the y-z plane of the multi-layer slab shown in FIG. 13A.

FIG. 13B is a sectional view in the y-z plane of the multi-layer slab shown in FIG. 13A. The right section corresponds to the section taken at the cut B-B, which is shown in FIG. 9A and FIG. 13A. The left section corresponds to the section taken at the cut C-C, which is shown in FIG. 9A and FIG. 13A. As can be more clearly seen in this view, the isotropic etch selectively etch back the nitride layer 230n2' by a predetermined width of L on either sides of the trench. This trims off an additional empty strip 292 of width L for the nitride layer 230n2' on either side of the trench along the x-direction.

Figure 14A:
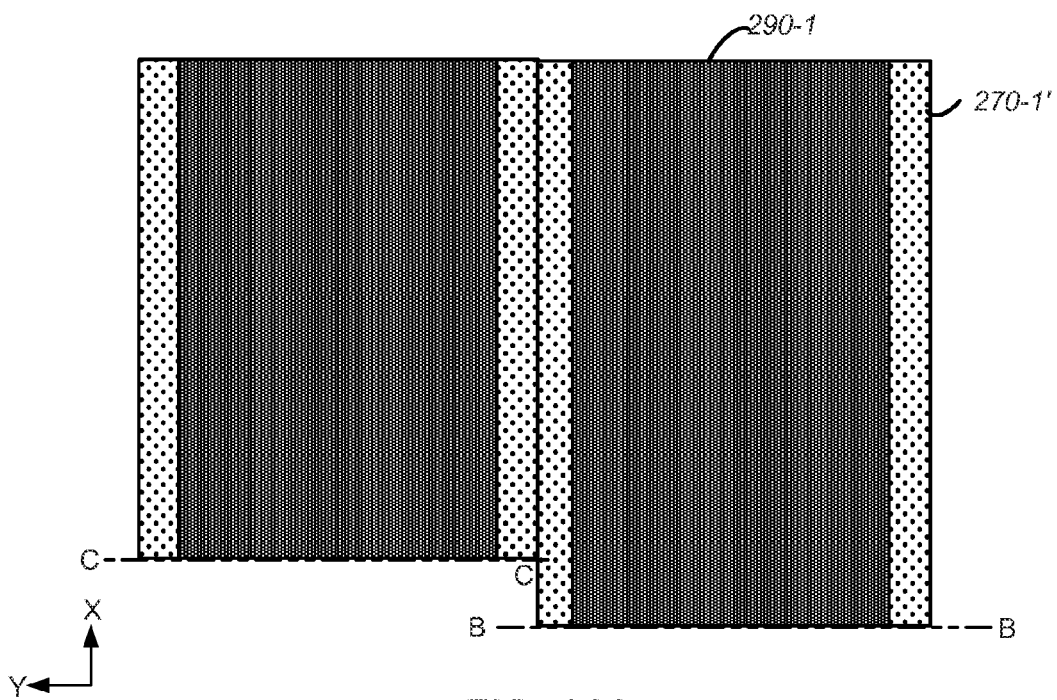
FIG. 14A is a top view of the multi-layer slab after an anisotropic etch to extend the trench down to the isolation oxide layer 270-1'.

FIG. 14A is a top view of the multi-layer slab after an anisotropic etch to extend the trench down to the isolation oxide layer 270-1'.

Figure 14B:
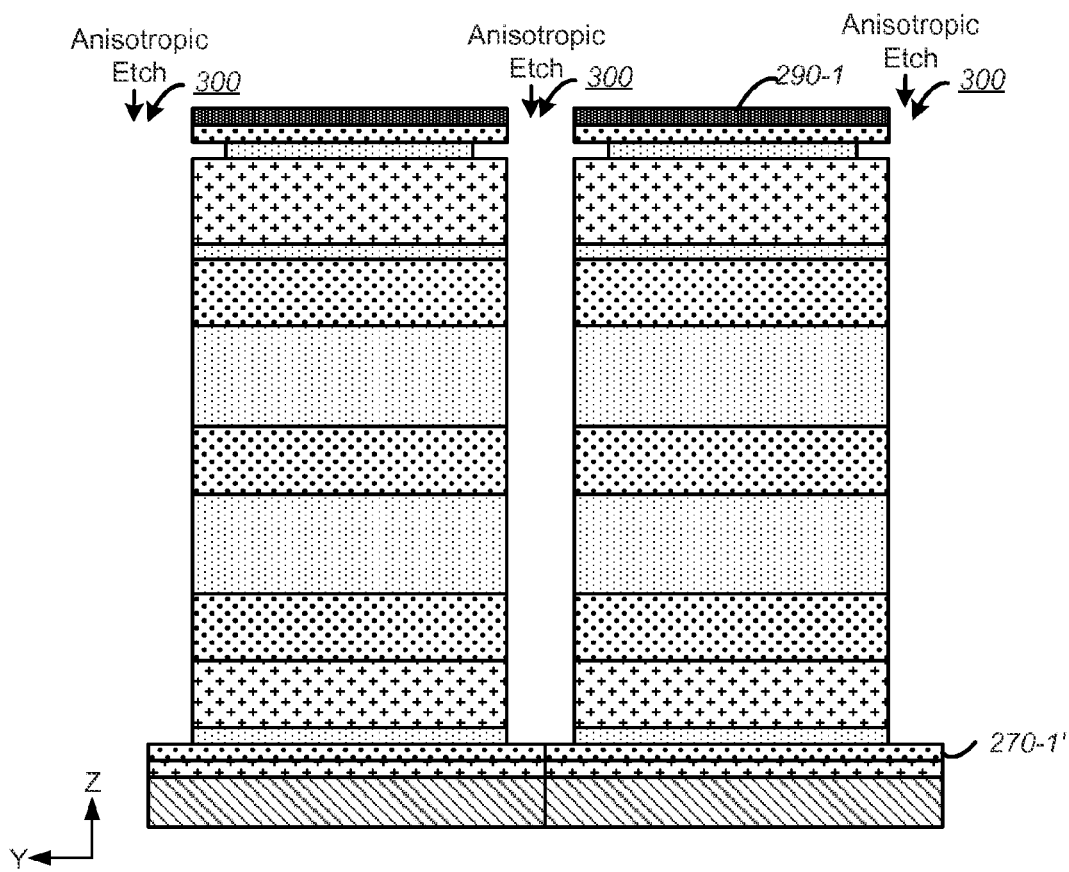
FIG. 14B is a sectional view in the y-z plane of the multi-layer slab shown in FIG. 14A.

FIG. 14B is a sectional view in the y-z plane of the multi-layer slab shown in FIG. 14A. The right section corresponds to the section taken at the cut B-B, which is shown in FIG. 9A and FIG. 14A. The left section corresponds to the section taken at the cut C-C, which is shown in FIG. 9A and FIG. 14A. As can be more clearly seen in this view, the anisotropic etch extends the trench downward to stop at the isolation oxide layer 270-1'.

Figure 15A:
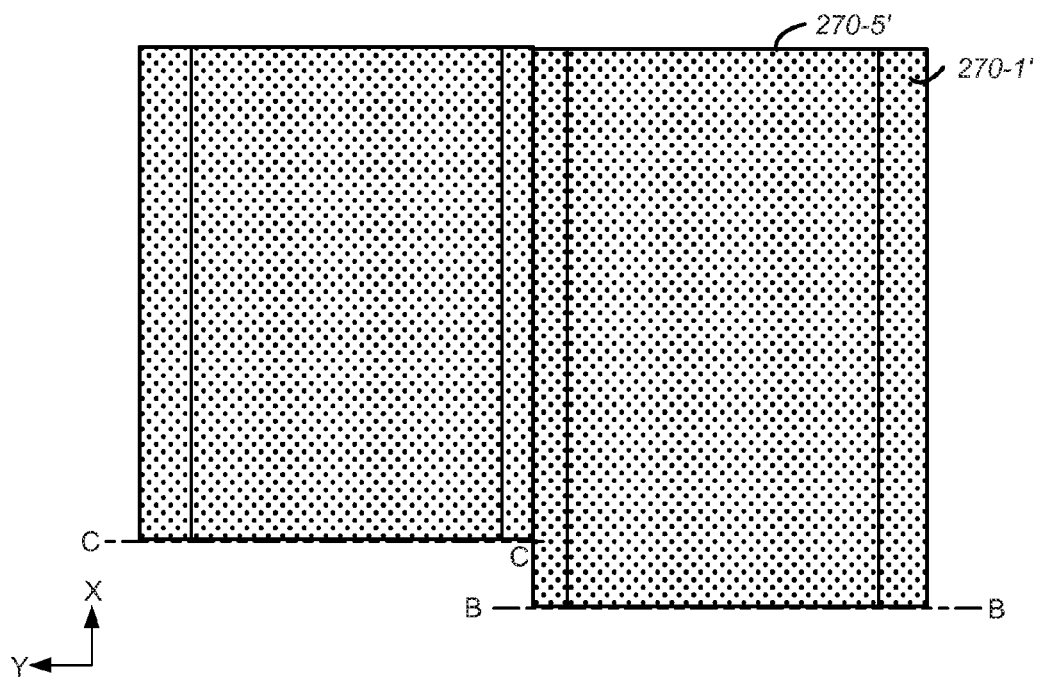
FIG. 15A is a top view of the multi-layer slab after removal of the mask.

FIG. 15A is a top view of the multi-layer slab after removal of the mask.

Figure 15B:
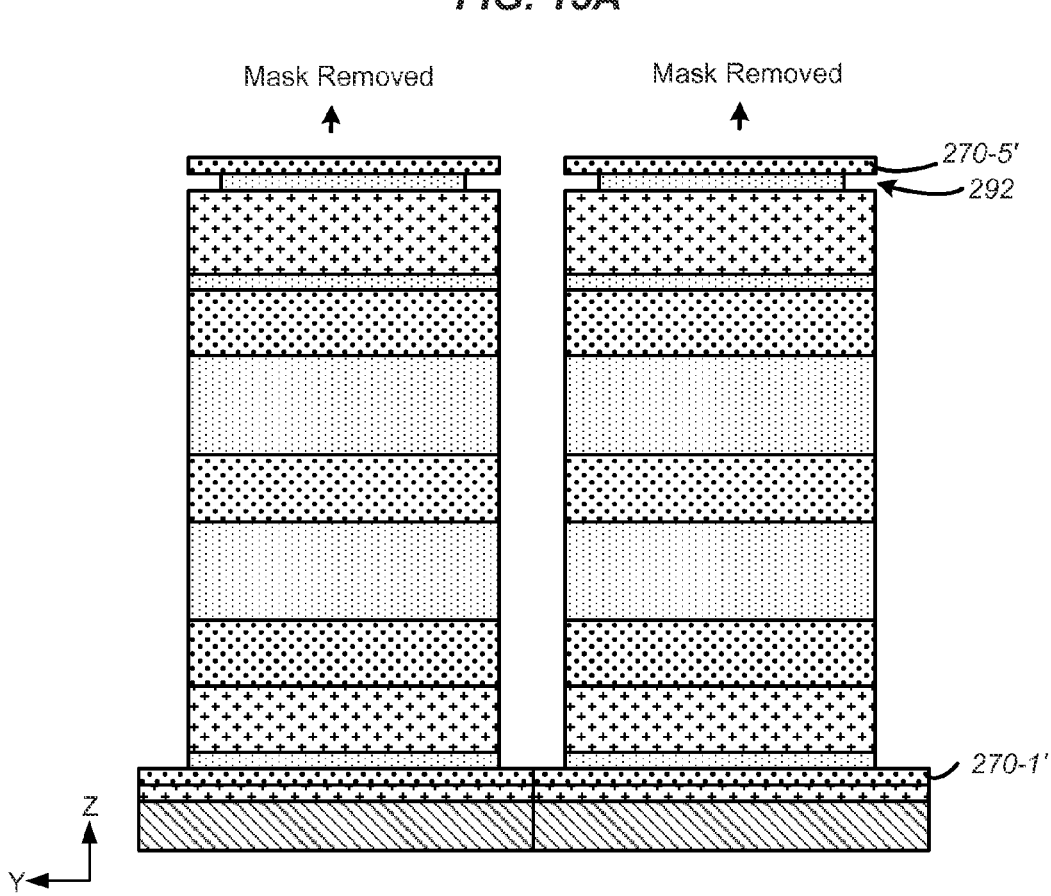
FIG. 15B is a sectional view in the y-z plane of the multi-layer slab shown in FIG. 15A.

FIG. 15B is a sectional view in the y-z plane of the multi-layer slab shown in FIG. 14A. The right section corresponds to the section taken at the cut B-B, which is shown in FIG. 9A and FIG. 14A. The left section corresponds to the section taken at the cut C-C, which is shown in FIG. 9A and FIG. 14A. As can be more clearly seen in this view, after the removal of the mask 290-1 (see FIG. 13A) the top layer isolation oxide 270-5' is exposed. So is the bottom layer isolation oxide 270-1' when looking down the trench.

Figure 16A:
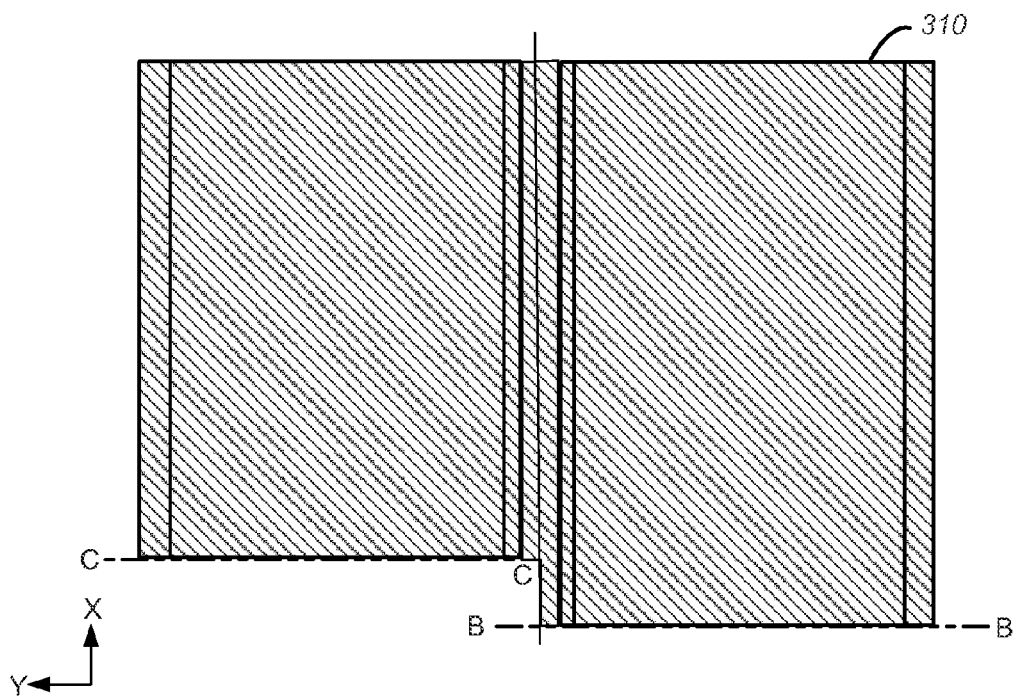
FIG. 16A is a top view of the multi-layer slab after deposition of a layer of metal.

FIG. 16A is a top view of the multi-layer slab after deposition of a layer of metal 310.

Figure 16B:
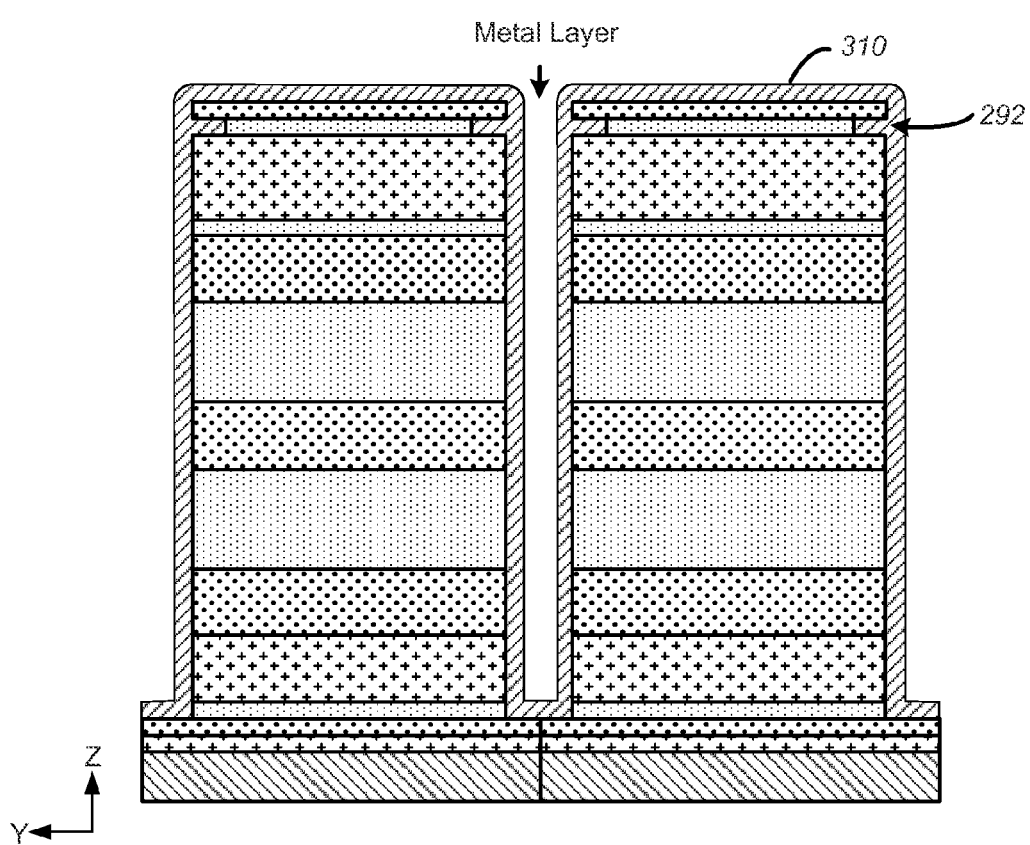
FIG. 16B is a sectional view in the y-z plane of the multi-layer slab shown in FIG. 16A.

FIG. 16B is a sectional view in the y-z plane of the multi-layer slab shown in FIG. 16A. The right section corresponds to the section taken at the cut B-B, which is shown in FIG. 9A and FIG. 16A. The left section corresponds to the section taken at the cut C-C, which is shown in FIG. 9A and FIG. 16A. As can be more clearly seen in this view, the layer of metal 310 is deposited isotropically on top of all exposed surfaces, including the sidewalls the additional empty strip 292 and the bottom of the trench.

Figure 17A:
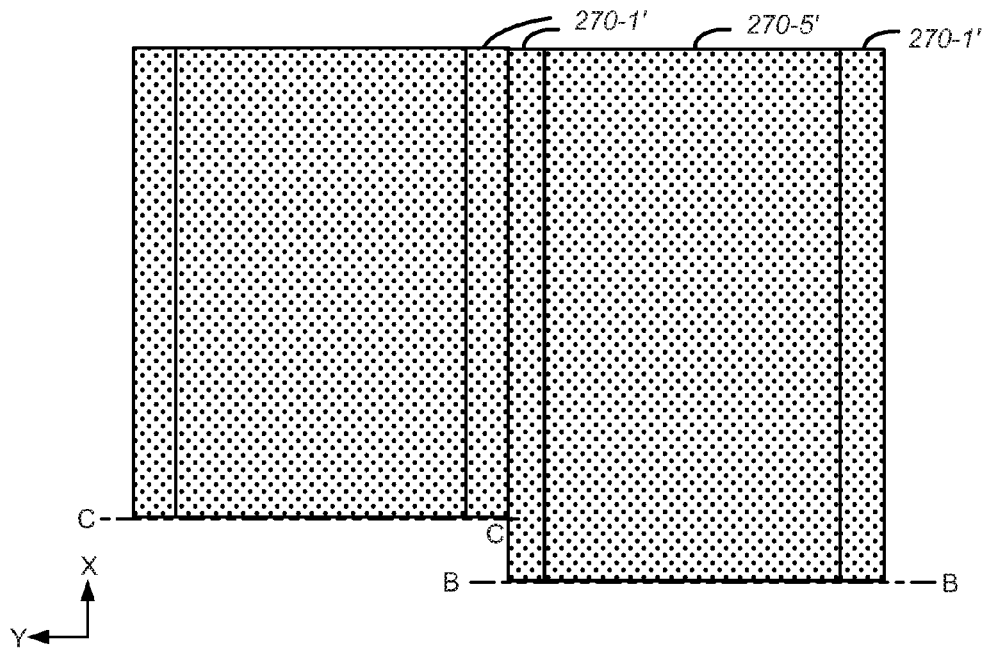
FIG. 17A is a top view of the multi-layer slab after removal of the metal layer 310 shown in FIG. 16.

FIG. 17A is a top view of the multi-layer slab after removal of the metal layer 310 shown in FIG. 16A, but leaving behind the metal filling the additional empty strip 292 to form a metal strip 294.

Figure 17B:
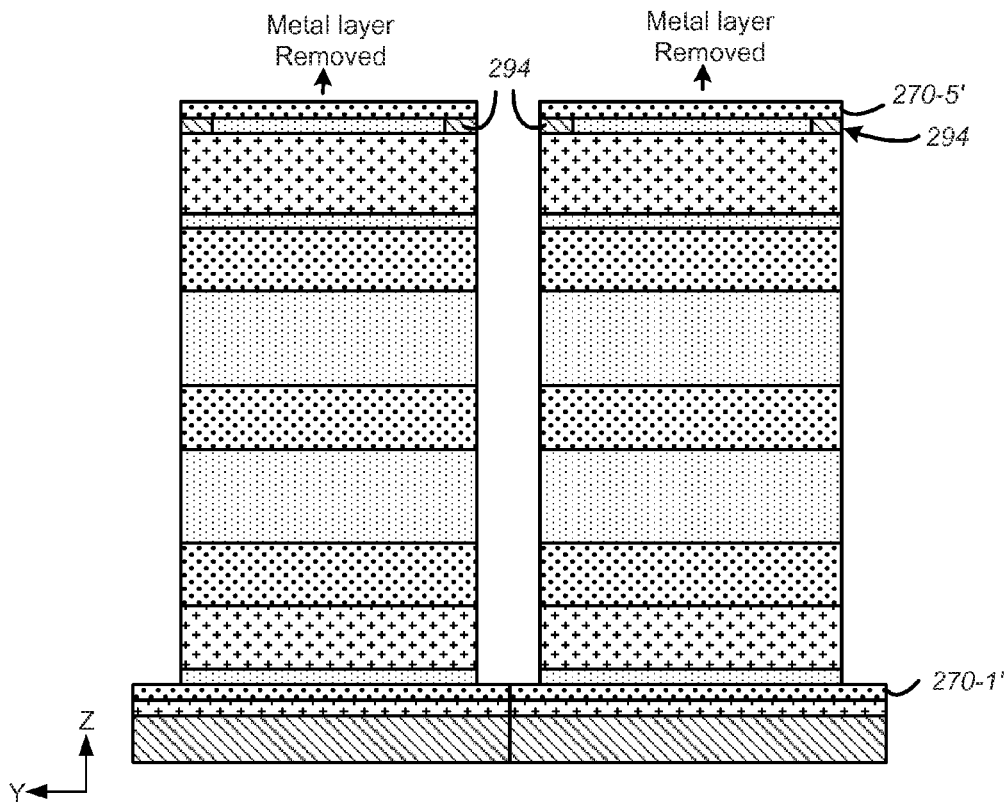
FIG. 17B is a sectional view in the y-z plane of the multi-layer slab shown in FIG. 17A.

FIG. 17B is a sectional view in the y-z plane of the multi-layer slab shown in FIG. 17A. The right section corresponds to the section taken at the cut B-B, which is shown in FIG. 9A and FIG. 17A. The left section corresponds to the section taken at the cut C-C, which is shown in FIG. 9A and FIG. 15A. As can be more clearly seen in this view, after the removal of the metal layer 310 (see FIG. 16A) the state of process shown in FIG. 15B is obtain except with the additional formation of the metal strip 294 of width L. This metal strip 294 will be used as a mask to form the backplate 221 of a word line 220 (see FIG. 8).

Figure 18A:
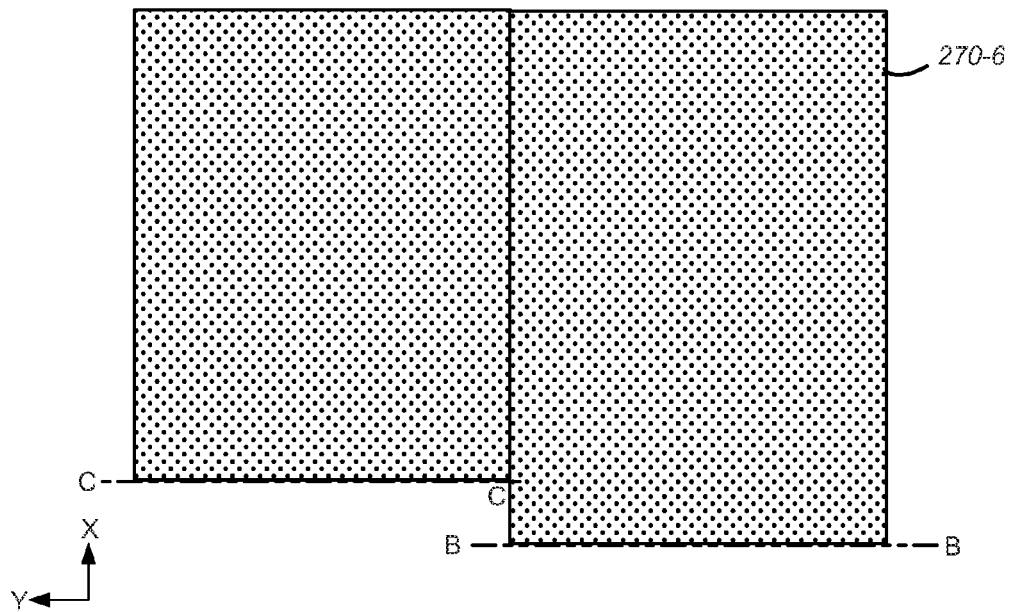
FIG. 18A is a top view of the multi-layer slab after deposition of a layer of oxide.

FIG. 18A is a top view of the multi-layer slab after deposition of a layer of oxide 270-6.

Figure 18B:
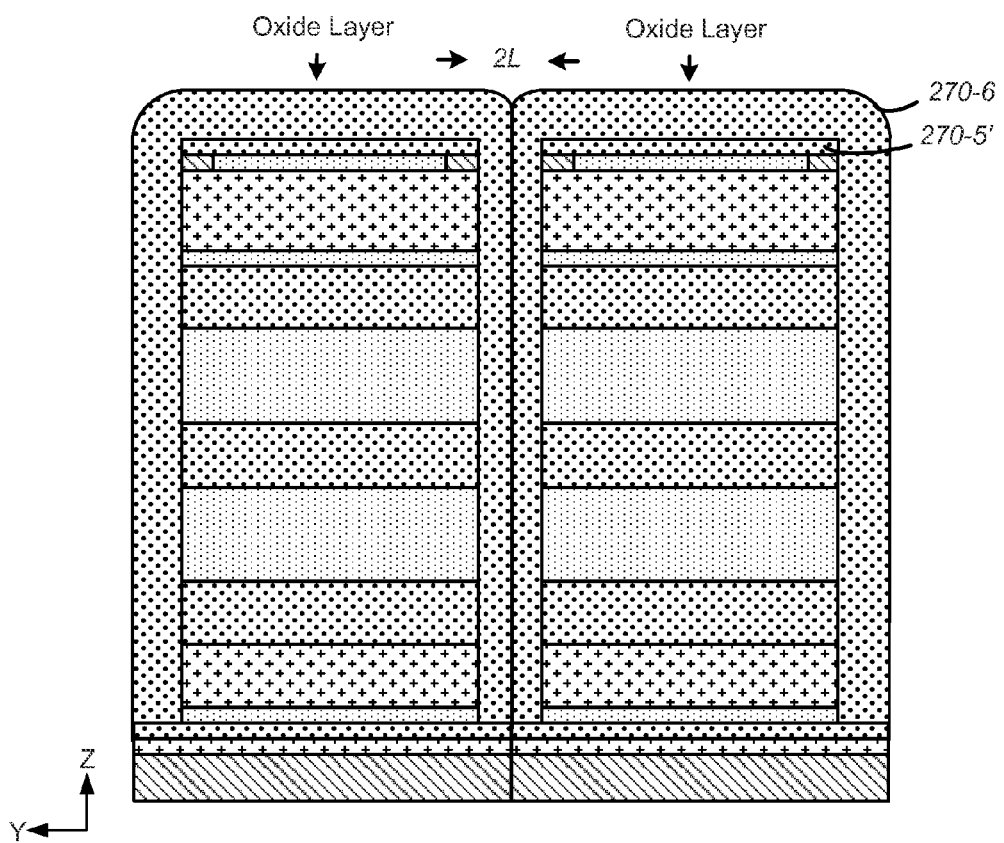
FIG. 18B is a sectional view in the y-z plane of the multi-layer slab shown in FIG. 18A.

FIG. 18B is a sectional view in the y-z plane of the multi-layer slab shown in FIG. 18A. The right section corresponds to the section taken at the cut B-B, which is shown in FIG. 9A and FIG. 18A. The left section corresponds to the section taken at the cut C-C, which is shown in FIG. 9A and FIG. 18A. As can be more clearly seen in this view, the layer of oxide 270-6 is deposited isotropically on top of all exposed surfaces, including filling the trench.

Figure 19A:
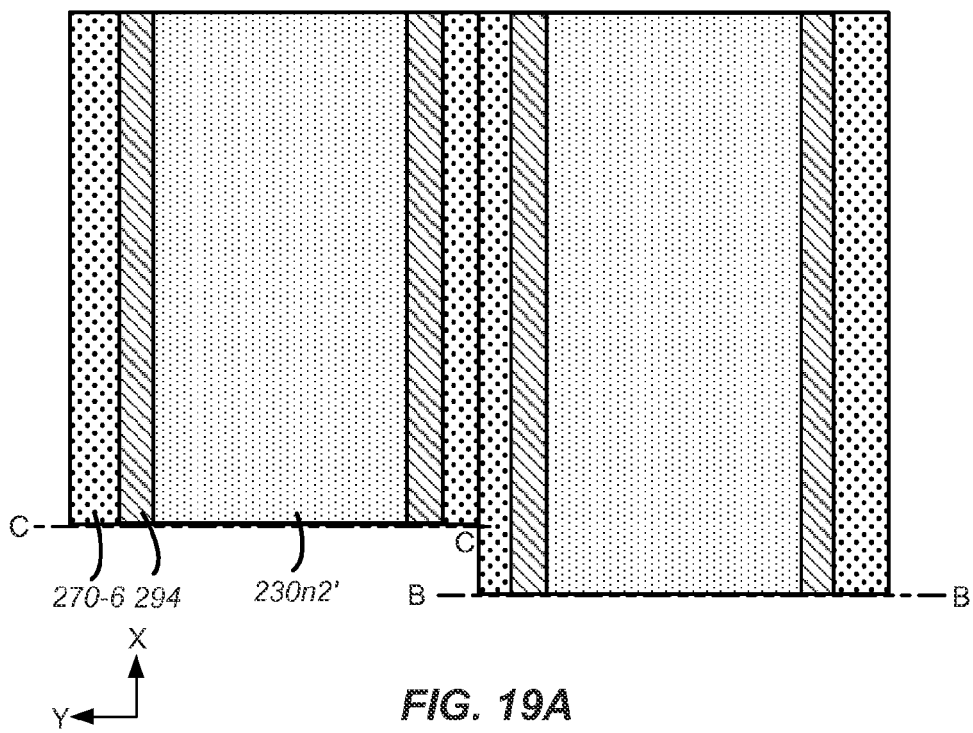
FIG. 19A is a top view of the multi-layer slab after planarization of the layer of oxide to expose the top layer of nitride.

FIG. 19A is a top view of the multi-layer slab after planarization of the layer of oxide 270-6 to expose the top layer of nitride 230n2'.

Figure 19B:
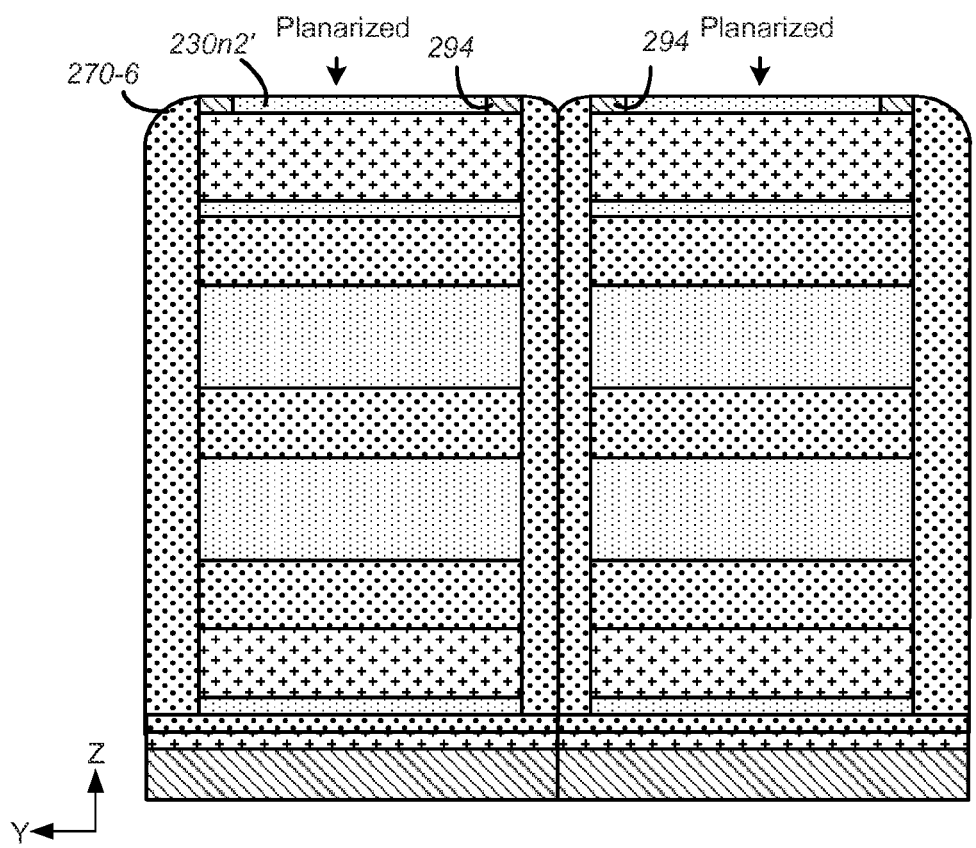
FIG. 19B is a sectional view in the y-z plane of the multi-layer slab shown in FIG. 19A.

FIG. 19B is a sectional view in the y-z plane of the multi-layer slab shown in FIG. 19A. The right section corresponds to the section taken at the cut B-B, which is shown in FIG. 9A and FIG. 19A. The left section corresponds to the section taken at the cut C-C, which is shown in FIG. 9A and FIG. 19A. As can be more clearly seen in this view, the layer of oxide 270-6 is removed only from the top of the slab to expose the layer of nitride 230n2' inlaid with the metal strips 294.

Figure 20A:
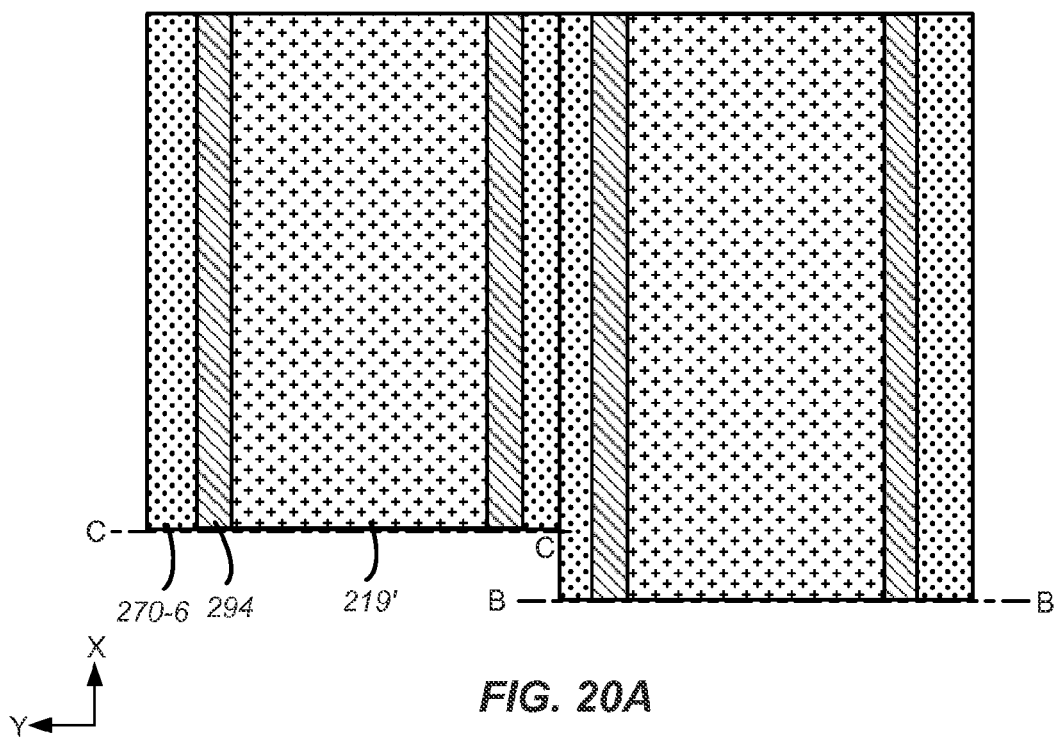
FIG. 20A is a top view of the multi-layer slab after removal of the nitride layer 230n2' shown in FIG. 19A.

FIG. 20A is a top view of the multi-layer slab after removal of the nitride layer 230n2' shown in FIG. 19A.

Figure 20B:
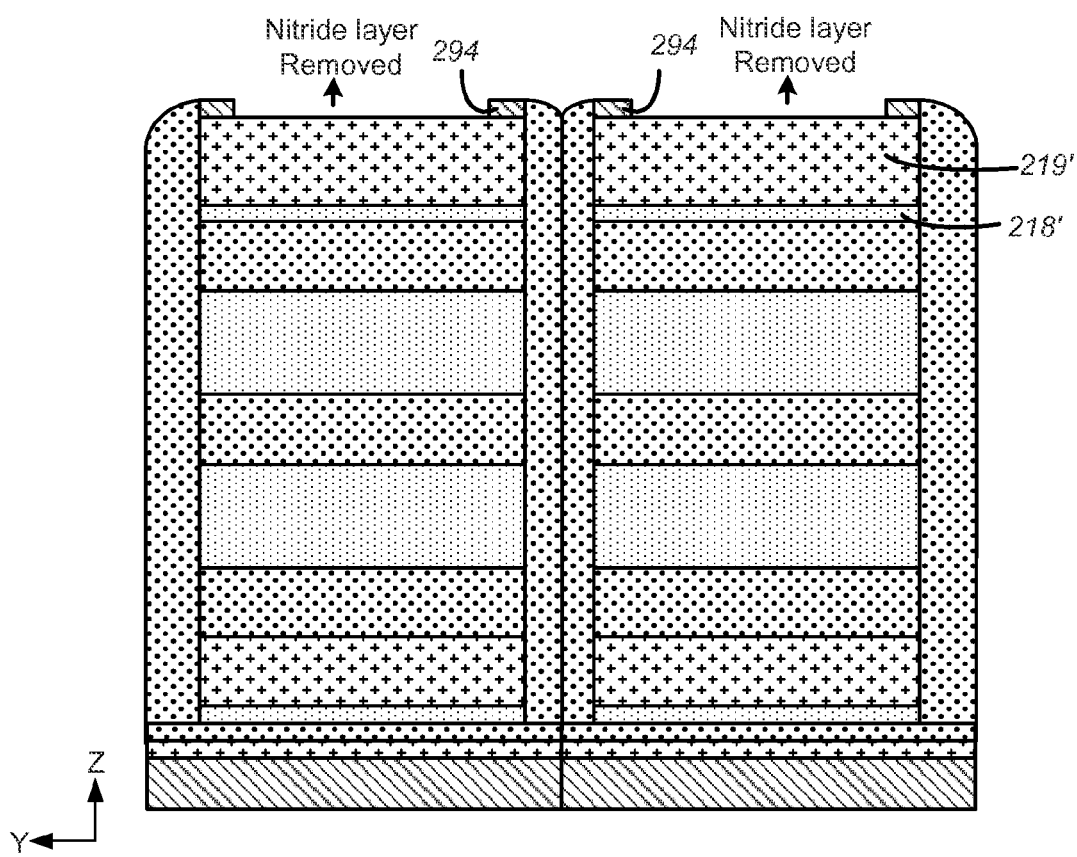
FIG. 20B is a sectional view in the y-z plane of the multi-layer slab shown in FIG. 20A.

FIG. 20B is a sectional view in the y-z plane of the multi-layer slab shown in FIG. 20A. The right section corresponds to the section taken at the cut B-B, which is shown in FIG. 9A and FIG. 17A. The left section corresponds to the section taken at the cut C-C, which is shown in FIG. 9A and FIG. 15A. As can be more clearly seen in this view, after the removal of the nitride layer 230n2' (see FIG. 19B) the layer of doped polysilicon layer 219' is exposed except for portions masked by the metal strips 294.

Figure 21A:
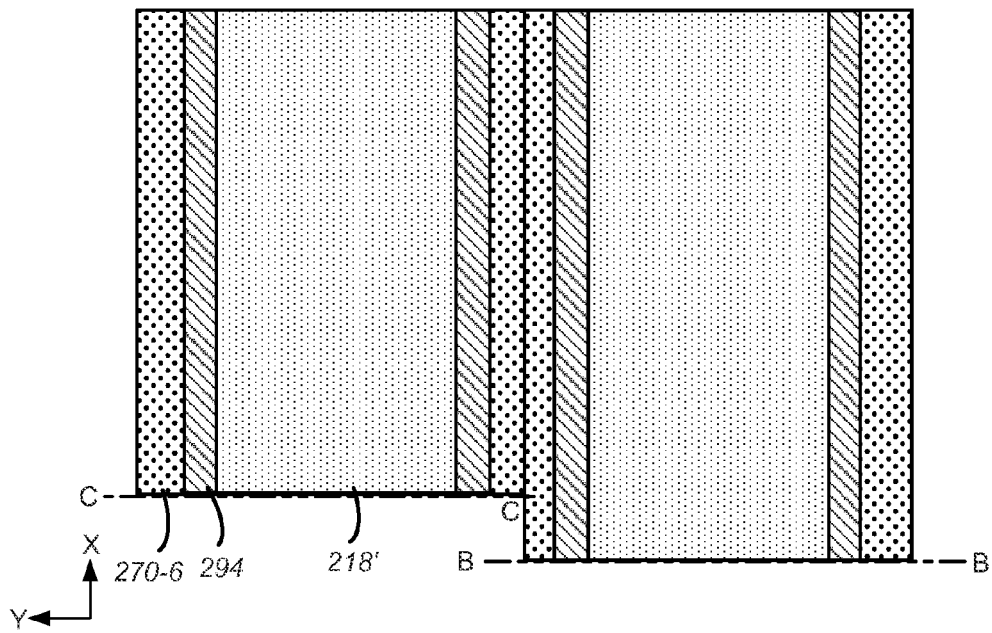
FIG. 21A is a top view of the multi-layer slab after an anisotropic etch to remove the layer of doped polysilicon 219' not masked by the metal strips 294.

FIG. 21A is a top view of the multi-layer slab after an anisotropic etch to remove the layer of doped polysilicon 219' not masked by the metal strips 294.

Figure 21B:
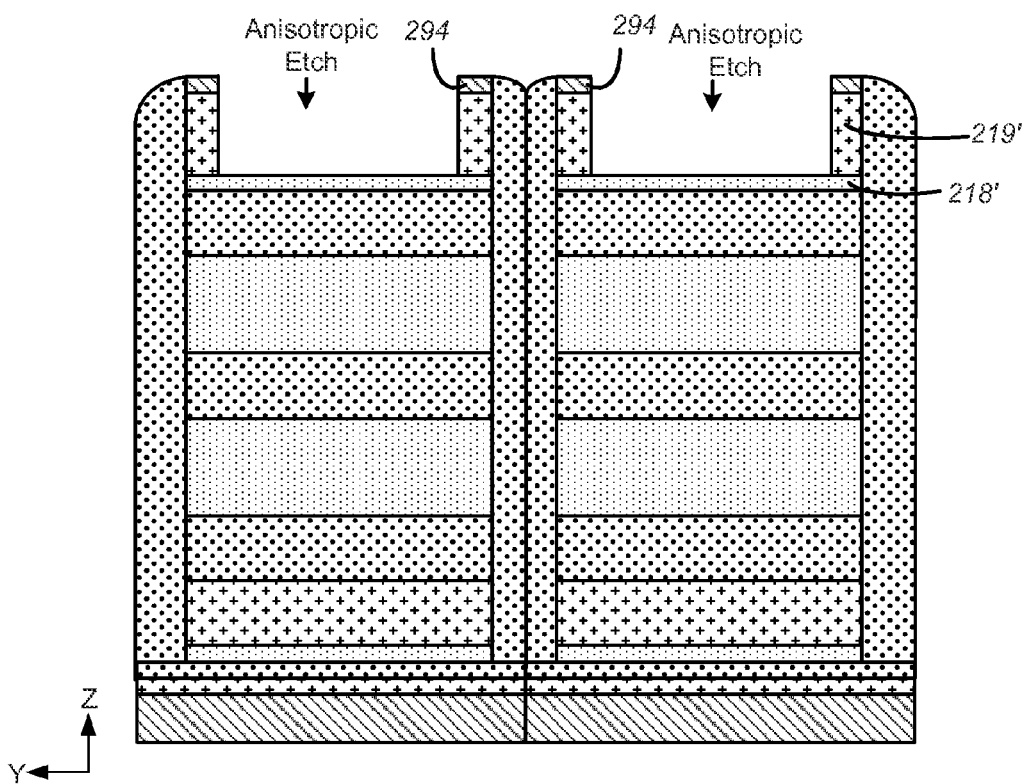
FIG. 21B is a sectional view in the y-z plane of the multi-layer slab shown in FIG. 21A.

FIG. 21B is a sectional view in the y-z plane of the multi-layer slab shown in FIG. 21A. The right section corresponds to the section taken at the cut B-B, which is shown in FIG. 9A and FIG. 21A. The left section corresponds to the section taken at the cut C-C, which is shown in FIG. 9A and FIG. 21A. As can be more clearly seen in this view, the anisotropic etch removes the layer of doped polysilicon 219' not masked by the metal strips 294 to expose the underlying layer of nitride 218' except of portions masked by the metal strips 294, which retain corresponding strips of doped polysilicon 219'.

Figure 22A:
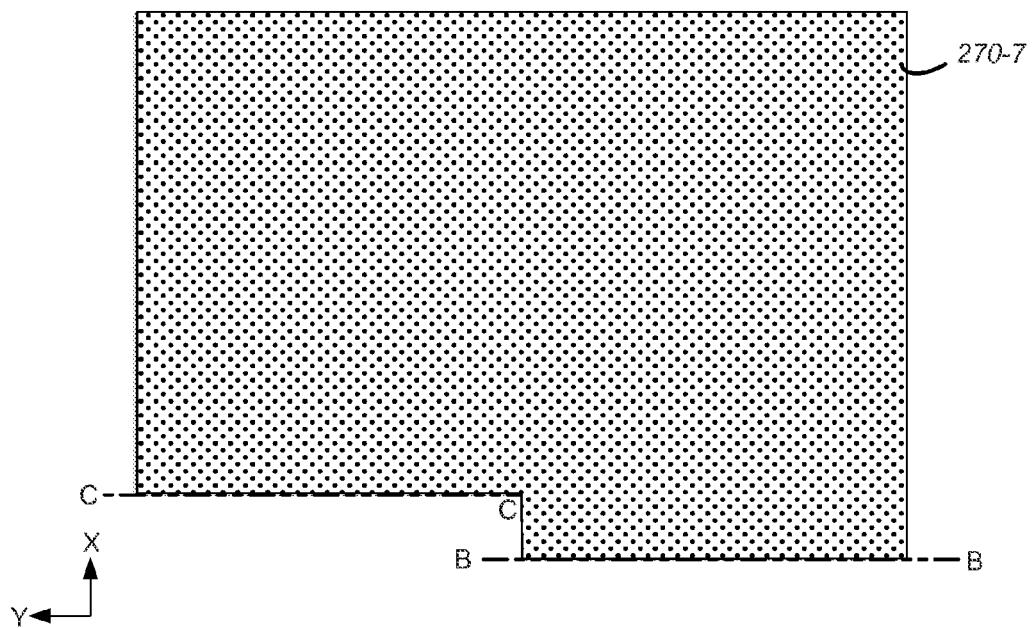
FIG. 22A is a top view of the multi-layer slab after filling with a layer of oxide 270-7.

FIG. 22A is a top view of the multi-layer slab after filling with a layer of oxide 270-7.

Figure 22B:
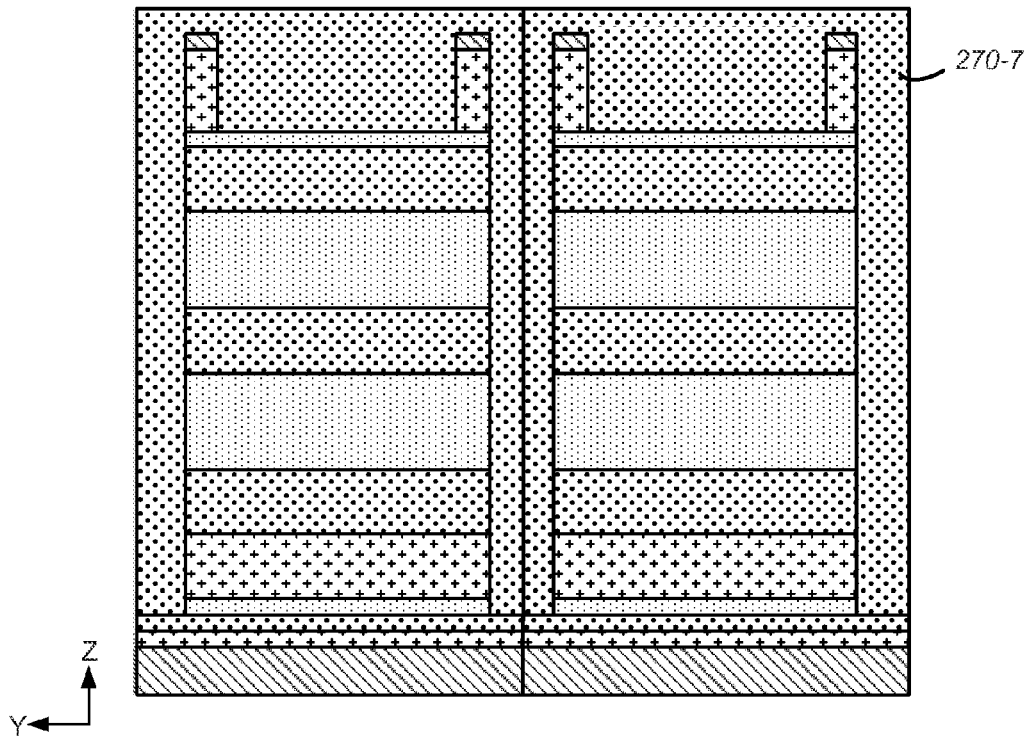
FIG. 22B is a sectional view in the y-z plane of the multi-layer slab shown in FIG. 22A.

FIG. 22B is a sectional view in the y-z plane of the multi-layer slab shown in FIG. 22A. The right section corresponds to the section taken at the cut B-B, which is shown in FIG. 9A and FIG. 22A. The left section corresponds to the section taken at the cut C-C, which is shown in FIG. 9A and FIG. 22A. As can be more clearly seen in this view, the layer of oxide 270-7 is deposited on top of all exposed surfaces, including filling the emptied out layer of dope polysilicon 219' from the last step shown in FIG. 21B.

Figure 23A:
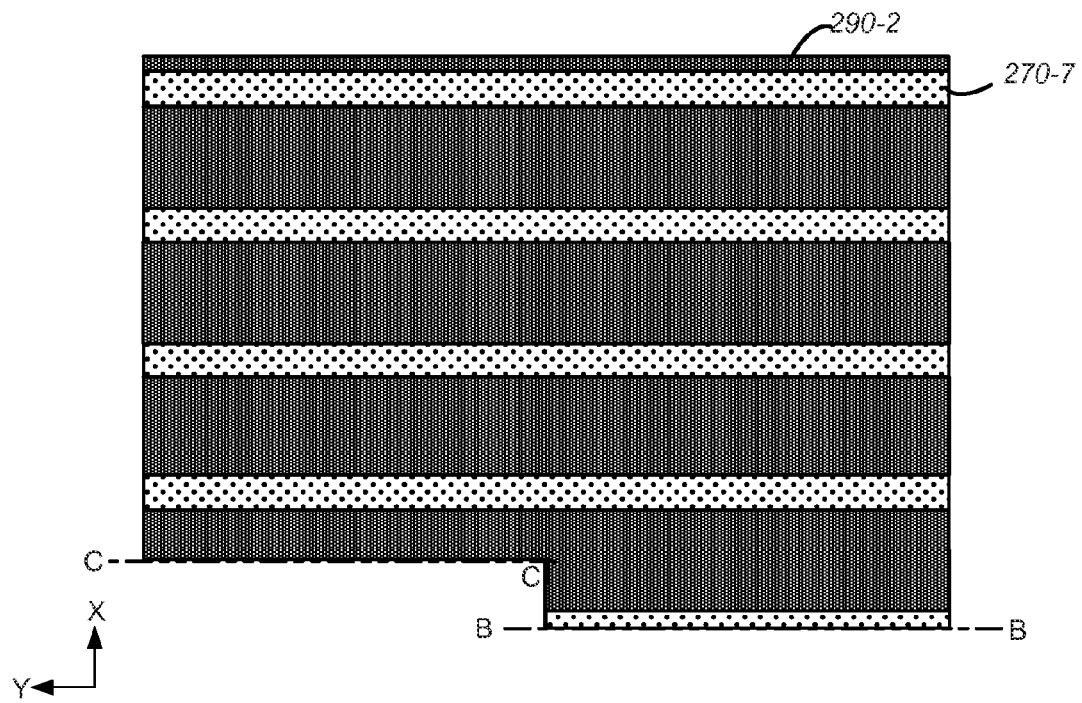
FIG. 23A is a top view of the multi-layer slab after masking with a masking layer 290-2 to enable isolation of the memory cells along each word line.

Etching Deep Trenches to Form Isolations Between the Memory Cells Along Each Word Line FIG. 23A is a top view of the multi-layer slab after masking with a masking layer 290-2 to enable isolation of the memory cells along each word line. The masking layer 290-2 masks portions where the memory cells along a word line reside and provides exposing strips in between the memory cells.

Figure 23B:
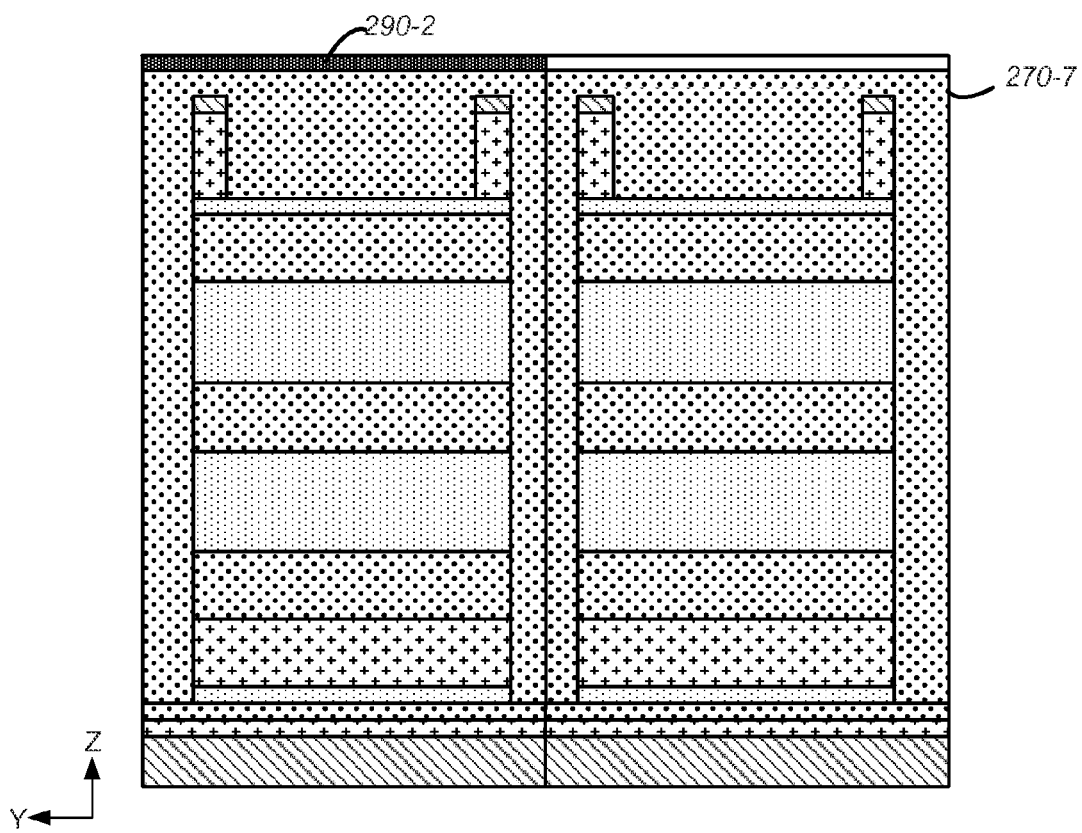
FIG. 23B is a sectional view in the y-z plane of the multi-layer slab shown in FIG. 23A.

FIG. 23B is a sectional view in the y-z plane of the multi-layer slab shown in FIG. 23A. The right section corresponds to the section taken at the cut B-B, which is shown in FIG. 9A and FIG. 23A. The left section corresponds to the section taken at the cut C-C, which is shown in FIG. 9A and FIG. 23A. As can be more clearly seen in this view, the section taken at the cut B-B is in the middle of an exposing strip and therefore will expose the underlying layer of oxide 270-7. The section taken at the cut C-C, is in the middle of a memory cell along a word line and will be masked.

Alternate oxide and nitride etches are applied to form the deep trench.

Figure 24A:
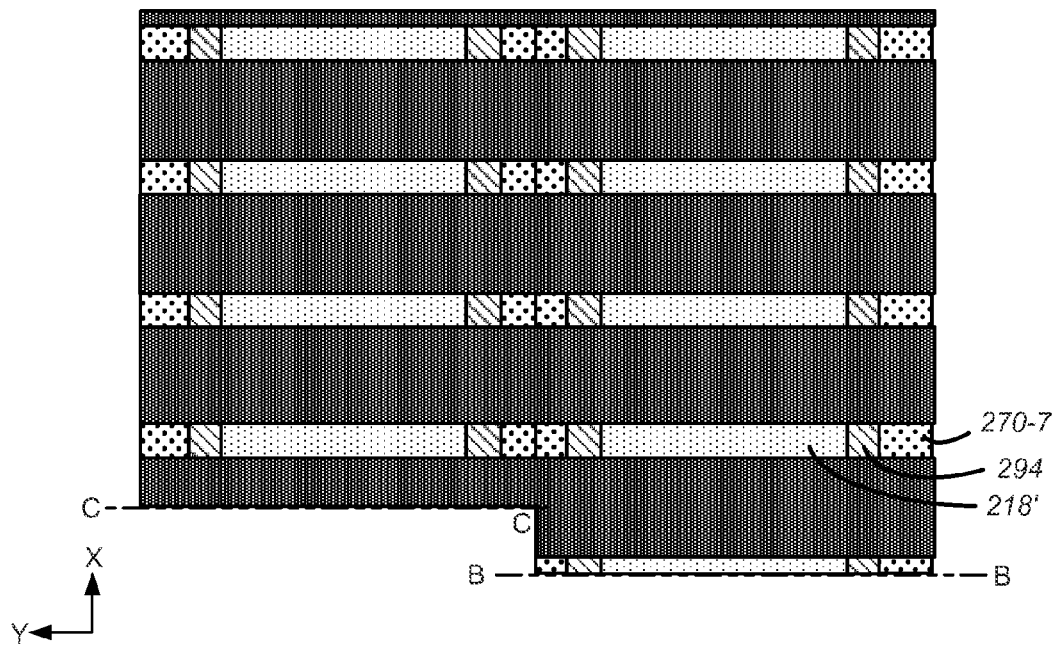
FIG. 24A is a top view of the multi-layer slab after an anisotropic oxide etch to remove the layer of oxide 270-7 above the nitride layer 218' down the exposing strips.

FIG. 24A is a top view of the multi-layer slab after an anisotropic oxide etch to remove the layer of oxide 270-7 above the nitride layer 218' down the exposing strips.

Figure 24B:
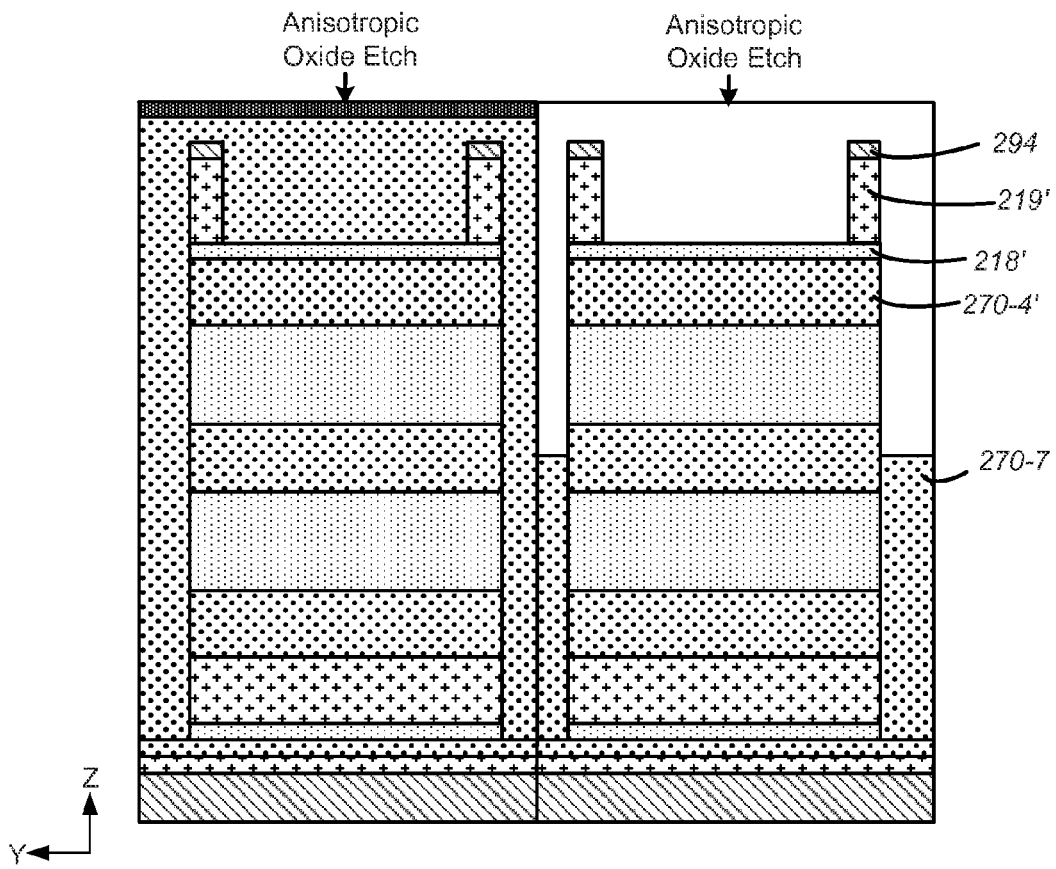
FIG. 24B is a sectional view in the y-z plane of the multi-layer slab shown in FIG. 24A.

FIG. 24B is a sectional view in the y-z plane of the multi-layer slab shown in FIG. 24A. The right section corresponds to the section taken at the cut B-B, which is shown in FIG. 9A and FIG. 23A. The left section corresponds to the section taken at the cut C-C, which is shown in FIG. 9A and FIG. 23A. As can be more clearly seen in this view, the anisotropic oxide etch removes the layer of oxide 270-7'. The antisotropic oxide etch is specific to etching oxide and hence will be stopped when the underlying layer of nitride 218' is reached.

Figure 25A:
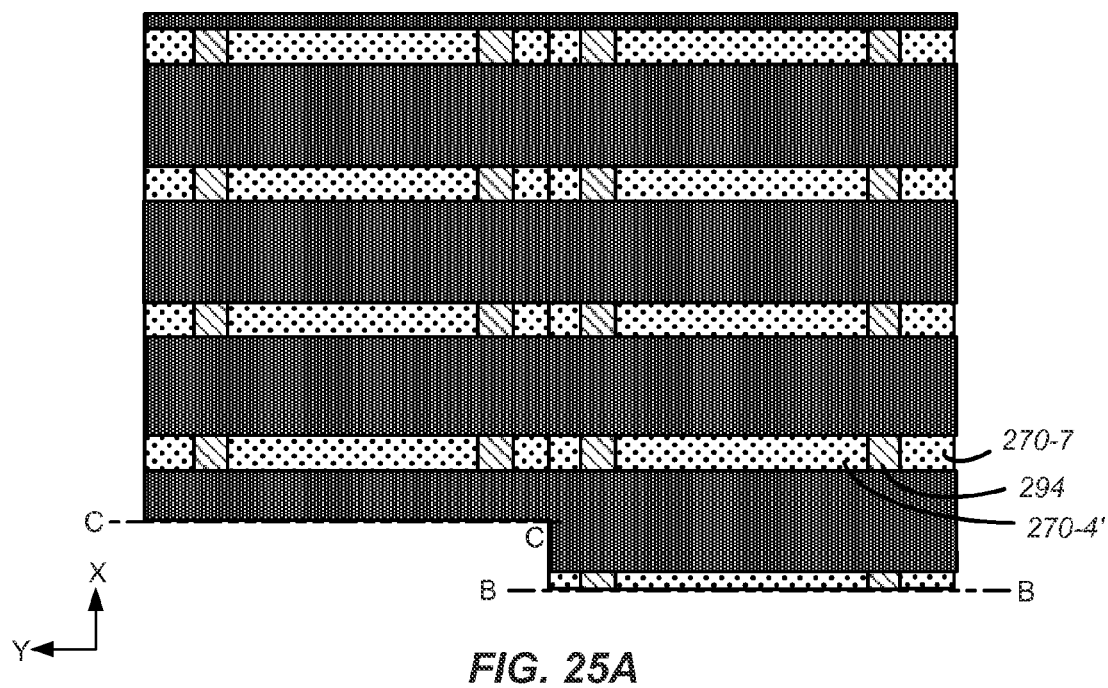
FIG. 25A is a top view of the multi-layer slab after an anisotropic nitride etch to remove the layer of nitride 218' above the oxide layer 270-4' down the exposing strips.

FIG. 25A is a top view of the multi-layer slab after an anisotropic nitride etch to remove the layer of nitride 218' above the oxide layer 270-4' down the exposing strips.

Figure 25B:
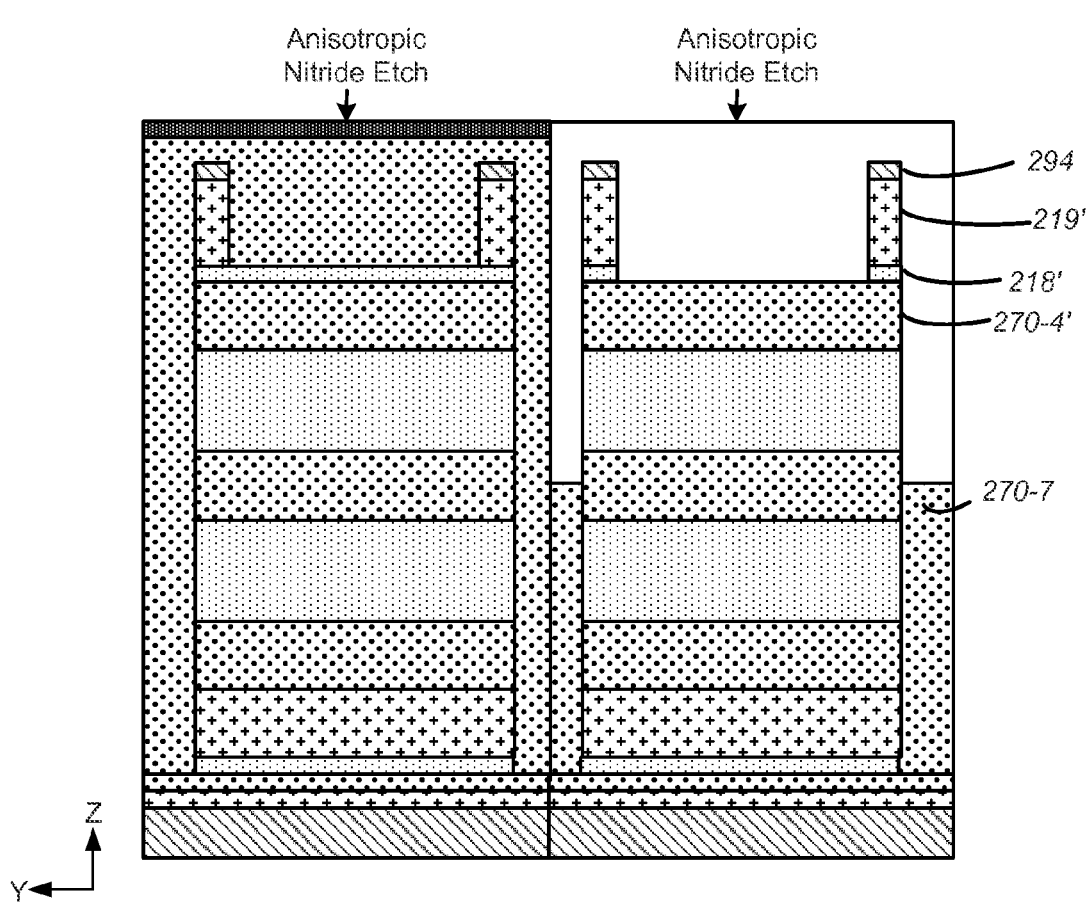
FIG. 25B is a sectional view in the y-z plane of the multi-layer slab shown in FIG. 25A.

FIG. 25B is a sectional view in the y-z plane of the multi-layer slab shown in FIG. 25A. The right section corresponds to the section taken at the cut B-B, which is shown in FIG. 9A and FIG. 25A. The left section corresponds to the section taken at the cut C-C, which is shown in FIG. 9A and FIG. 25A. As can be more clearly seen in this view, the anisotropic nitride etch removes the layer of nitride 218'. The antisotropic nitride etch is specific to etching nitride and hence will be stopped when the underlying layer of oxide 270-4' is reached. Also, the metal strip 294 acts as a submask, masking the layers underneath the submask from being etched.

Figure 26A:
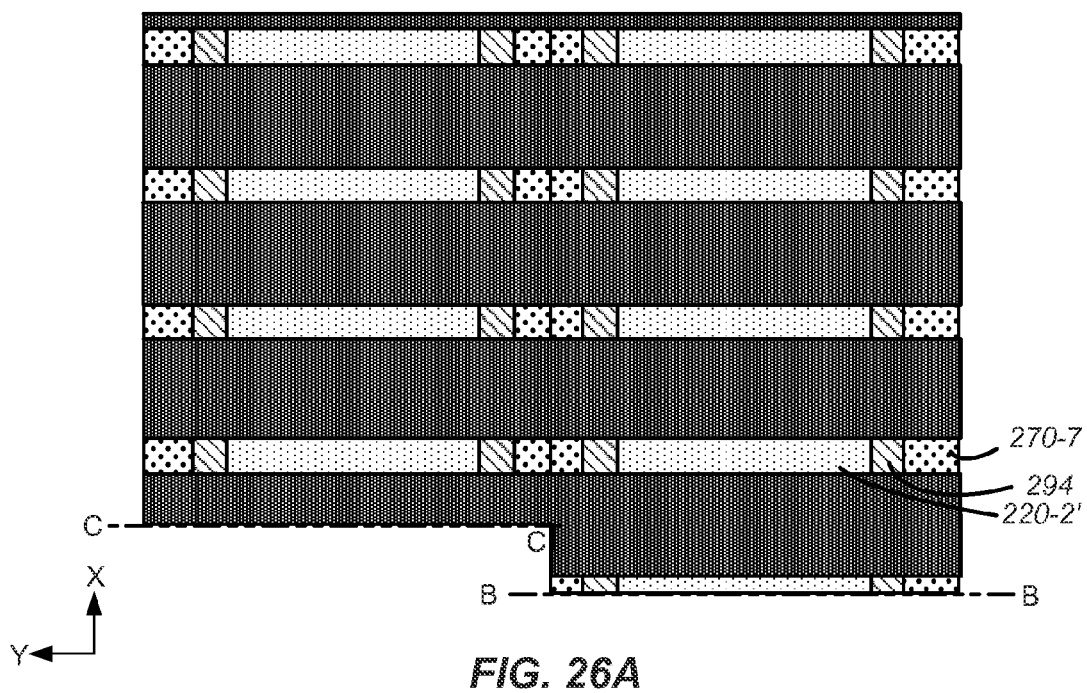
FIG. 26A is a top view of the multi-layer slab after an anisotropic oxide etch to remove the layer of oxide 220-4' above the nitride layer 220-2' down the exposing strips.

FIG. 26A is a top view of the multi-layer slab after an anisotropic oxide etch to remove the layer of oxide 220-4' above the nitride layer 220-2' down the exposing strips.

Figure 26B:
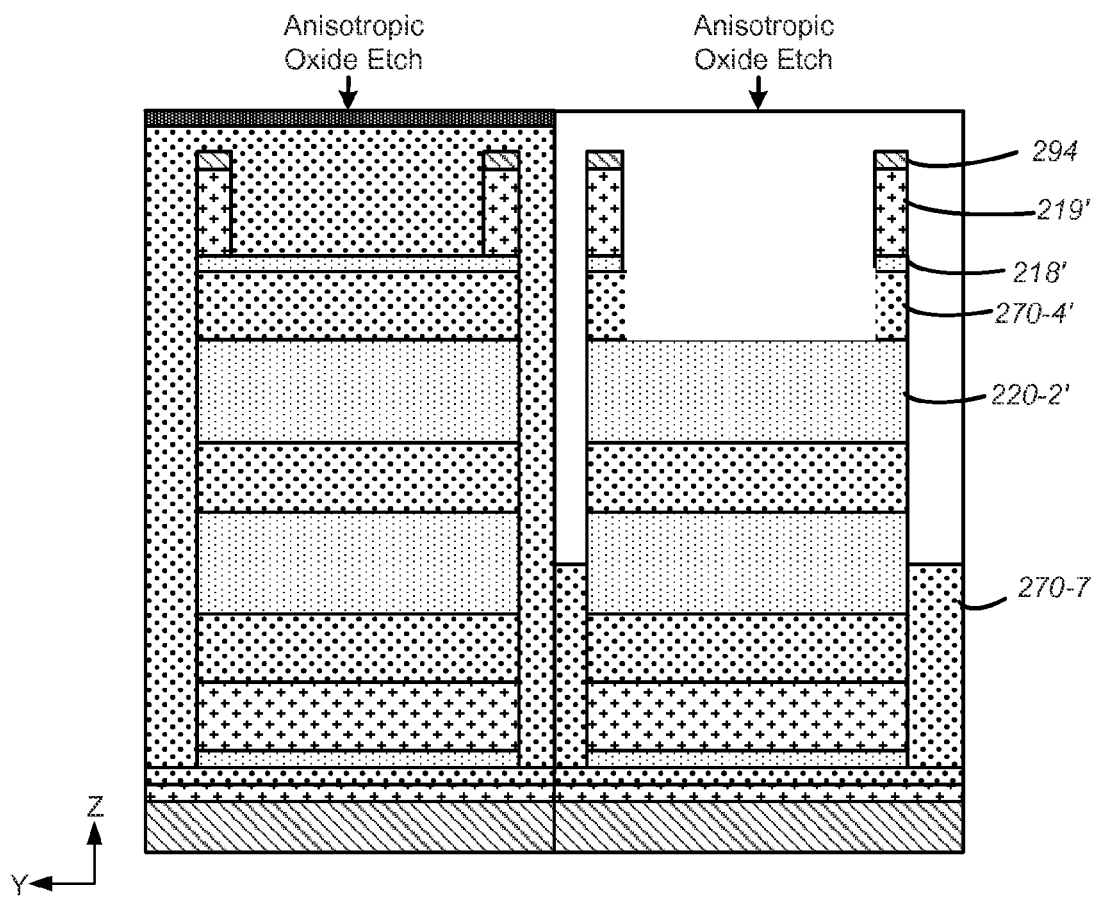
FIG. 26B is a sectional view in the y-z plane of the multi-layer slab shown in FIG. 26A.

FIG. 26B is a sectional view in the y-z plane of the multi-layer slab shown in FIG. 26A. The right section corresponds to the section taken at the cut B-B, which is shown in FIG. 9A and FIG. 26A. The left section corresponds to the section taken at the cut C-C, which is shown in FIG. 9A and FIG. 26A. As can be more clearly seen in this view, the anisotropic oxide etch removes the layer of oxide 270-4'. The antisotropic oxide etch is specific to etching oxide and hence will be stopped when the underlying layer of nitride 220-2' is reached.

Figure 27A:
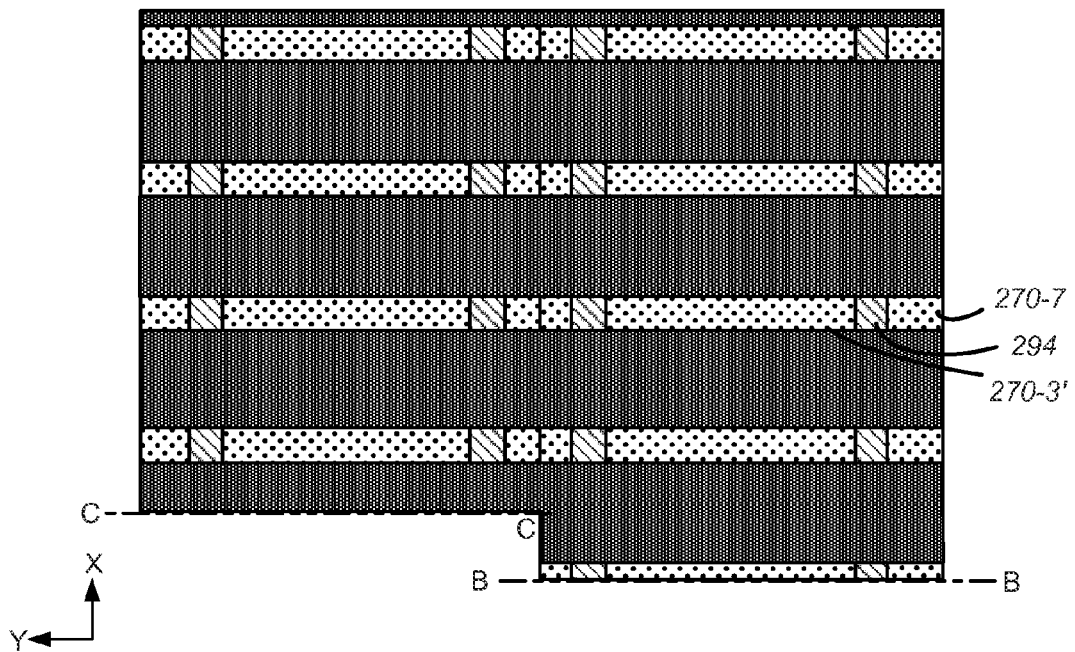
FIG. 27A is a top view of the multi-layer slab after an anisotropic nitride etch to remove the layer of nitride 220-2' above the oxide layer 270-3' down the exposing strips.

FIG. 27A is a top view of the multi-layer slab after an anisotropic nitride etch to remove the layer of nitride 220-2' above the oxide layer 270-3' down the exposing strips.

Figure 27B:
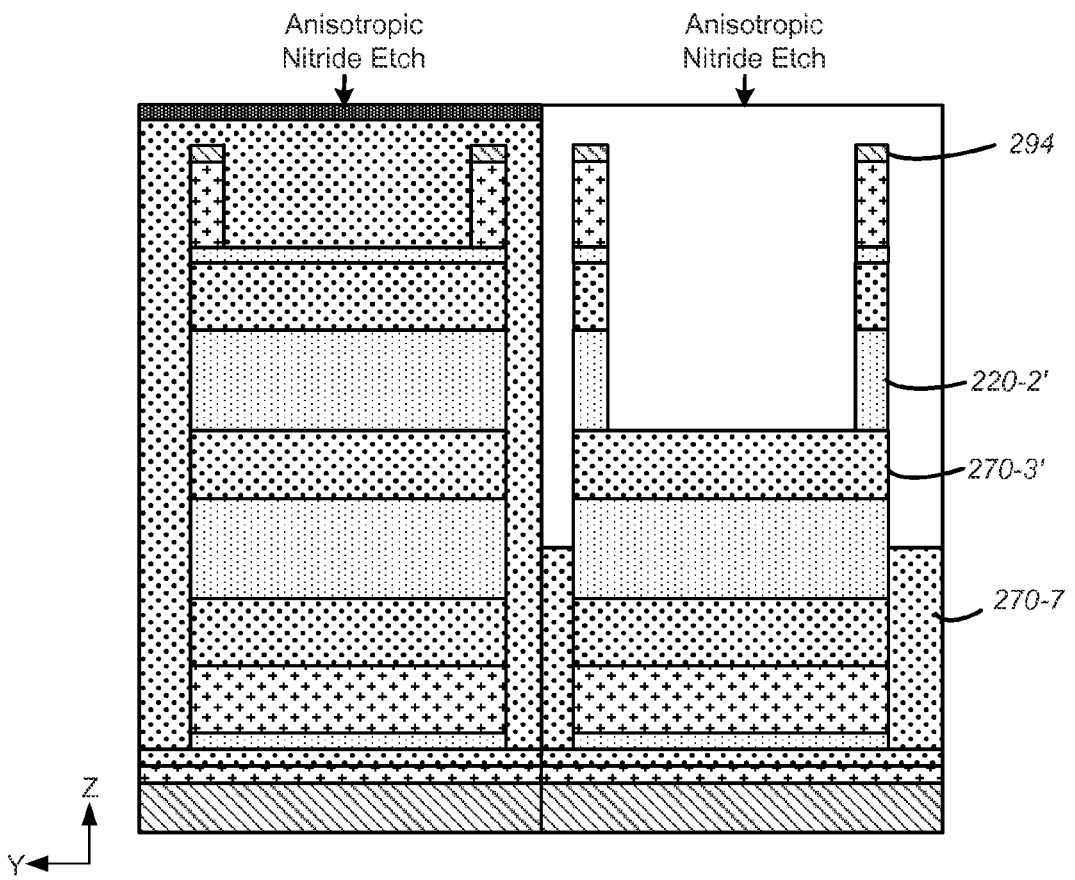
FIG. 27B is a sectional view in the y-z plane of the multi-layer slab shown in FIG. 27A.

FIG. 27B is a sectional view in the y-z plane of the multi-layer slab shown in FIG. 27A. The right section corresponds to the section taken at the cut B-B, which is shown in FIG. 9A and FIG. 27A. The left section corresponds to the section taken at the cut C-C, which is shown in FIG. 9A and FIG. 27A. As can be more clearly seen in this view, the anisotropic nitride etch removes the layer of nitride 220-2'. The antisotropic nitride etch is specific to etching nitride and hence will be stopped when the underlying layer of oxide 270-3' is reached. Also, the metal strip 294 acts as a submask, masking the layers underneath the submask from being etched.

Figure 28A:
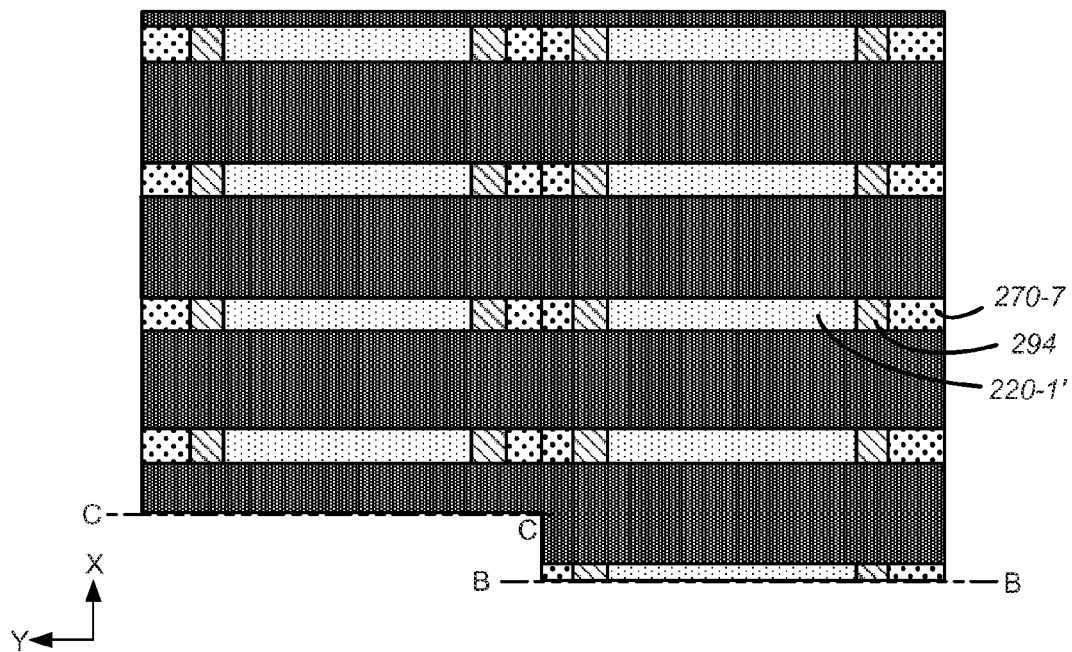
FIG. 28A is a top view of the multi-layer slab after an anisotropic oxide etch to remove the layer of oxide 220-3' above the nitride layer 220-1' down the exposing strips.

FIG. 28A is a top view of the multi-layer slab after an anisotropic oxide etch to remove the layer of oxide 220-3' above the nitride layer 220-1' down the exposing strips.

Figure 28B:
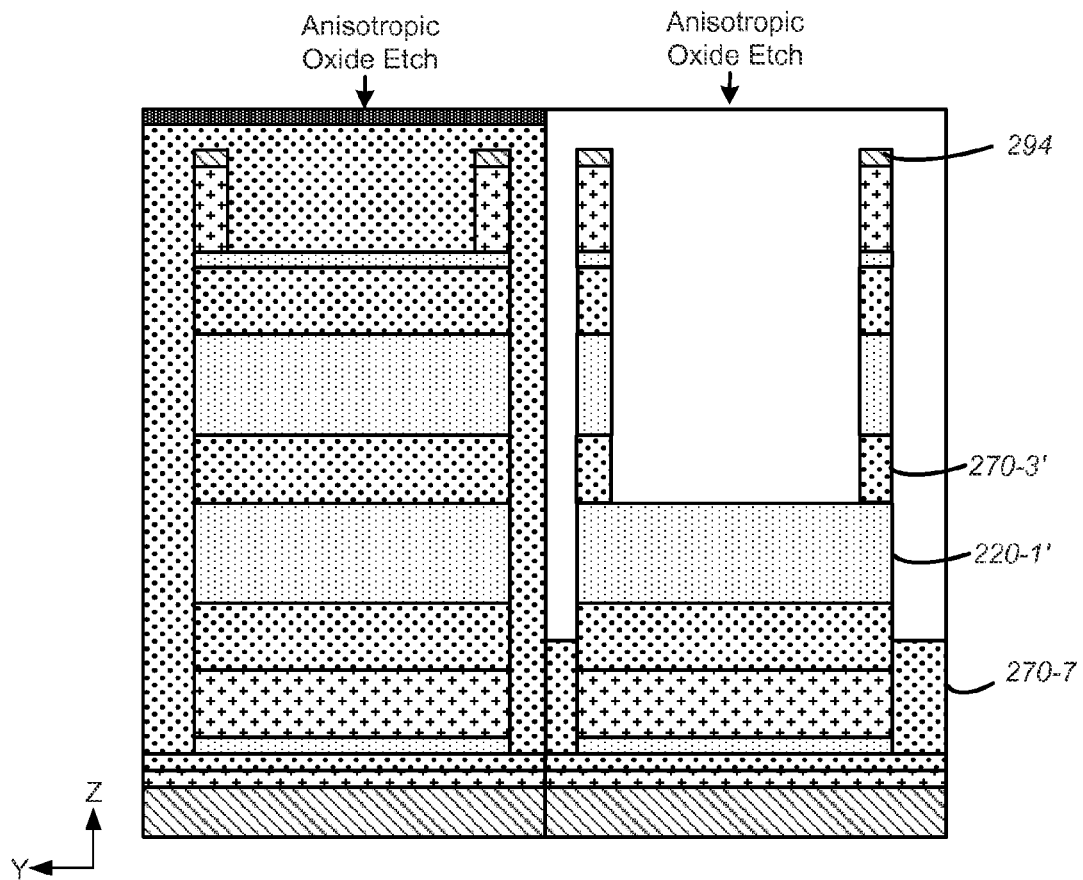
FIG. 28B is a sectional view in the y-z plane of the multi-layer slab shown in FIG. 28A.

FIG. 28B is a sectional view in the y-z plane of the multi-layer slab shown in FIG. 28A. The right section corresponds to the section taken at the cut B-B, which is shown in FIG. 9A and FIG. 28A. The left section corresponds to the section taken at the cut C-C, which is shown in FIG. 9A and FIG. 28A. As can be more clearly seen in this view, the anisotropic oxide etch removes the layer of oxide 220-3'. The antisotropic oxide etch is specific to etching oxide and hence will be stopped when the underlying layer of nitride 220-1' is reached.

Figure 29A:
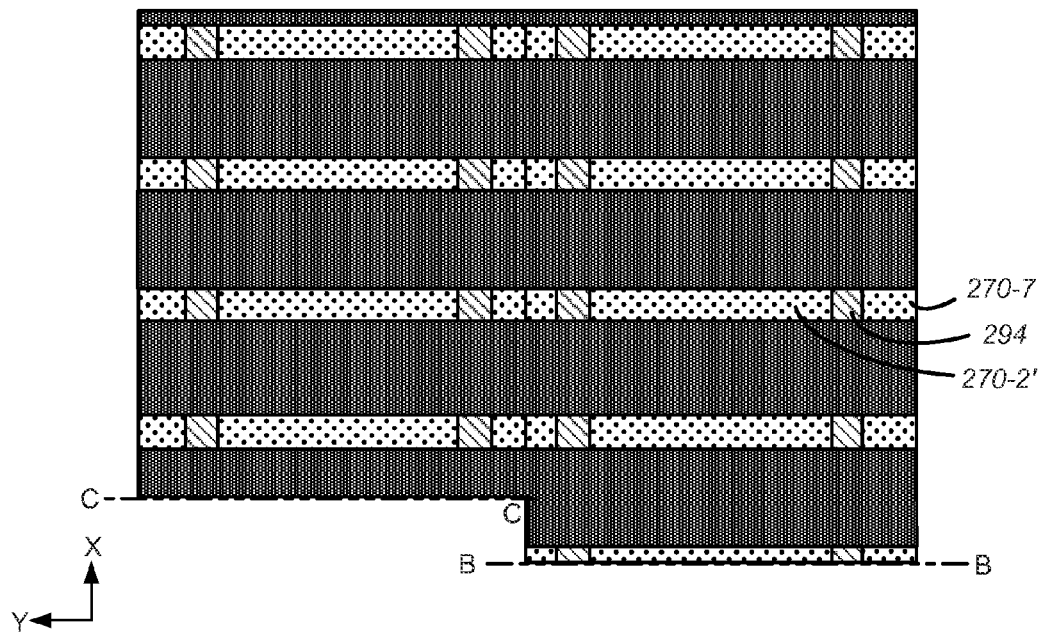
FIG. 29A is a top view of the multi-layer slab after an anisotropic nitride etch to remove the layer of nitride 220-1' above the oxide layer 270-2' down the exposing strips.

FIG. 29A is a top view of the multi-layer slab after an anisotropic nitride etch to remove the layer of nitride 220-1' above the oxide layer 270-2' down the exposing strips.

Figure 29B:
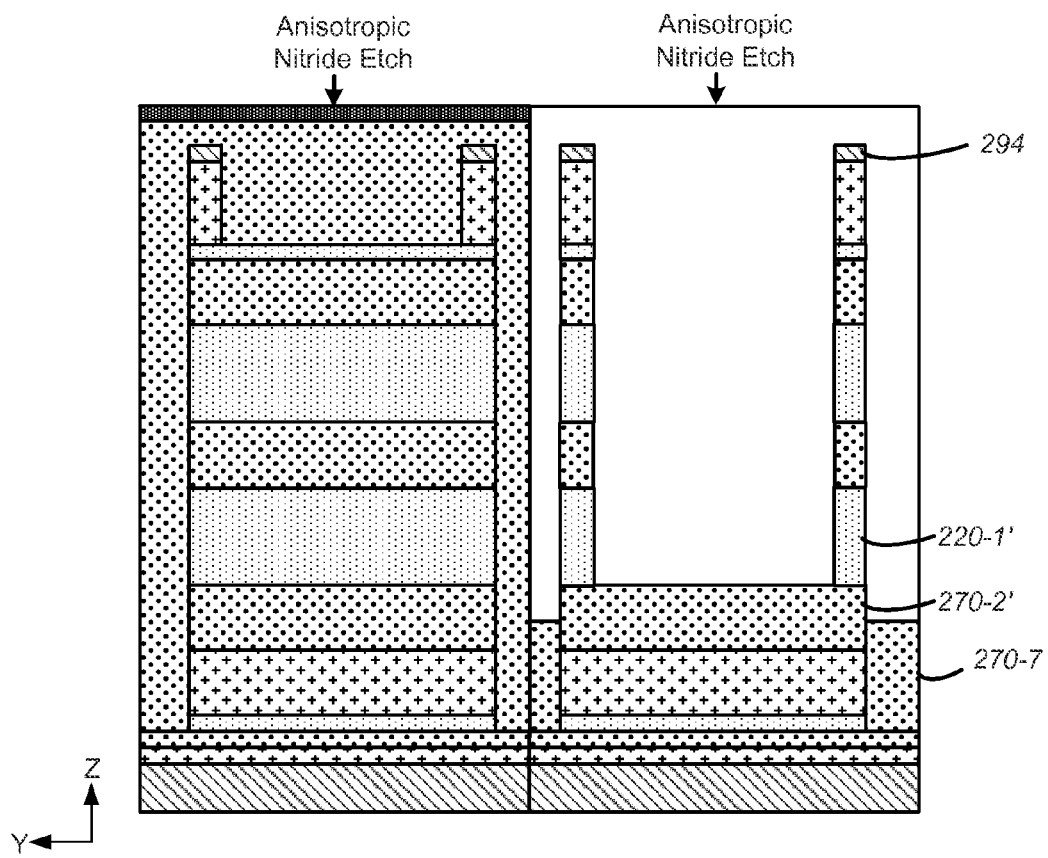
FIG. 29B is a sectional view in the y-z plane of the multi-layer slab shown in FIG. 29A.

FIG. 29B is a sectional view in the y-z plane of the multi-layer slab shown in FIG. 29A. The right section corresponds to the section taken at the cut B-B, which is shown in FIG. 9A and FIG. 29A. The left section corresponds to the section taken at the cut C-C, which is shown in FIG. 9A and FIG. 29A. As can be more clearly seen in this view, the anisotropic nitride etch removes the layer of nitride 220-1'. The antisotropic nitride etch is specific to etching nitride and hence will be stopped when the underlying layer of oxide 270-2' is reached. Also, the metal strip 294 acts as a submask, masking the layers underneath the submask from being etched.

Figure 30A:
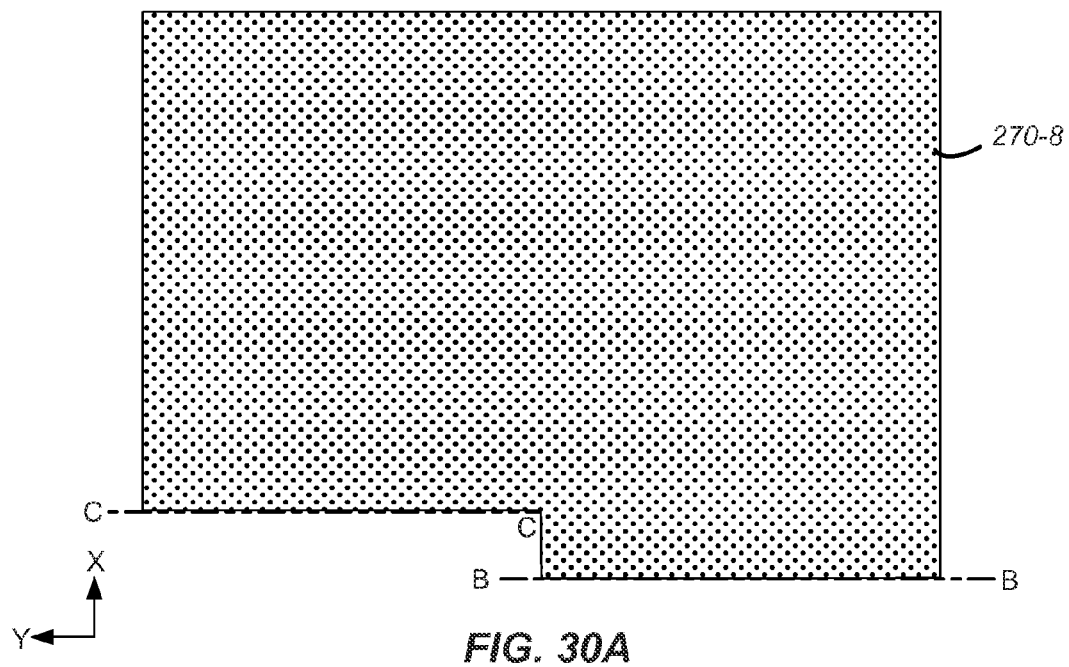
FIG. 30A is a top view of the multi-layer slab after filling with oxide 270-8.

FIG. 30A is a top view of the multi-layer slab after filling with oxide 270-8.

Figure 30B:
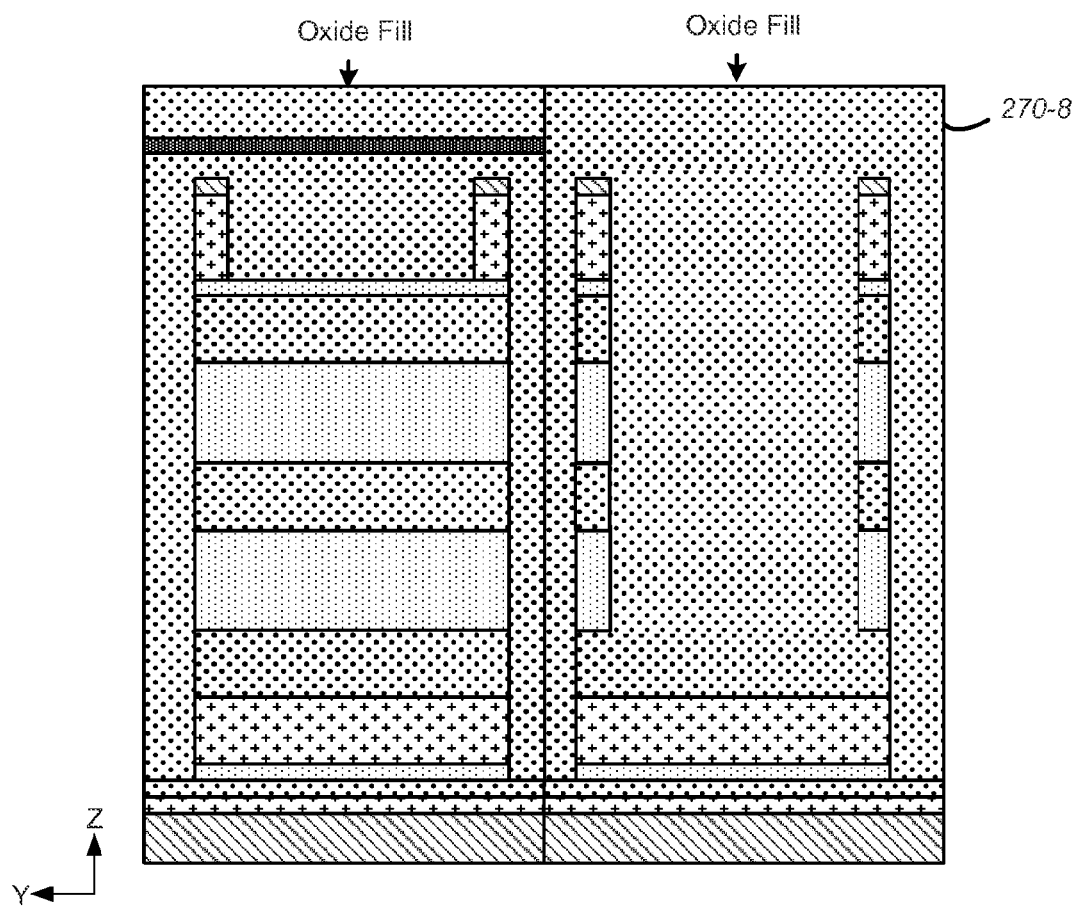
FIG. 30B is a sectional view in the y-z plane of the multi-layer slab shown in FIG. 30A.

FIG. 30B is a sectional view in the y-z plane of the multi-layer slab shown in FIG. 30A. The right section corresponds to the section taken at the cut B-B, which is shown in FIG. 9A and FIG. 30A. The left section corresponds to the section taken at the cut C-C, which is shown in FIG. 9A and FIG. 30A. As can be more clearly seen in this view, the layer of oxide 270-8 fills the deep trenches to form isolations.

Figure 31A:
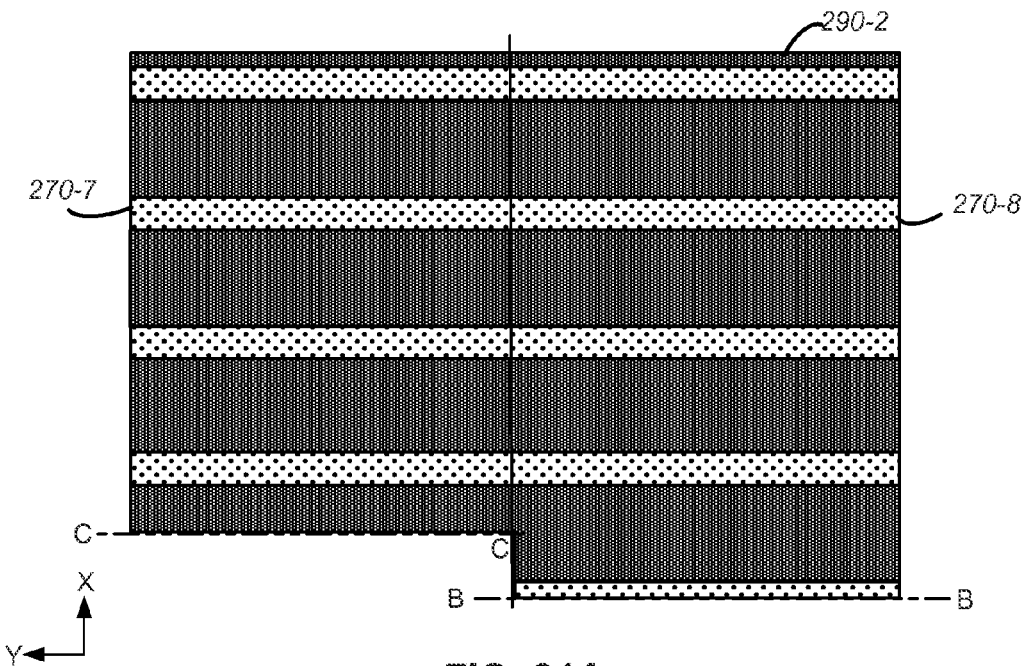
FIG. 31A is a top view of the multi-layer slab after etching to remove excess top layer of the oxide 270-8 deposited in the last step above the masking layer 290-2.

FIG. 31A is a top view of the multi-layer slab after etching to remove excess top layer of the oxide 270-8 deposited in the last step above the masking layer 290-2.

Figure 31B:
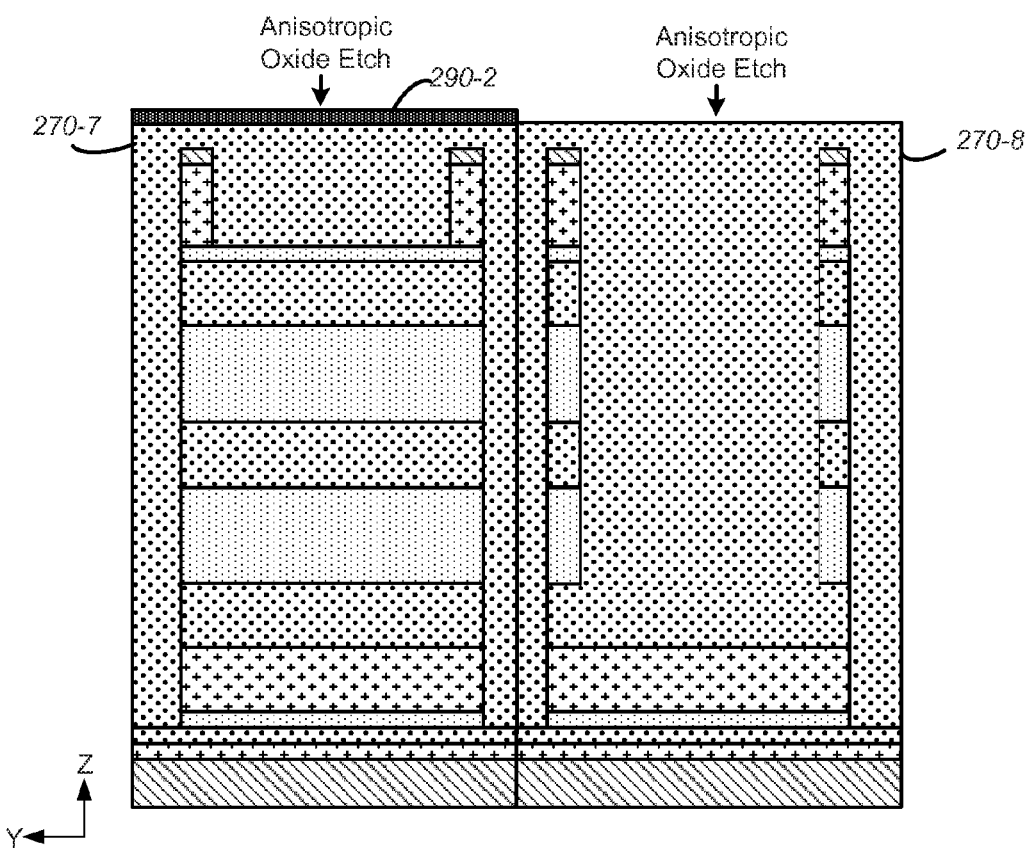
FIG. 31B is a sectional view in the y-z plane of the multi-layer slab shown in FIG. 31A.

FIG. 31B is a sectional view in the y-z plane of the multi-layer slab shown in FIG. 31A. The right section corresponds to the section taken at the cut B-B, which is shown in FIG. 9A and FIG. 31A. The left section corresponds to the section taken at the cut C-C, which is shown in FIG. 9A and FIG. 31A. As can be more clearly seen in this view, the excess layer of oxide 270-8 deposited in the last step is removed only from the top of the slab to expose the masking layer 290-2.

Figure 32A:
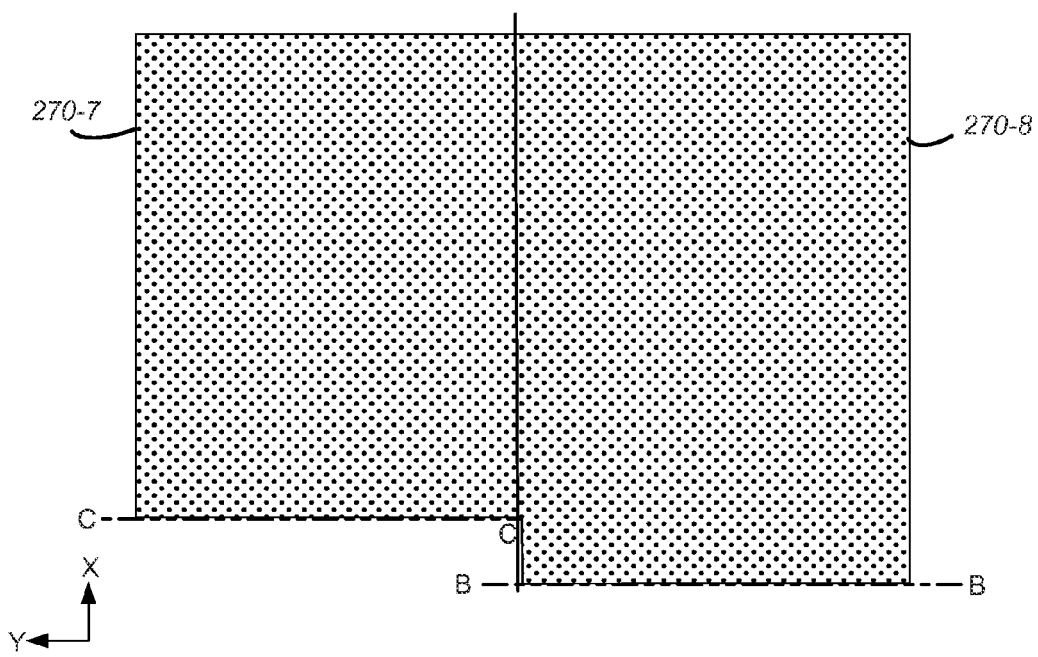
FIG. 32A is a top view of the multi-layer slab after removal of the masking layer 290-2.

FIG. 32A is a top view of the multi-layer slab after removal of the masking layer 290-2.

Figure 32B:
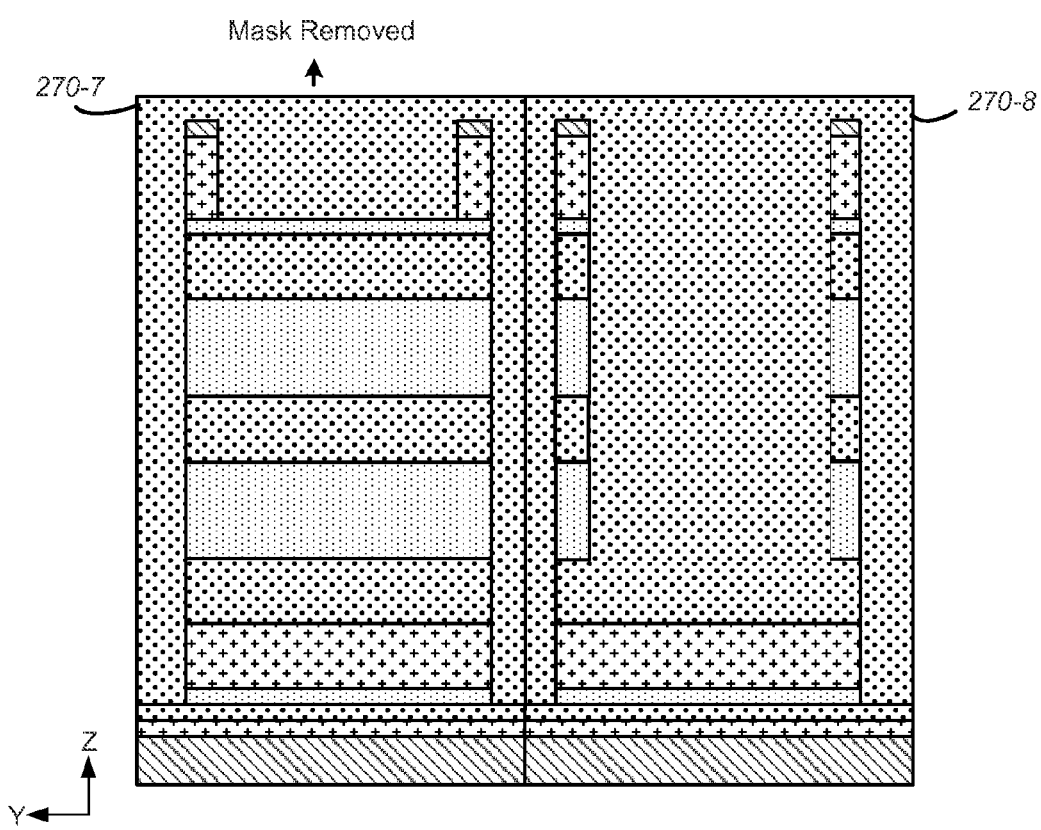
FIG. 32B is a sectional view in the y-z plane of the multi-layer slab shown in FIG. 34A.
Figure 34A:
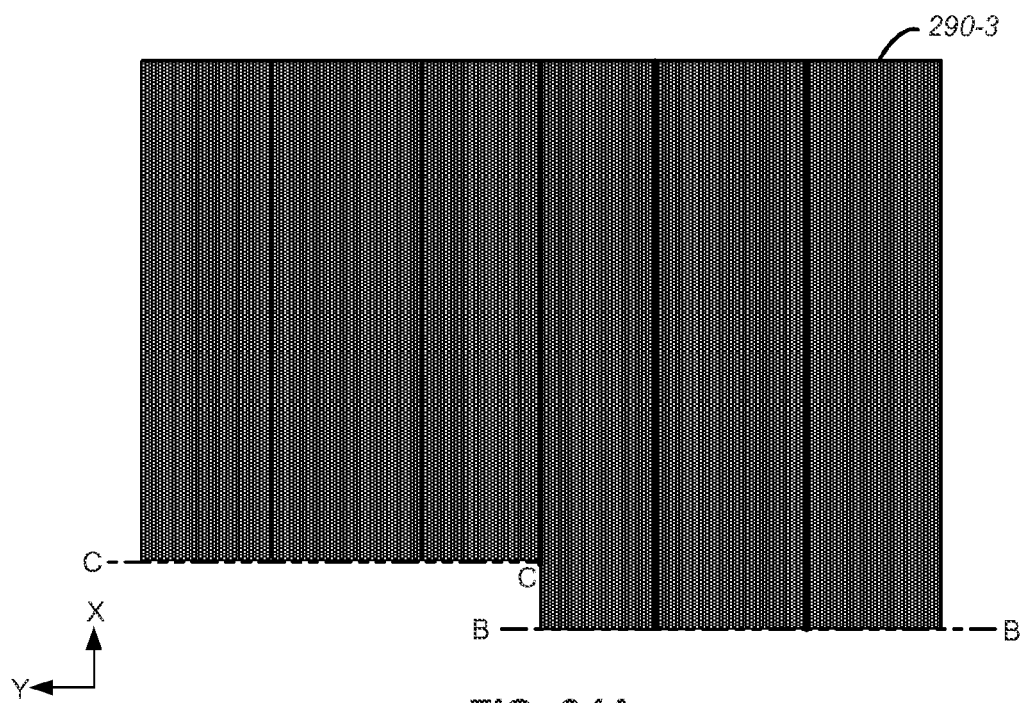
FIG. 34A is a top view of the multi-layer slab after depositing a masking layer 290-3 of thickness D.

FIG. 32B is a sectional view in the y-z plane of the multi-layer slab shown in FIG. 34A. The right section corresponds to the section taken at the cut B-B, which is shown in FIG. 9A and FIG. 32A. The left section corresponds to the section taken at the cut C-C, which is shown in FIG. 9A and FIG. 32A. As can be more clearly seen in this view, the masking layer 290-2 is removed from the top of the slab to expose the underlying oxide layer.

Forming the Word Lines with Socket Components

Figure 33A:
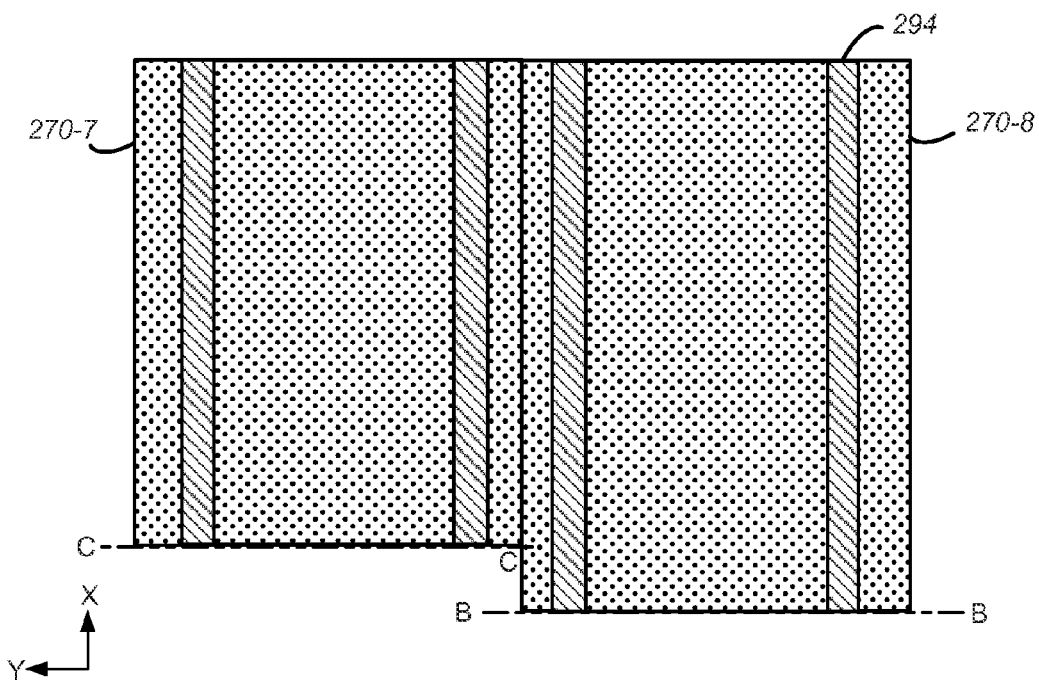
FIG. 33A is a top view of the multi-layer slab after an anisotropic oxide etch to remove a predetermined thickness from the top layer of oxide 270-7, 270-8.

FIG. 33A is a top view of the multi-layer slab after an anisotropic oxide etch to remove a predetermined thickness from the top layer of oxide 270-7, 270-8. Essentially, the top layer of oxide is etched back to a predetermined thickness D below the metal strip 294. It will be such that the length of the socket component 222 in the y-direction+δ, where δ 226 will be a setback of the front of the socket component 224 from the NAND channel 52/bit line 230 (see FIG. 8).

Figure 33B:
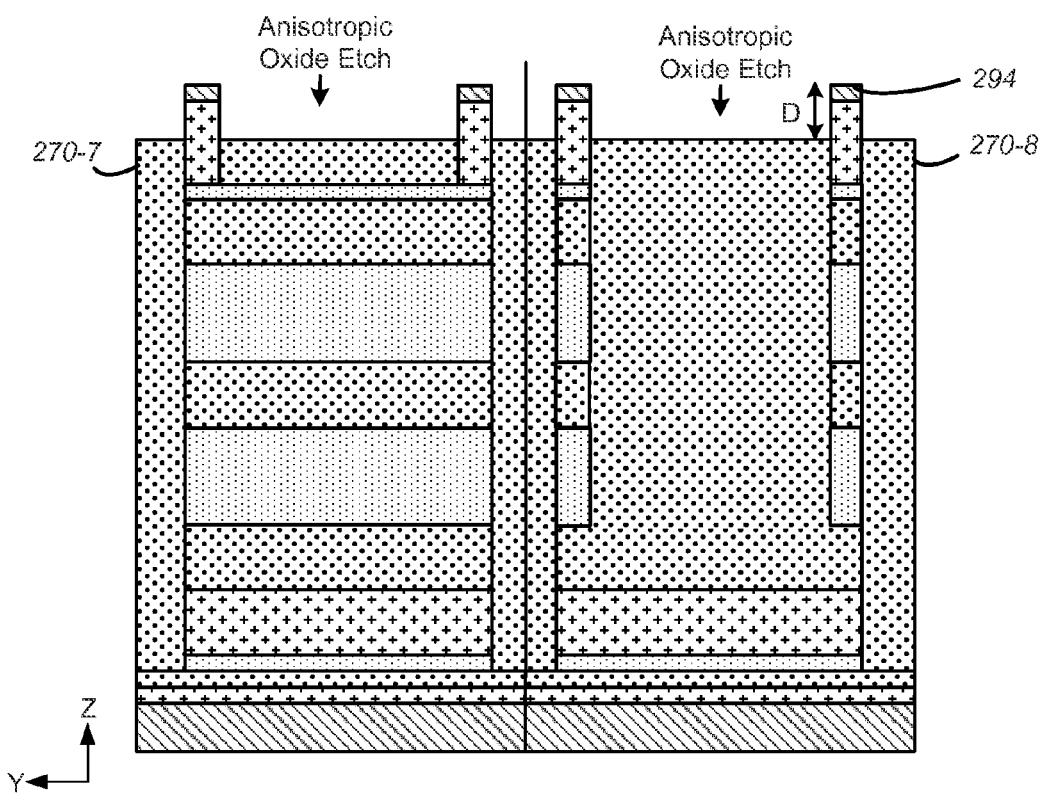
FIG. 33B is a sectional view in the y-z plane of the multi-layer slab shown in FIG. 33A.

FIG. 33B is a sectional view in the y-z plane of the multi-layer slab shown in FIG. 33A. The right section corresponds to the section taken at the cut B-B, which is shown in FIG. 9A and FIG. 24A. The left section corresponds to the section taken at the cut C-C, which is shown in FIG. 9A and FIG. 24A. As can be more clearly seen in this view, the anisotropic oxide etch removes a predetermined thickness from the layer of oxide 270-7, 270-8. The metal strips 294 provide a sub-mask to form at the metal strips 294 raised islands of height D after the oxide etch.

FIG. 34A is a top view of the multi-layer slab after depositing a masking layer 290-3 of thickness D.

Figure 34B:
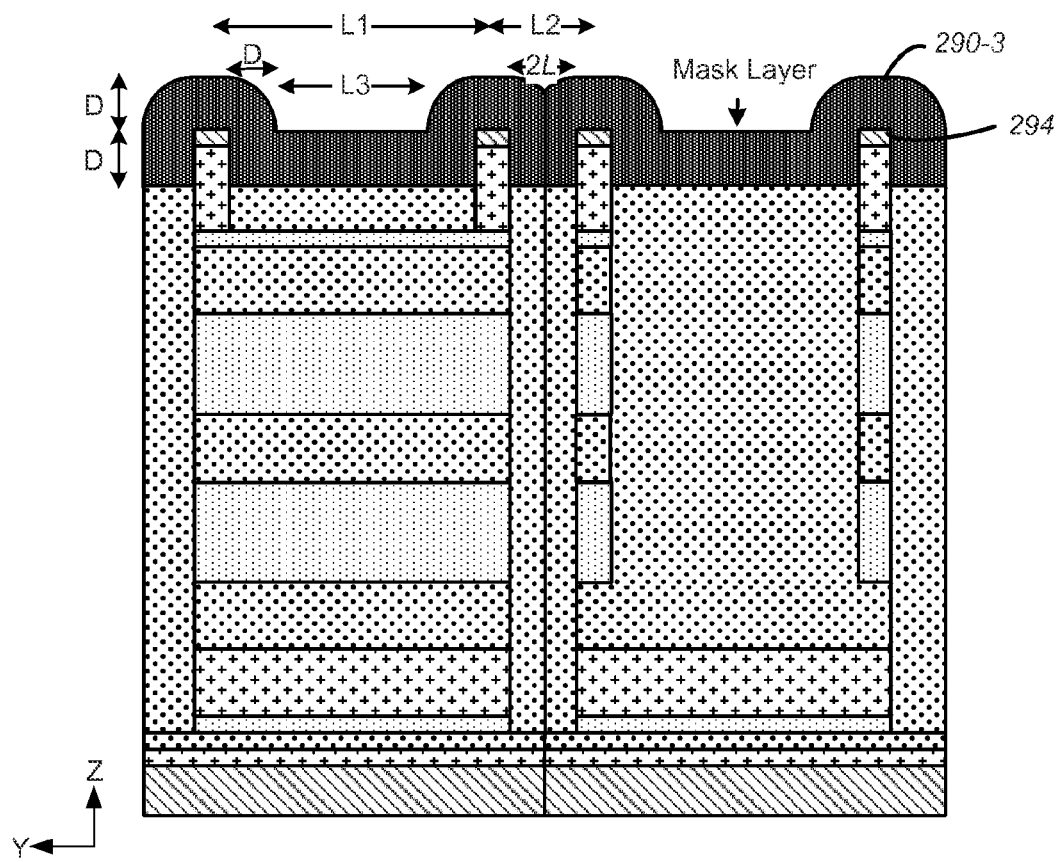
FIG. 34B is a sectional view in the y-z plane of the multi-layer slab shown in FIG. 34A.

FIG. 34B is a sectional view in the y-z plane of the multi-layer slab shown in FIG. 34A. The right section corresponds to the section taken at the cut B-B, which is shown in FIG. 9A and FIG. 23A. The left section corresponds to the section taken at the cut C-C, which is shown in FIG. 9A and FIG. 23A. As can be more clearly seen in this view, the masking layer 290-3 of thickness D is deposited on top of the multi-layer slab and wraps around the raised islands of height D. The raised islands in the y-direction are alternately of distances L1 and L2 apart, where L1>L2>2L, and L3=L1−2D. It will be seen later in FIG. 37B that D+the width of the metal strip 294 amounts to the length of the grotto 223 for forming the socket component.

Figure 35A:
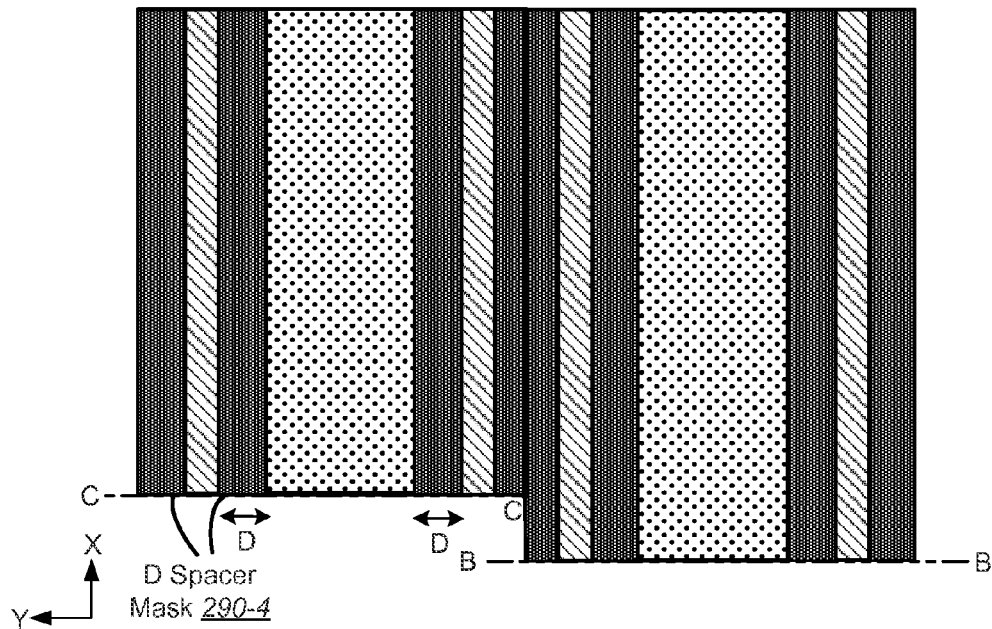
FIG. 35A is a top view of the multi-layer slab after an anisotropic mask etch to remove the layer of thickness D from the mask 290-3.

FIG. 35A is a top view of the multi-layer slab after an anisotropic mask etch to remove the layer of thickness D from the mask 290-3. The mask etch leaves a remnant mask around each raised island, which is a masking spacer band 290-4 in the x-direction of width D.

Figure 35B:
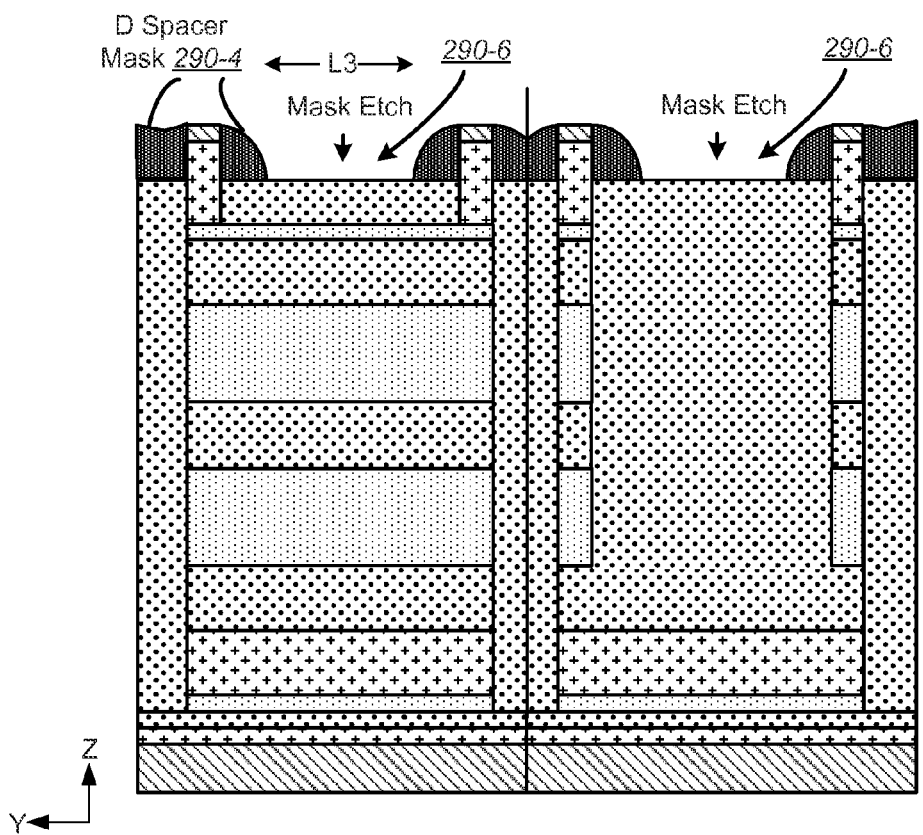
FIG. 35B is a sectional view in the y-z plane of the multi-layer slab shown in FIG. 35A.

FIG. 35B is a sectional view in the y-z plane of the multi-layer slab shown in FIG. 35A. The right section corresponds to the section taken at the cut B-B, which is shown in FIG. 9A and FIG. 35A. The left section corresponds to the section taken at the cut C-C, which is shown in FIG. 9A and FIG. 35A. As can be more clearly seen in this view, the anisotropic mask etch shaves off the layer of mask 290-3 (see FIG. 34B) by a thickness of D, thereby exposing an unmasked band 290-6 of width L3 along the x-direction, centered between each pair of raised islands that are L1 apart (see FIG. 34B). The mask etch leaves a remnant mask around each raised island, which is a masking spacer band 290-4 in the x-direction of width D. The width of the unmasked band 290-6 is therefore L3=L1−2D.

Figure 36A:
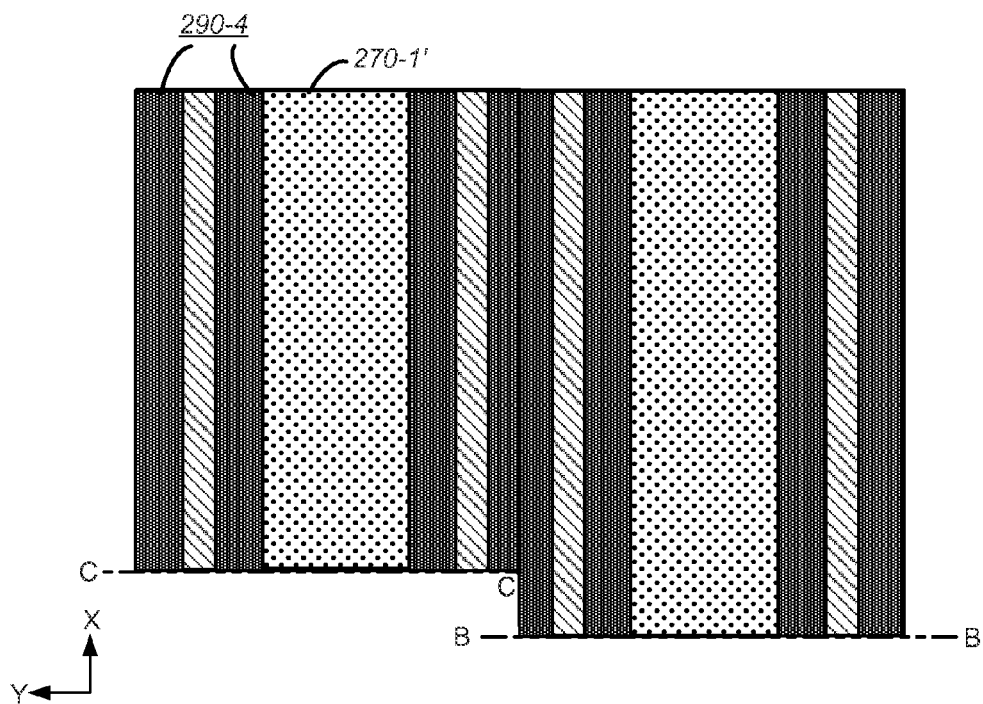
FIG. 36A is a top view of the multi-layer slab after an anisotropic deep etch through the unmasked bands 290-6 to create a deep trench 290-7 down to the isolation oxide layer 270-1'.

FIG. 36A is a top view of the multi-layer slab after an anisotropic deep etch through the unmasked bands 290-6 to create a deep trench 290-7 down to the isolation oxide layer 270-1'.

Figure 36B:
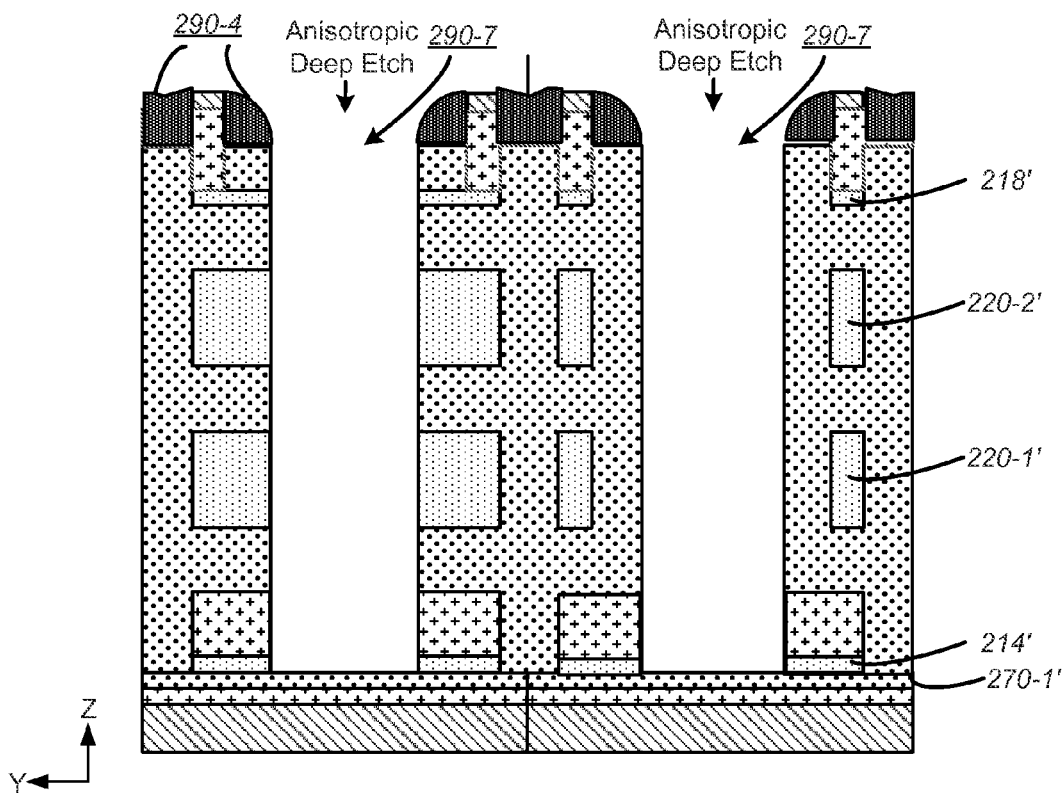
FIG. 36B is a sectional view in the y-z plane of the multi-layer slab shown in FIG. 36A.

FIG. 36B is a sectional view in the y-z plane of the multi-layer slab shown in FIG. 36A. The right section corresponds to the section taken at the cut B-B, which is shown in FIG. 9A and FIG. 36A. The left section corresponds to the section taken at the cut C-C, which is shown in FIG. 9A and FIG. 36A. As can be more clearly seen in this view, the anisotropic etch extends the trench 290-7 downward to stop at the isolation oxide layer 270-1'.

Figure 37A:
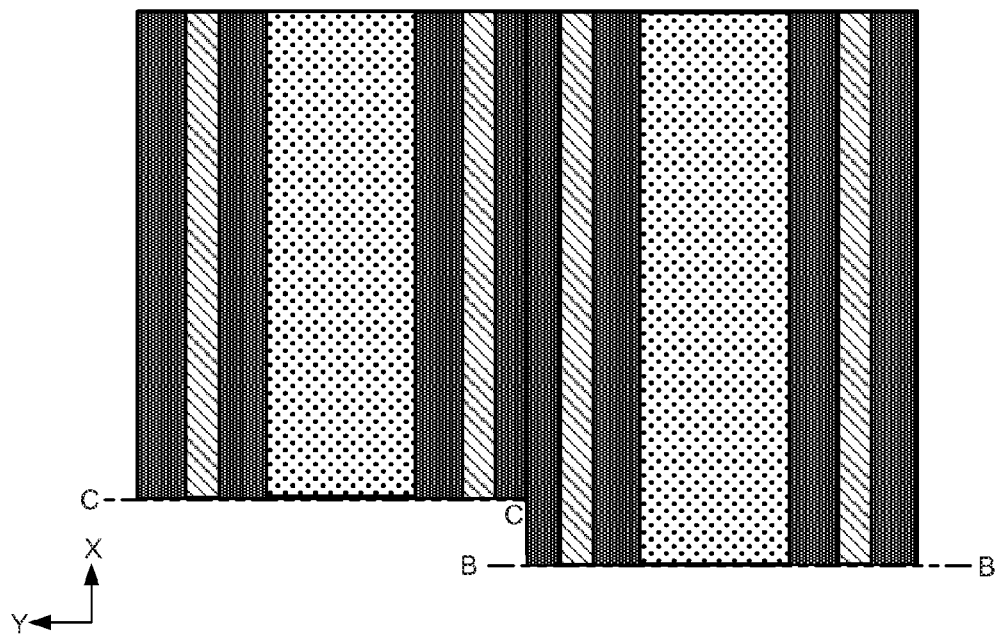
FIG. 37A is a top view of the multi-layer slab after an isotropic nitride etch.

FIG. 37A is a top view of the multi-layer slab after an isotropic nitride etch to remove, through the deep trench 290-7, the layers of sacrificial nitride 218', 220-2', 220-1', 214' shown in FIG. 36B.

Figure 37B:
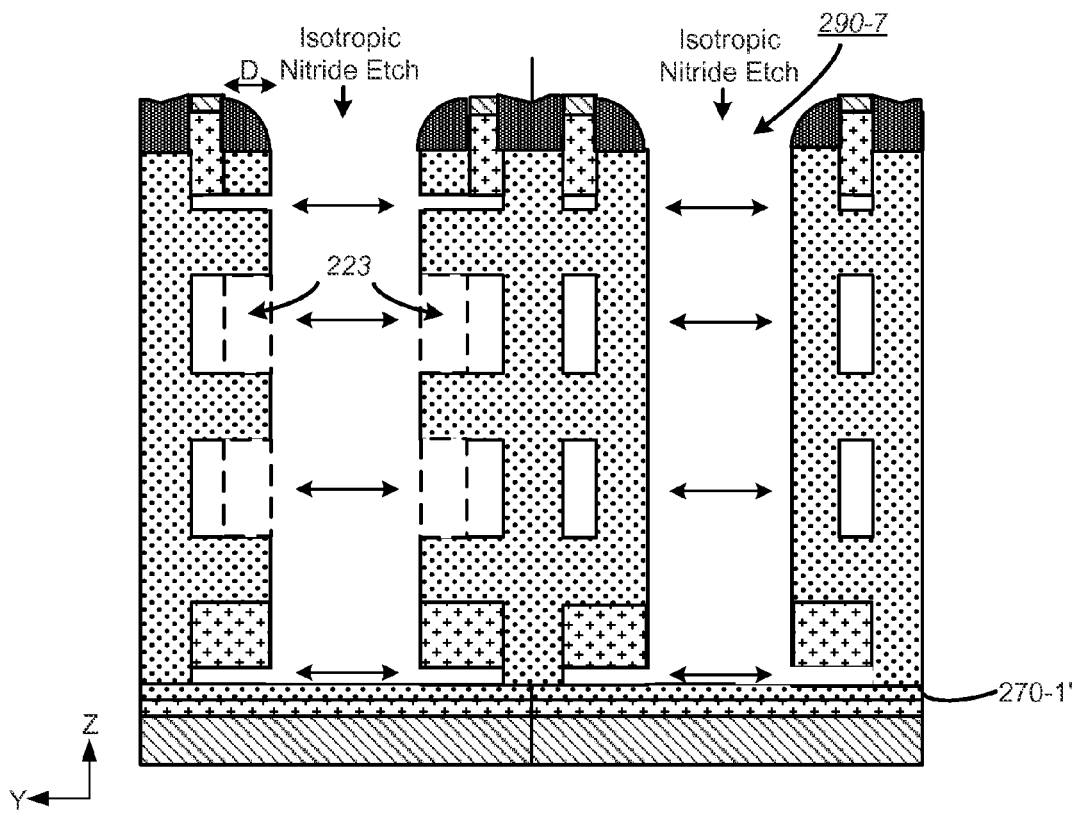
FIG. 37B is a sectional view in the y-z plane of the multi-layer slab shown in FIG. 37A.

FIG. 37B is a sectional view in the y-z plane of the multi-layer slab shown in FIG. 37A. The right section corresponds to the section taken at the cut B-B, which is shown in FIG. 9A and FIG. 37A. The left section corresponds to the section taken at the cut C-C, which is shown in FIG. 9A and FIG. 37A. As can be more clearly seen in this view, the isotropic nitride etch, through the deep trench 290-7, removes the layers of sacrificial nitride 218', 220-2', 220-1', 214' shown in FIG. 36B. The isotropic nitride etch is specific to etching nitride and hence will be stopped when the underlying layer of oxide is reached after the nitride has been etched away, grottoes 223 are left behind where the socket components 222 will be formed (see also FIG. 9C).

Figure 38A:
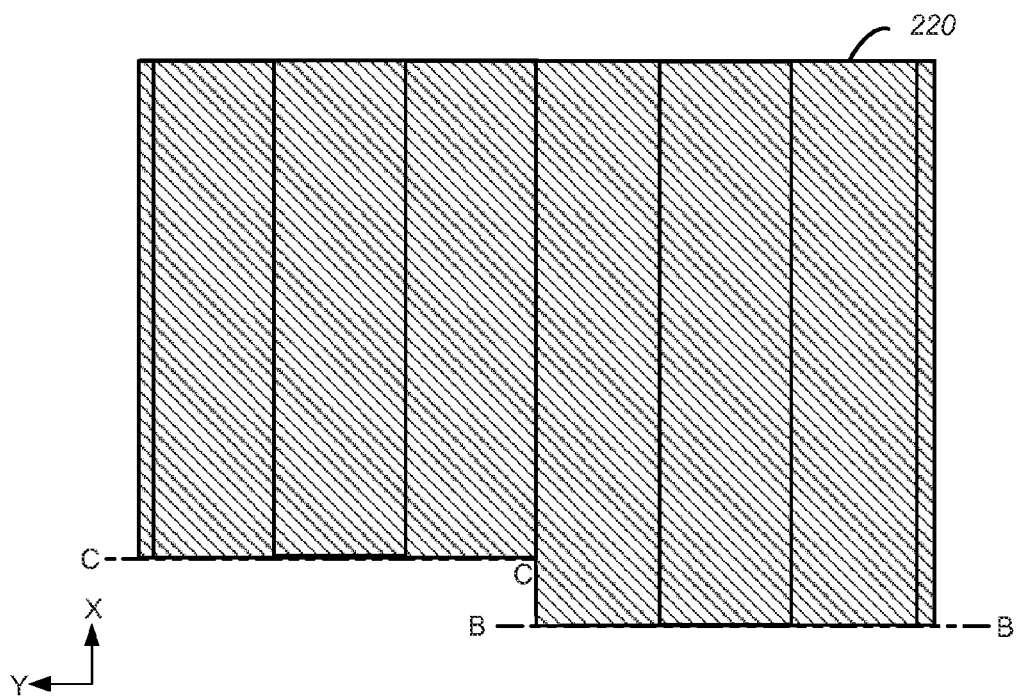
FIG. 38A is a top view of the multi-layer slab after deposition of a layer of metal 220, such as tungsten.

FIG. 38A is a top view of the multi-layer slab after deposition of a layer of metal 220, such as tungsten.

Figure 38B:
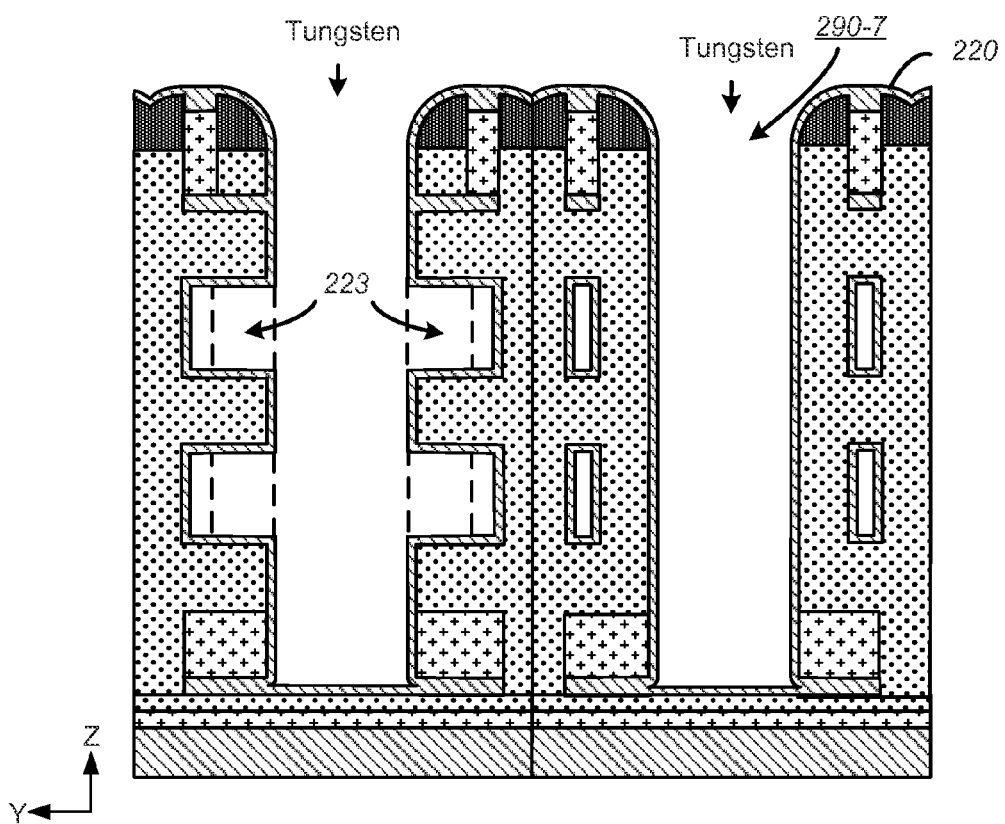
FIG. 38B is a sectional view in the y-z plane of the multi-layer slab shown in FIG. 38A.

FIG. 38B is a sectional view in the y-z plane of the multi-layer slab shown in FIG. 38A. The right section corresponds to the section taken at the cut B-B, which is shown in FIG. 9A and FIG. 38A. The left section corresponds to the section taken at the cut C-C, which is shown in FIG. 9A and FIG. 38A. As can be more clearly seen in this view, the layer of metal 220 is deposited isotropically on top of all exposed surfaces, including the sidewalls, and filling the grottoes 223 previously occupied by the nitride layers and the bottom of the deep trench 290-7.

Figure 39A:
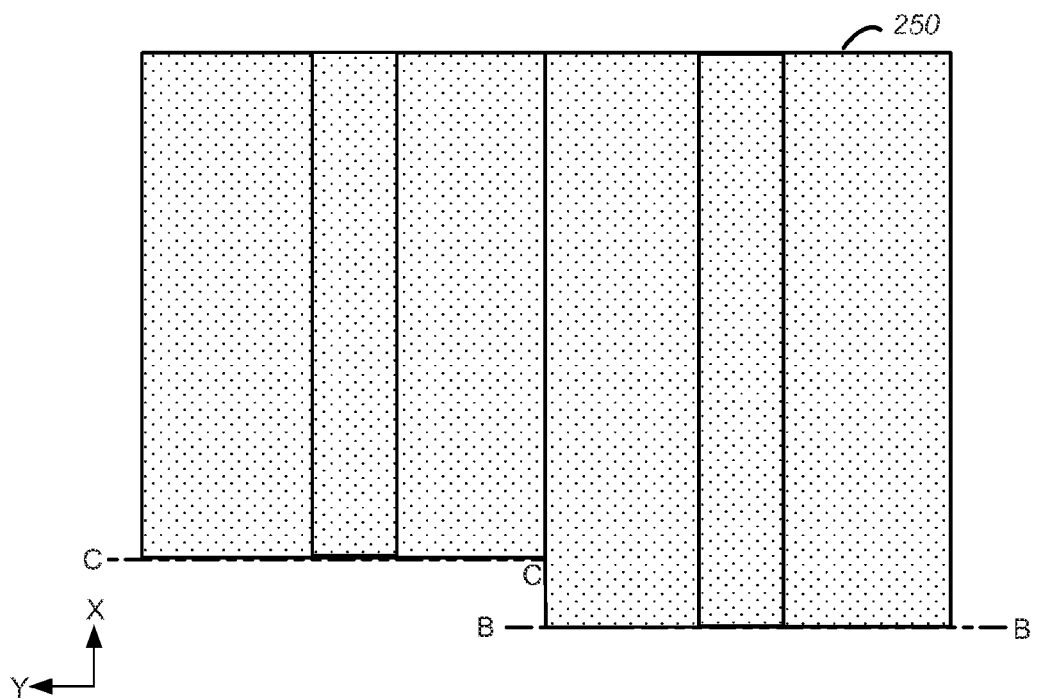
FIG. 39A is a top view of the multi-layer slab after deposition of a layer of interpoly dielectric (IPD) material 250 on top of the metal layer 220.

FIG. 39A is a top view of the multi-layer slab after deposition of a layer of interpoly dielectric (IPD) material 250 on top of the metal layer 220.

Figure 39B:
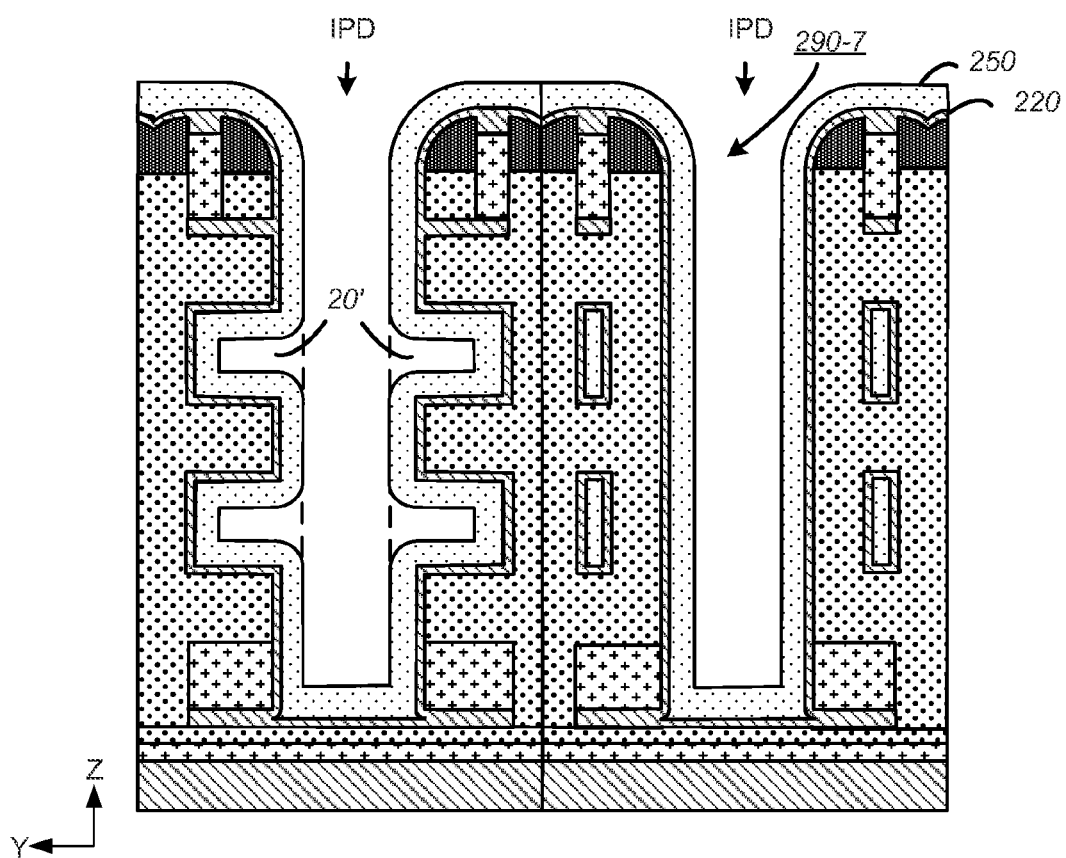
FIG. 39B is a sectional view in the y-z plane of the multi-layer slab shown in FIG. 39A.

FIG. 39B is a sectional view in the y-z plane of the multi-layer slab shown in FIG. 39A. The right section corresponds to the section taken at the cut B-B, which is shown in FIG. 9A and FIG. 39A. The left section corresponds to the section taken at the cut C-C, which is shown in FIG. 9A and FIG. 39A. As can be more clearly seen in this view, the layer of interpoly dielectric material IPD 250 is deposited isotropically on top of all exposed surfaces, including the sidewalls, and filling the grottoes previously occupied by the nitride layers and the bottom of the deep trench 290-7. However, the dimension of each grotto relative to the thickness of the layer of IPD is such that a cavity 20' remains in the socket component space. This cavity 20' will be filled by polysilicon in the next step to form the embedded floating gate 20 of each memory cell.

Figure 40A:
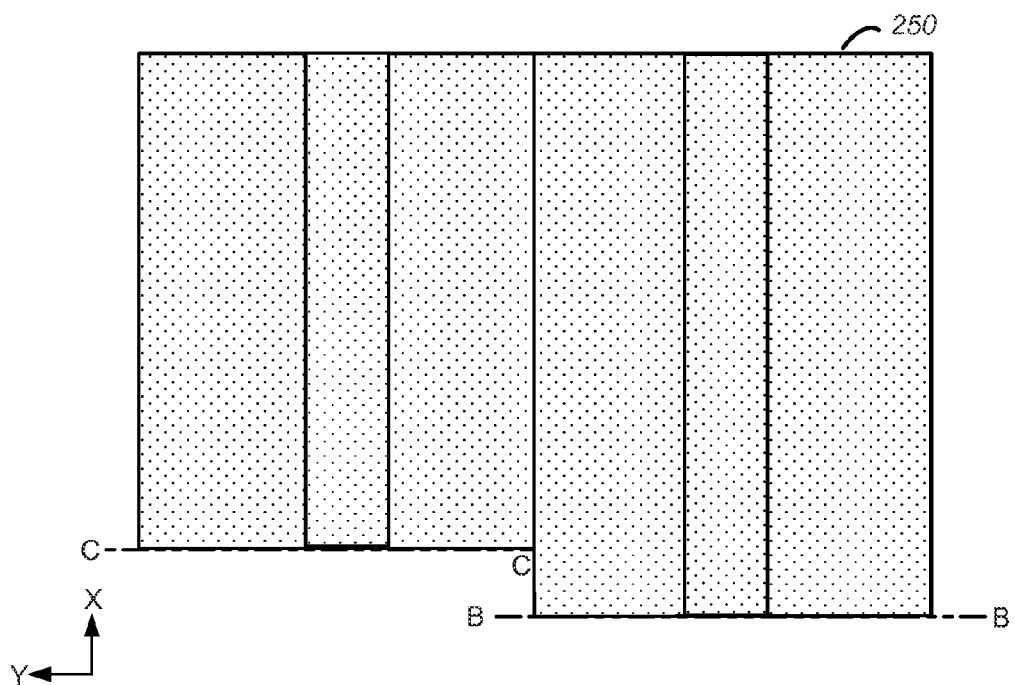
FIG. 40A is a top view of the multi-layer slab after an isotropic deposition of a layer of polysilicon 20 on top of the layer of IPD 250 and isotropic etch back of the layer of polysilicon 20.

FIG. 40A is a top view of the multi-layer slab after an isotropic deposition of a layer of polysilicon 20 on top of the layer of IPD 250 and isotropic etch back of the layer of polysilicon 20.

Figure 40B:
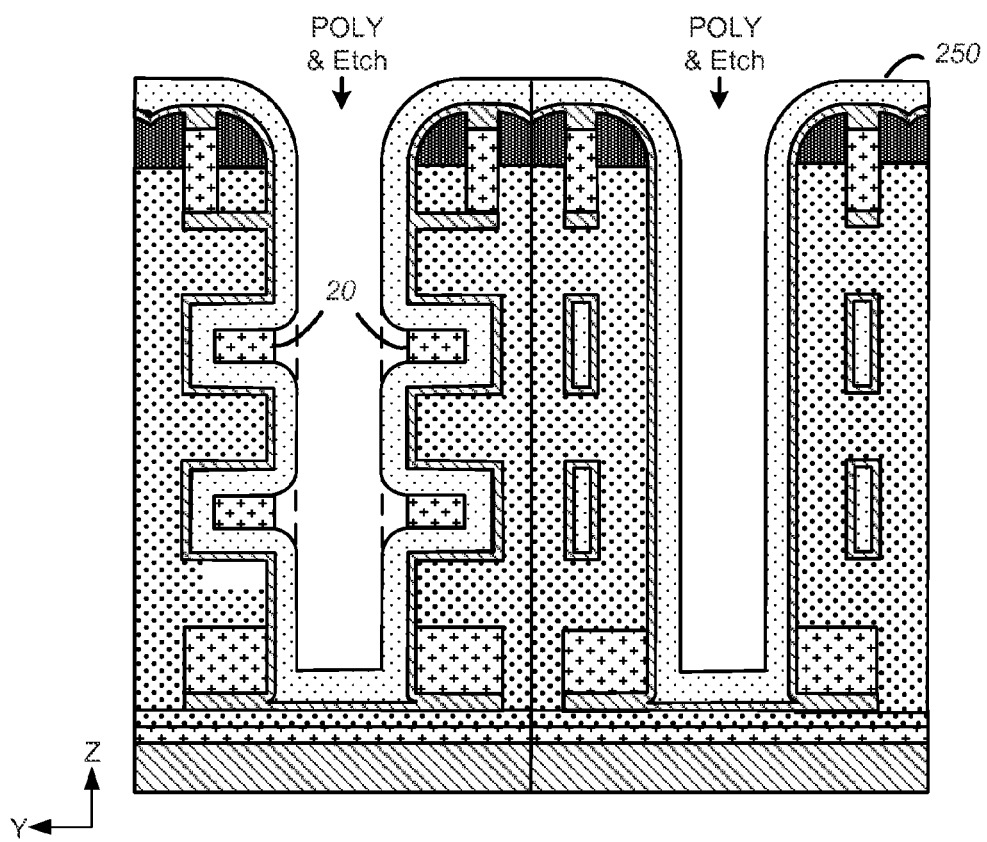
FIG. 40B is a sectional view in the y-z plane of the multi-layer slab shown in FIG. 40A.

FIG. 40B is a sectional view in the y-z plane of the multi-layer slab shown in FIG. 40A. The right section corresponds to the section taken at the cut B-B, which is shown in FIG. 9A and FIG. 40A. The left section corresponds to the section taken at the cut C-C, which is shown in FIG. 9A and FIG. 40A. As can be more clearly seen in this view, the layer of polysilicon 20 is deposited isotropically on top of all exposed surfaces, including the sidewalls, and filling the cavity 20' in the socket component space shown in FIG. 39B. This deposition step is followed by an isotropic etch back of the layer of polysilicon 20 so that the layer of polysilicon is removed except for that filling the cavity 20'

Figure 41A:
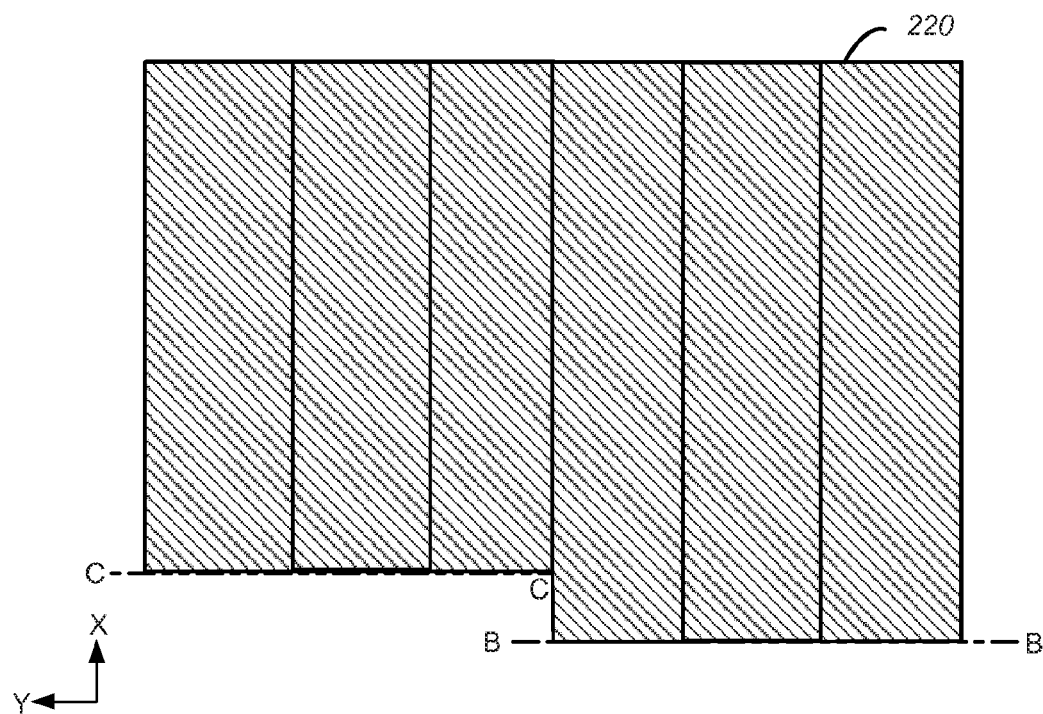
FIG. 41A is a top view of the multi-layer slab after an isotropic etch back of the layer of IPD 250 to expose the underlying layer of metal 220 on the side wall of the trench 290-7.

FIG. 41A is a top view of the multi-layer slab after an isotropic etch back of the layer of IPD 250 to expose the underlying layer of metal 220 on the side wall of the trench 290-7.

Figure 41B:
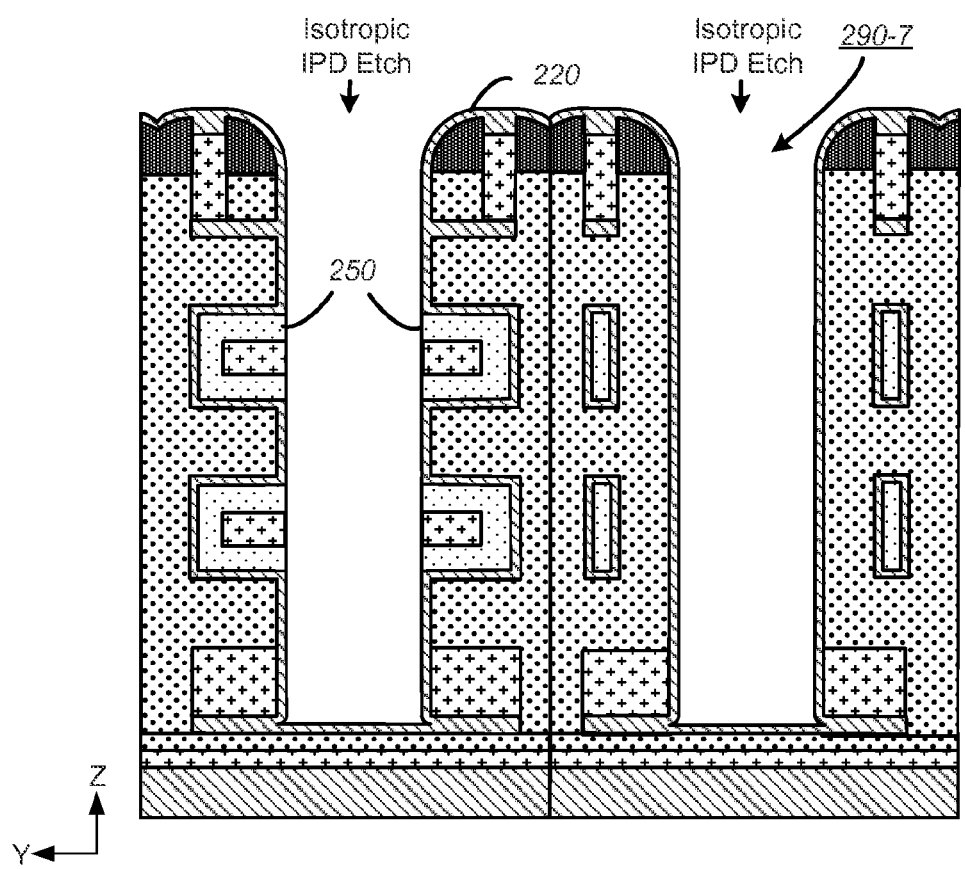
FIG. 41B is a sectional view in the y-z plane of the multi-layer slab shown in FIG. 41A.

FIG. 41B is a sectional view in the y-z plane of the multi-layer slab shown in FIG. 41A. The right section corresponds to the section taken at the cut B-B, which is shown in FIG. 9A and FIG. 41A. The left section corresponds to the section taken at the cut C-C, which is shown in FIG. 9A and FIG. 41A. As can be more clearly seen in this view, the isotropic etch back removes the layer of IPD 250 and exposes the underlying layer of metal 220 except in the socket component where the IPD 250 filling remains.

Figure 42A:
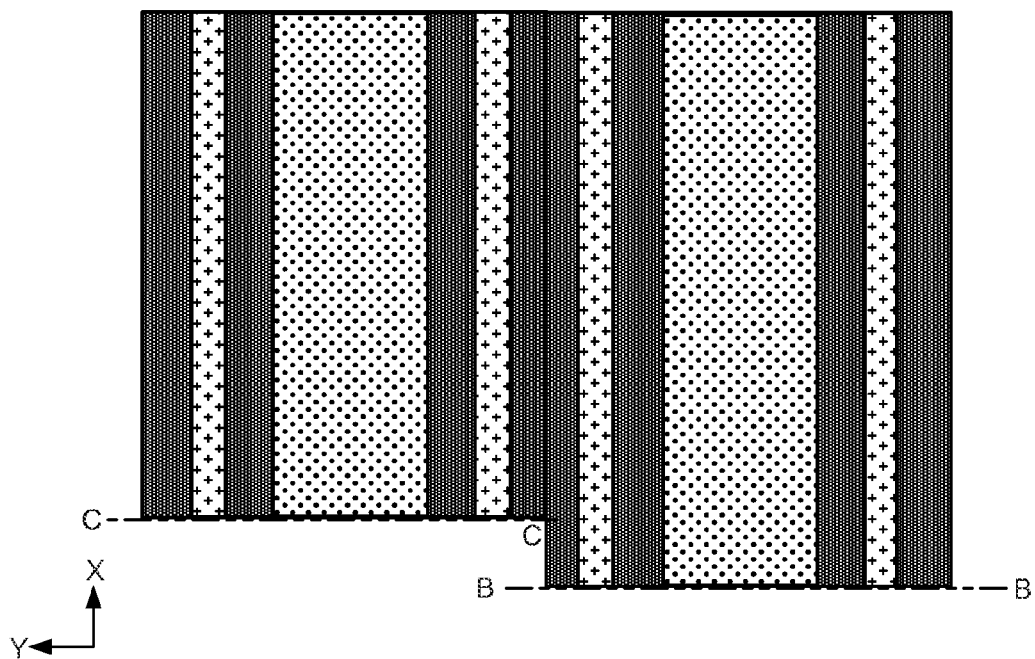
FIG. 42A is a top view of the multi-layer slab after an isotropic etch back of the layer of metal 220.

FIG. 42A is a top view of the multi-layer slab after an isotropic etch back of the layer of metal 220.

Figure 42B:
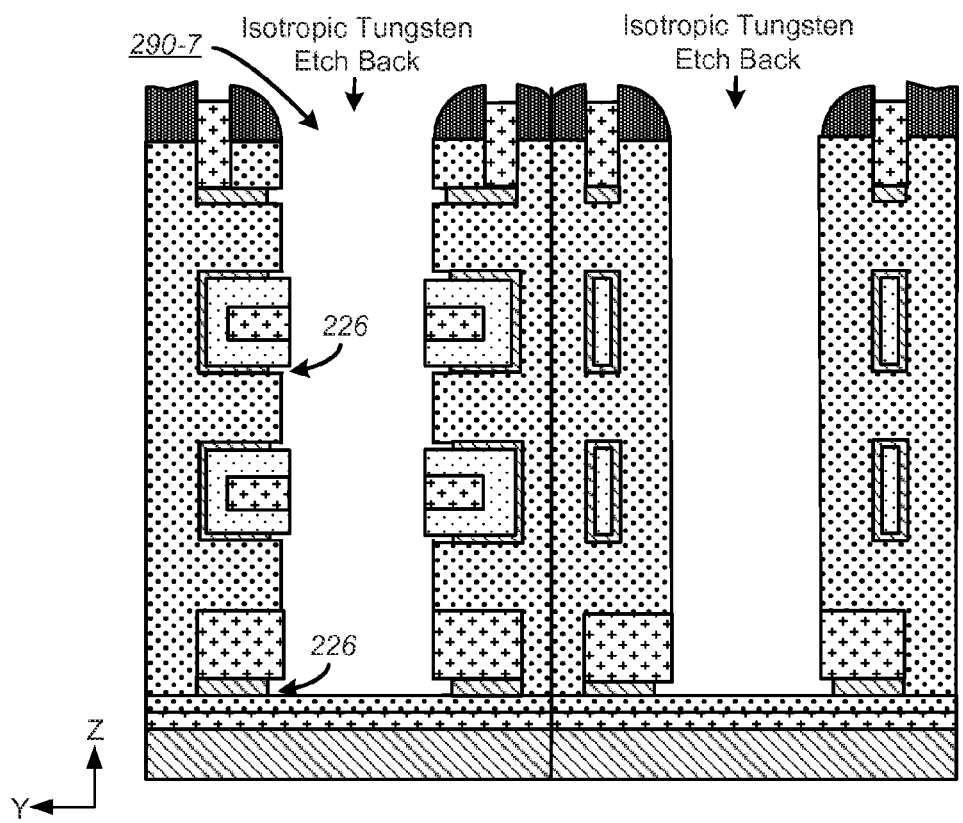
FIG. 42B is a sectional view in the y-z plane of the multi-layer slab shown in FIG. 42A.

FIG. 42B is a sectional view in the y-z plane of the multi-layer slab shown in FIG. 42A. The right section corresponds to the section taken at the cut B-B, which is shown in FIG. 9A and FIG. 42A. The left section corresponds to the section taken at the cut C-C, which is shown in FIG. 9A and FIG. 42A. As can be more clearly seen in this view, the isotropic etch back trim the metal 220 with the offset or setback 226 (see FIG. 8 and FIG. 9C) from the trench 290-7.

Figure 43A:
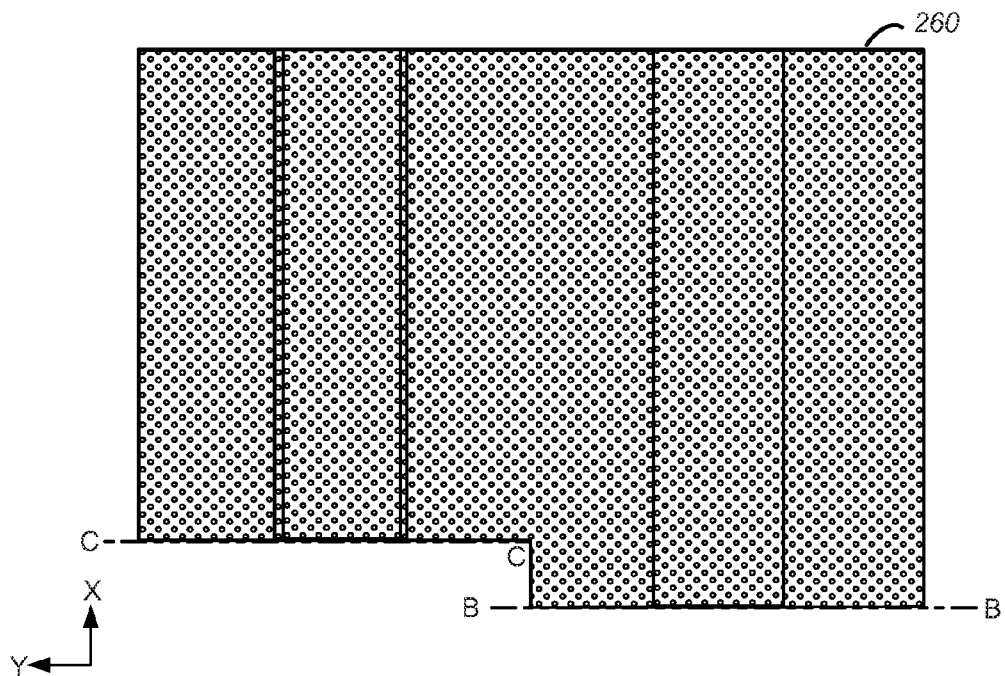
FIG. 43A is a top view of the multi-layer slab after an isotropic deposition of a layer of tunnel oxide 260.

FIG. 43A is a top view of the multi-layer slab after an isotropic deposition of a layer of tunnel oxide 260.

Figure 43B:
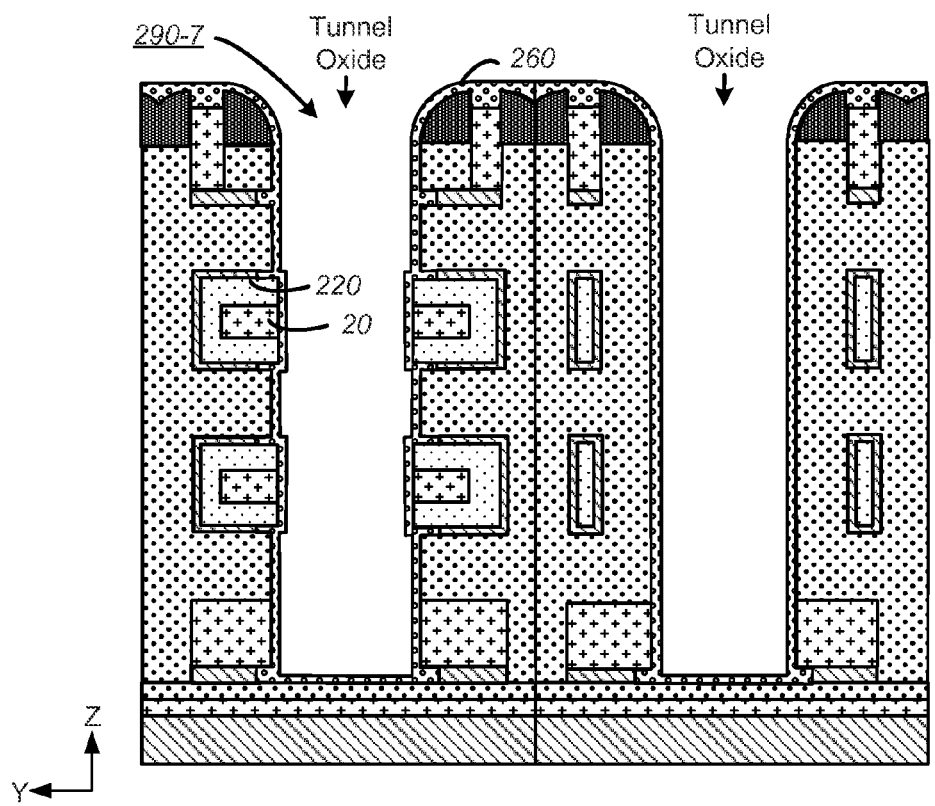
FIG. 43B is a sectional view in the y-z plane of the multi-layer slab shown in FIG. 43A.

FIG. 43B is a sectional view in the y-z plane of the multi-layer slab shown in FIG. 43A. The right section corresponds to the section taken at the cut B-B, which is shown in FIG. 9A and FIG. 43A. The left section corresponds to the section taken at the cut C-C, which is shown in FIG. 9A and FIG. 43A. As can be more clearly seen in this view, the isotropic deposition of the layer of tunnel oxide 260 also fills the space from the setback 226 and insulates the metal 220 and the polysilicon 20 from the trench 290-7

Figure 44A:
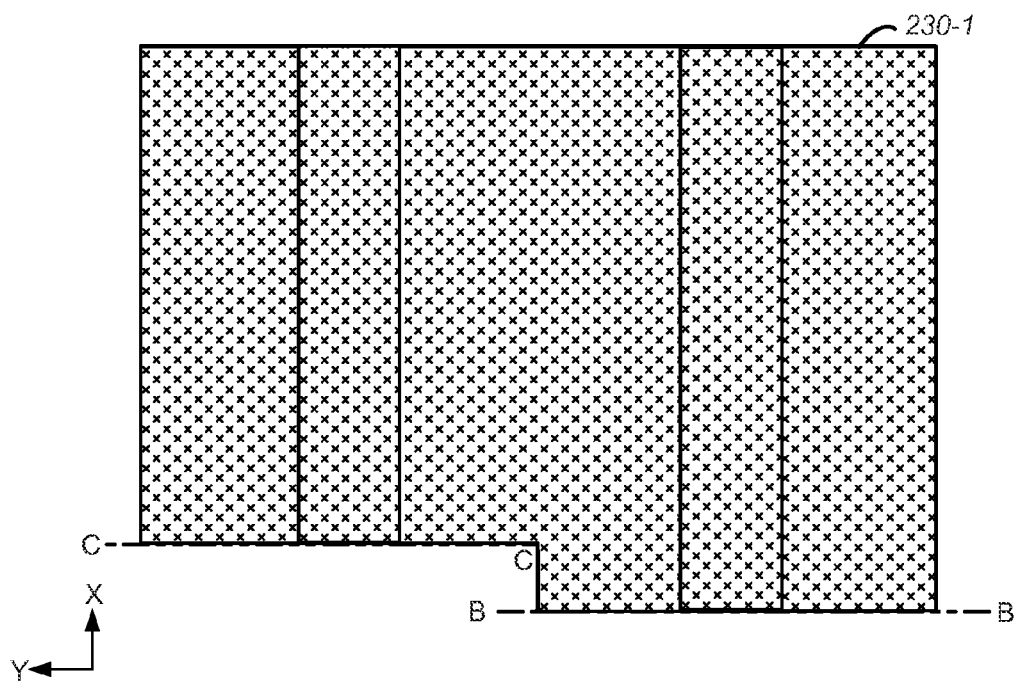
FIG. 44A is a top view of the multi-layer slab after an isotropic deposition of an initial protective layer of p-doped polysilicon 230-1.

FIG. 44A is a top view of the multi-layer slab after an isotropic deposition of an initial protective layer of p-doped polysilicon 230-1.

Figure 44B:
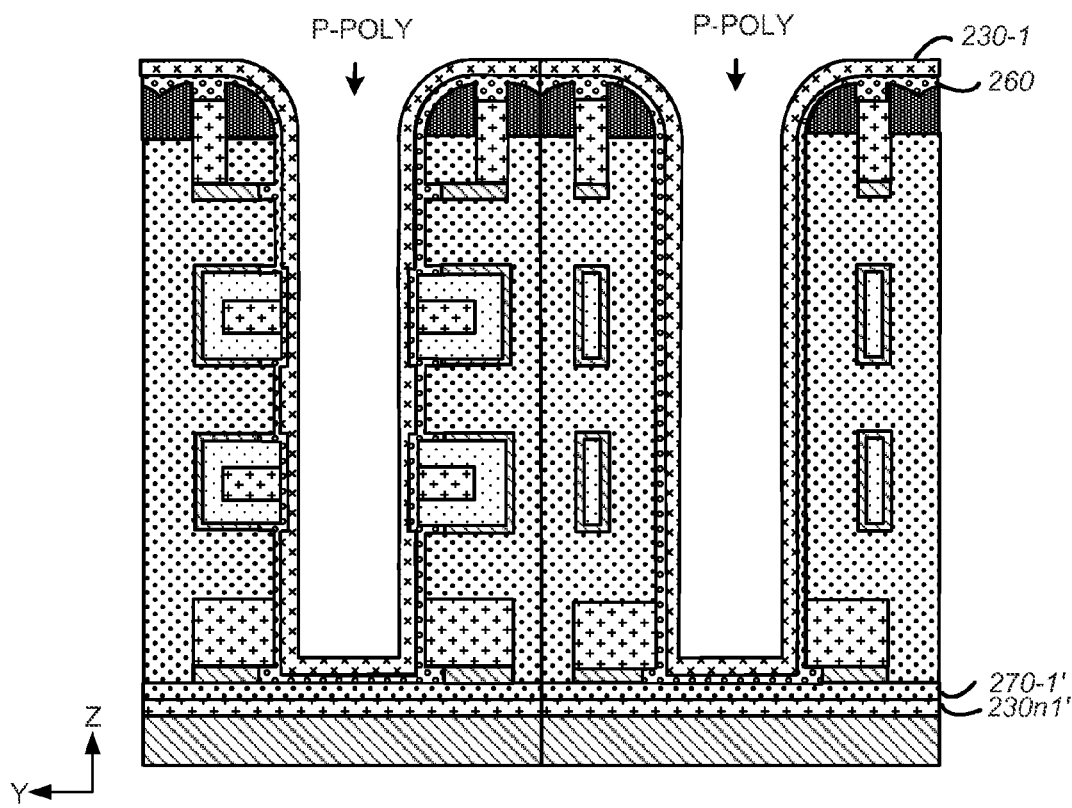
FIG. 44B is a sectional view in the y-z plane of the multi-layer slab shown in FIG. 44A.

FIG. 44B is a sectional view in the y-z plane of the multi-layer slab shown in FIG. 44A. The right section corresponds to the section taken at the cut B-B, which is shown in FIG. 9A and FIG. 44A. The left section corresponds to the section taken at the cut C-C, which is shown in FIG. 9A and FIG. 44A. As can be more clearly seen in this view, the isotropic deposition of the initial protective layer of p-doped polysilicon 230-1 is on top of the previously deposited tunnel oxide. The p-doped polysilicon 230-1 will form the bulk of the bit line 230. The initial protective layer is to protect the underlying tunnel oxide 260 in the next step when the layer of oxide 270-1' at the bottom of the trench 290-7 is being etched.

Figure 45A:
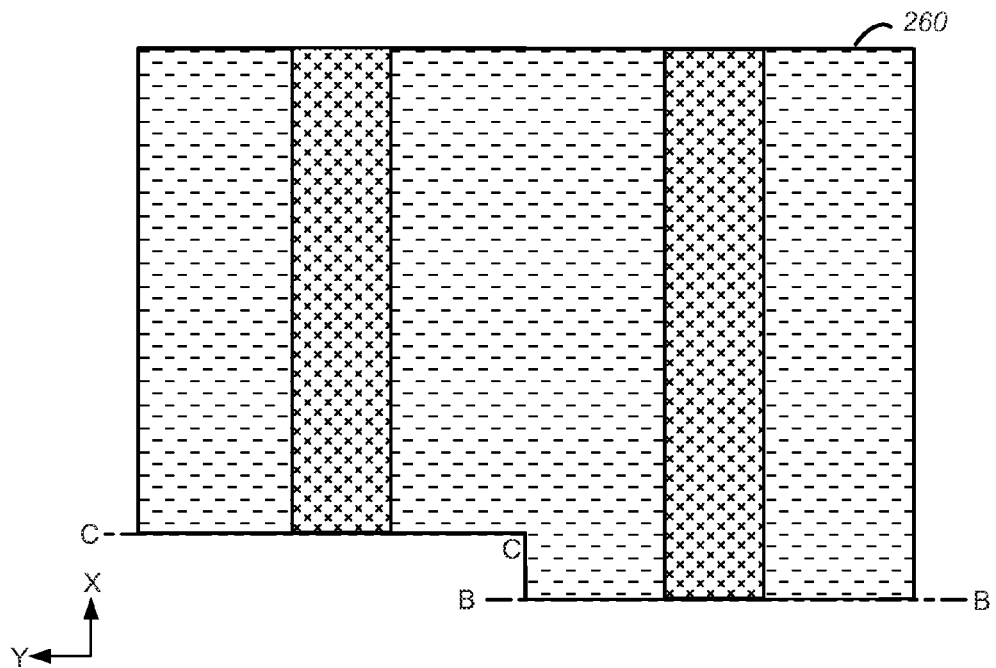
FIG. 45A is a top view of the multi-layer slab after an anisotropic etch to remove the layer of oxide 270-1 and the layer of n-polysilicon 230$n1$' at the bottom 290-7 of the trench 290-7.

FIG. 45A is a top view of the multi-layer slab after an anisotropic etch to remove the layer of oxide 270-1 and the layer of n-polysilicon 230$n$1' at the bottom 290-7 of the trench 290-7.

Figure 45B:
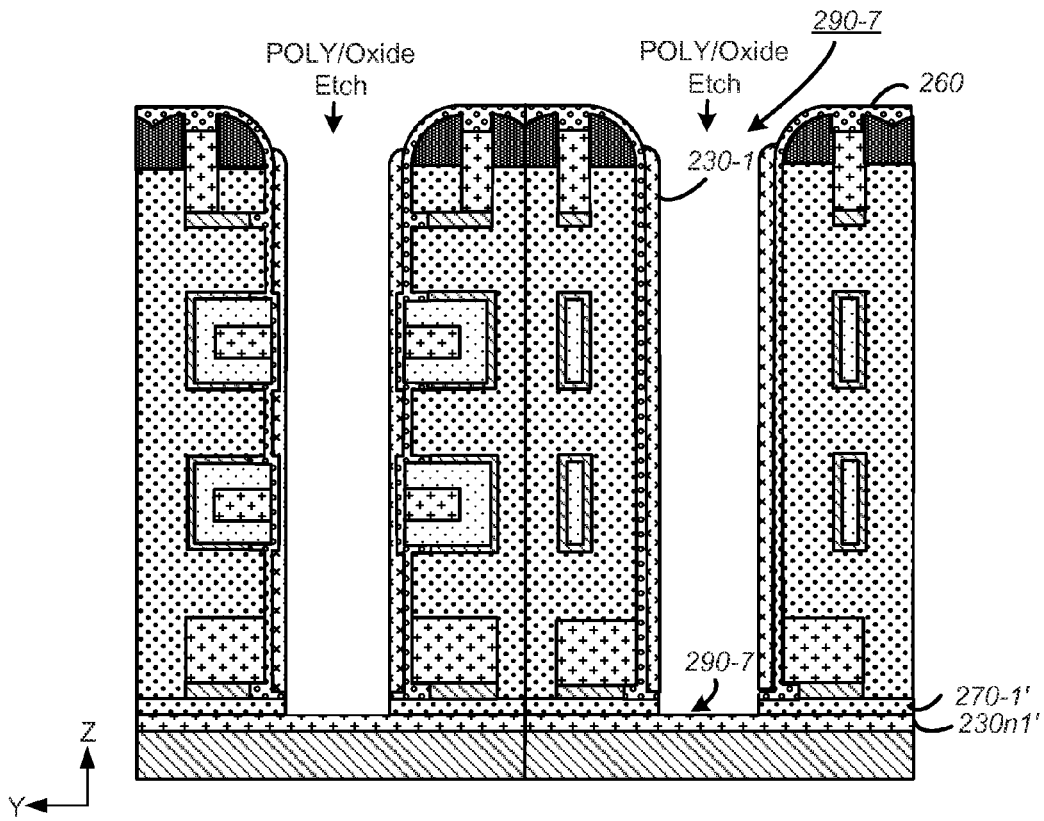
FIG. 45B is a sectional view in the y-z plane of the multi-layer slab shown in FIG. 45A.

FIG. 45B is a sectional view in the y-z plane of the multi-layer slab shown in FIG. 45A. The right section corresponds to the section taken at the cut B-B, which is shown in FIG. 9A and FIG. 45A. The left section corresponds to the section taken at the cut C-C, which is shown in FIG. 9A and FIG. 45A. As can be more clearly seen in this view, the anisotropic removes the layer of oxide 270-1 and the layer of n-polysilicon 230$n$1' at the bottom 290-7 of the trench 290-7 while the initial protective layer of p-doped polysilicon 230-1 protects the layer of tunnel oxide in the trench 290-7.

Figure 46A:
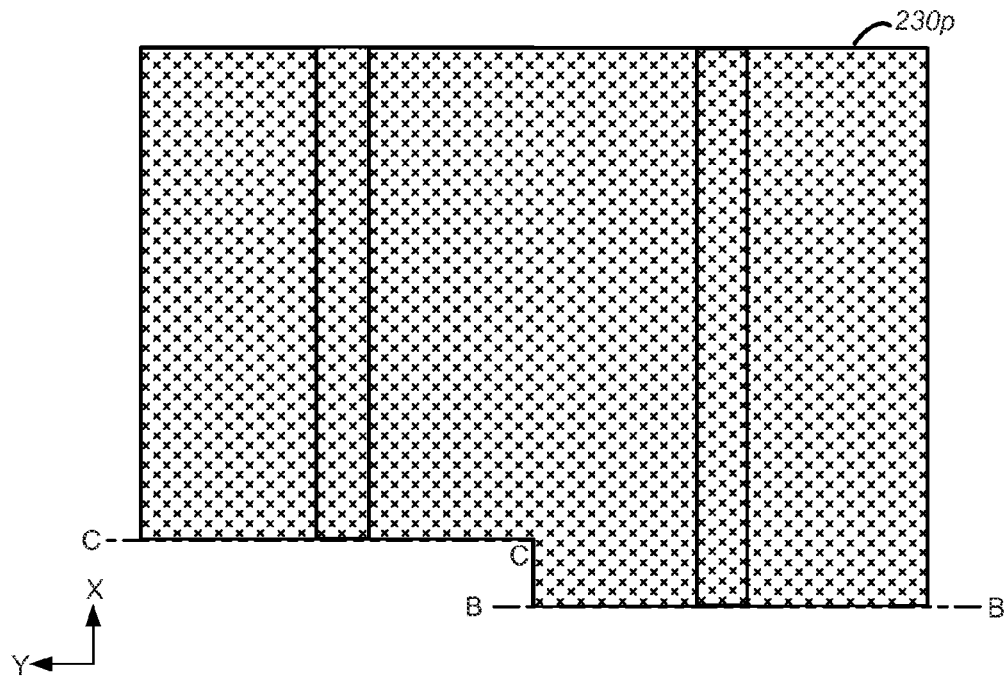
FIG. 46A is a top view of the multi-layer slab after an isotropic deposition of a final layer of p-doped polysilicon 230$p$.

FIG. 46A is a top view of the multi-layer slab after an isotropic deposition of a final layer of p-doped polysilicon 230$p$.

Figure 46B:
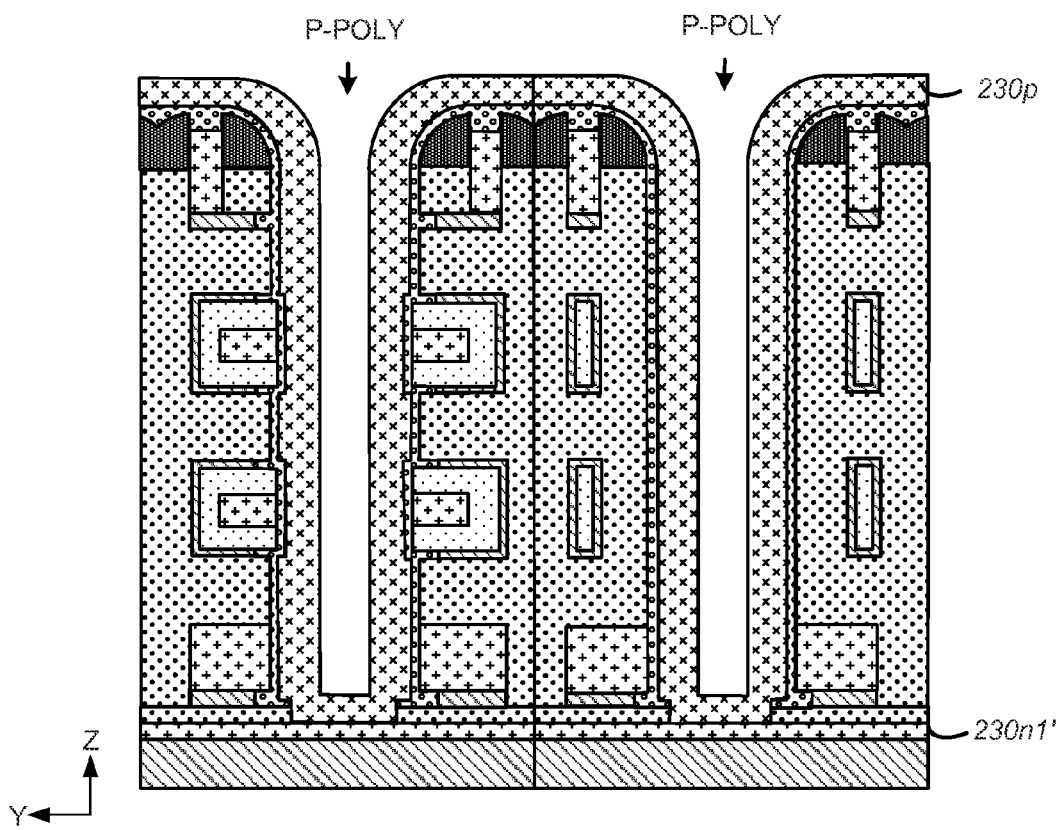
FIG. 46B is a sectional view in the y-z plane of the multi-layer slab shown in FIG. 46A.

FIG. 46B is a sectional view in the y-z plane of the multi-layer slab shown in FIG. 46A. The right section corresponds to the section taken at the cut B-B, which is shown in FIG. 9A and FIG. 46A. The left section corresponds to the section taken at the cut C-C, which is shown in FIG. 9A and FIG. 46A. As can be more clearly seen in this view, the isotropic deposition of the final protective layer of p-doped polysilicon 230 is on over the layer of tunnel oxide 260. The p-doped polysilicon 230$p$ will form the bulk of the bit line 230. At the bottom of the trench, the p-doped polysilicon 230$p$ is in contact with the n-doped layer.

Figure 47A:
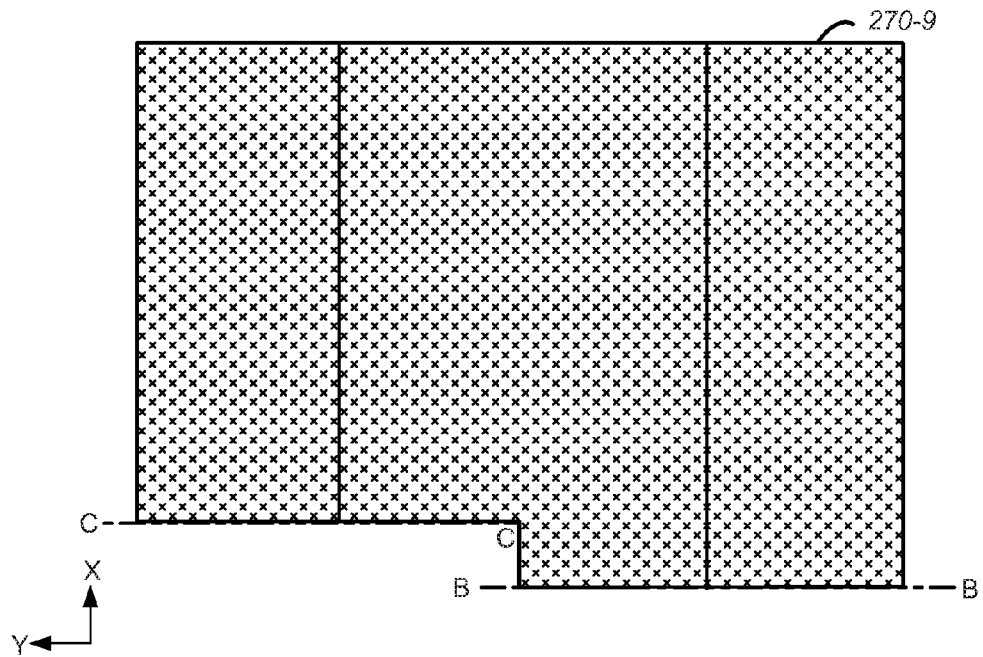
FIG. 47A is a top view of the multi-layer slab after an isotropic deposition of a layer of oxide 279-9 to fill the trench 290-7.

FIG. 47A is a top view of the multi-layer slab after an isotropic deposition of a layer of oxide 279-9 to fill the trench 290-7.

Figure 47B:
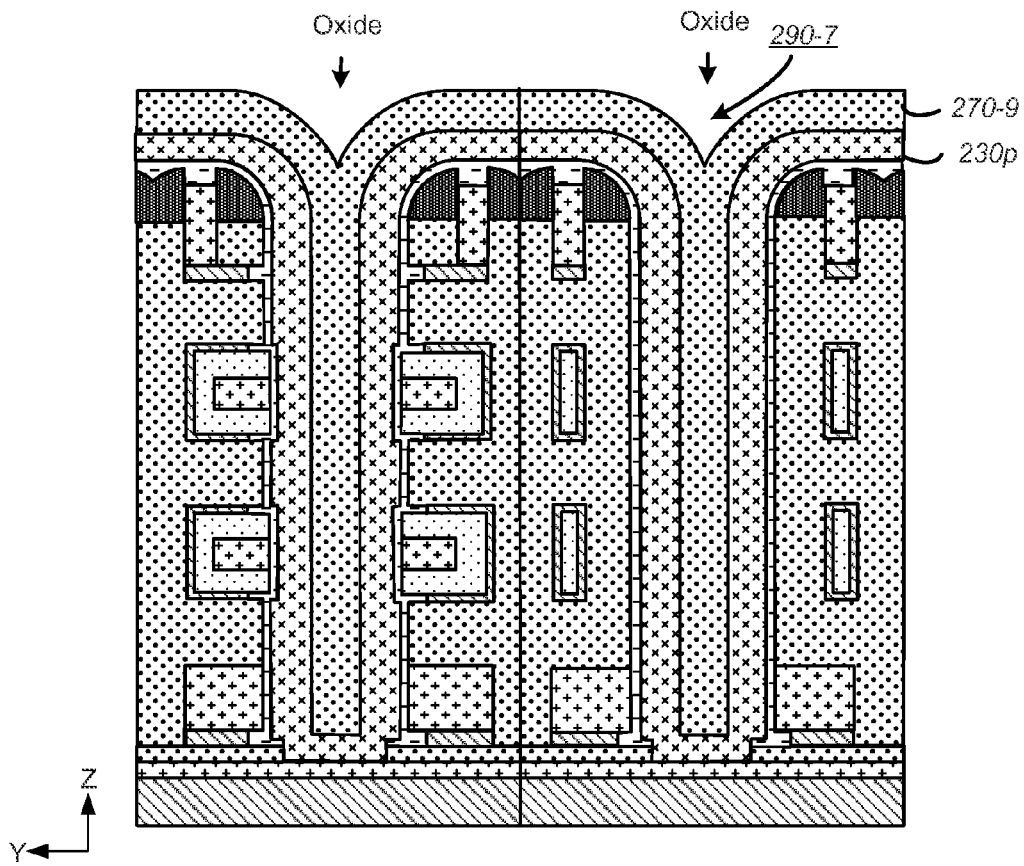
FIG. 47B is a sectional view in the y-z plane of the multi-layer slab shown in FIG. 47A.

FIG. 47B is a sectional view in the y-z plane of the multi-layer slab shown in FIG. 47A. The right section corresponds to the section taken at the cut B-B, which is shown in FIG. 9A and FIG. 47A. The left section corresponds to the section taken at the cut C-C, which is shown in FIG. 9A and FIG. 47A. As can be more clearly seen in this view, the isotropic deposition of the layer of oxide 270-9 is over the layer of p-doped polysilicon 230$p$ and fills the trench 290-7.

Figure 48A:
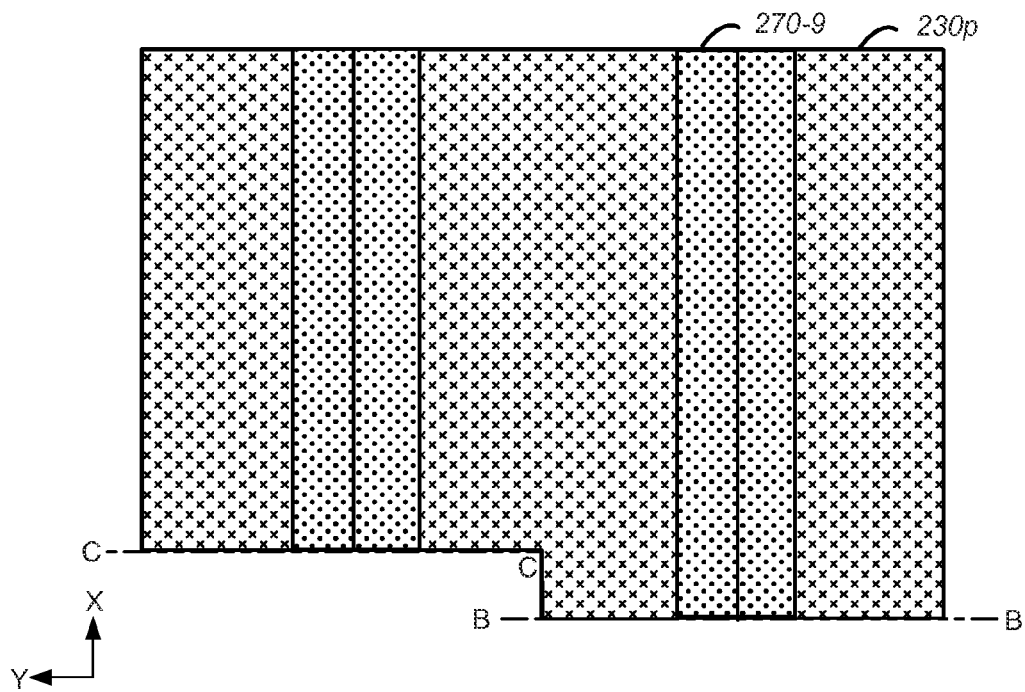
FIG. 48A is a top view of the multi-layer slab after planarization of the layer of oxide 270-9.

FIG. 48A is a top view of the multi-layer slab after planarization of the layer of oxide 270-9. The planarization is effected by a chemical, mechanical process.

Figure 48B:
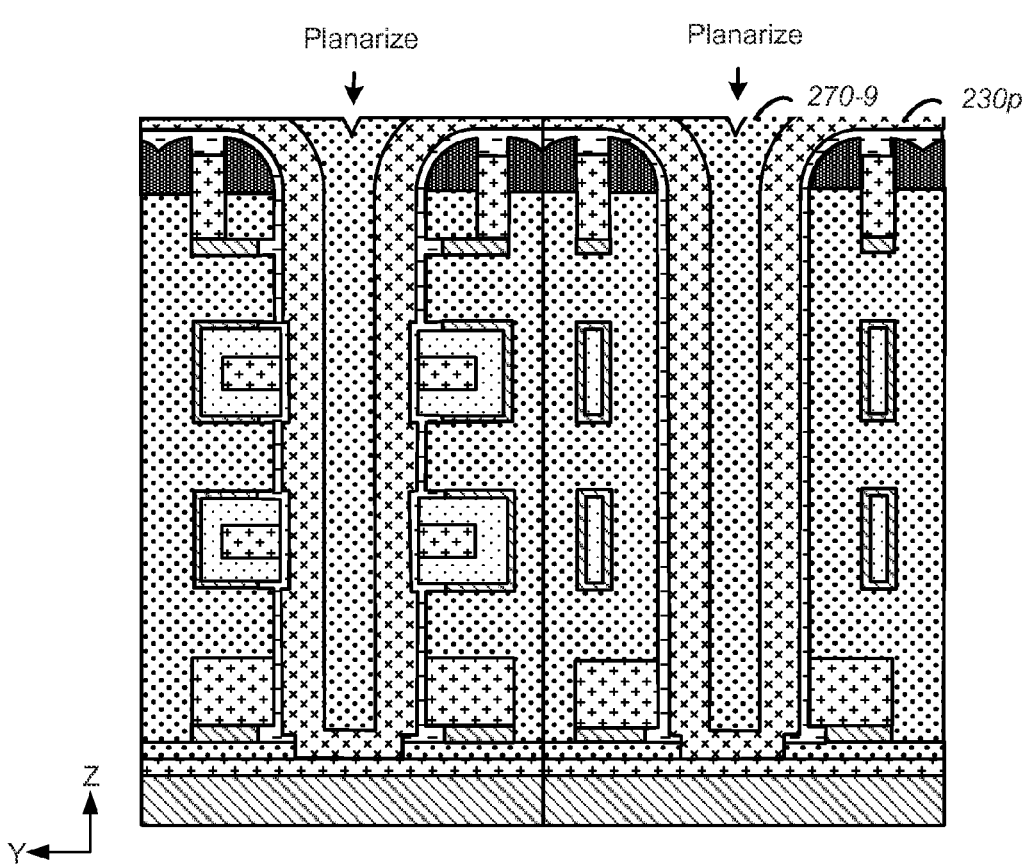
FIG. 48B is a sectional view in the y-z plane of the multi-layer slab shown in FIG. 48A.

FIG. 48B is a sectional view in the y-z plane of the multi-layer slab shown in FIG. 48A. The right section corresponds to the section taken at the cut B-B, which is shown in FIG. 9A and FIG. 48A. The left section corresponds to the section taken at the cut C-C, which is shown in FIG. 9A and FIG. 48A. As can be more clearly seen in this view, the layer of oxide 270-7 is removed only from the top of the slab to expose the underlying layer of p-doped polysilicon 230$p$ at the top of the multi-layer slab.

Figure 49A:
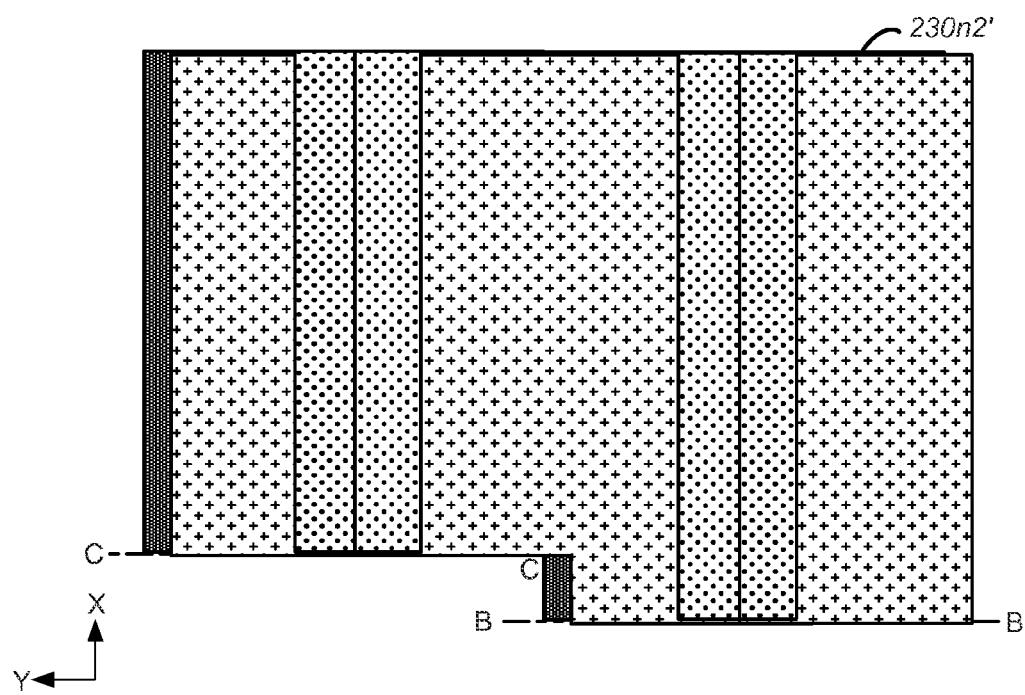
FIG. 49A is a top view of the multi-layer slab after n-implant at the surface of the p-doped polysilicon 230 at the top of the multi-layer slab.

FIG. 49A is a top view of the multi-layer slab after n-implant at the surface of the p-doped polysilicon 230 at the top of the multi-layer slab. The implant converts a top layer of the p-doped polysilicon 230$p$ near the top of the multi-layer slab to n-doped polysilicon 230$n$2'.

Figure 49B:
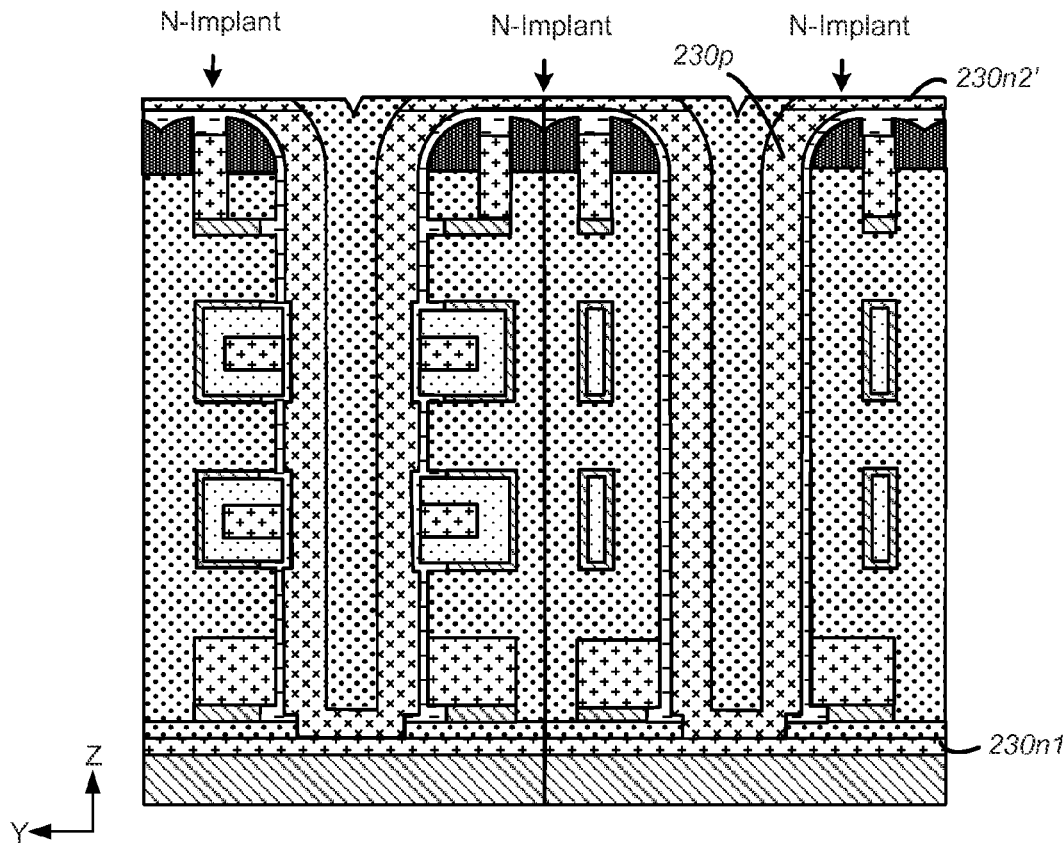
FIG. 49B is a sectional view in the y-z plane of the multi-layer slab shown in FIG. 49A.

FIG. 49B is a sectional view in the y-z plane of the multi-layer slab shown in FIG. 49A. The right section corresponds to the section taken at the cut B-B, which is shown in FIG. 9A and FIG. 49A. The left section corresponds to the section taken at the cut C-C, which is shown in FIG. 9A and FIG. 49A. As can be more clearly seen in this view, the implant converts a top layer of the p-doped polysilicon 230$p$ near the top of the multi-layer slab to n-doped polysilicon 230$n$2'. It will be seen that the bit line 230 and NAND channel 52 are effectively constituted from an npn channel given by the layer of n-doped polysilicon 230$n$1', the layer of p-doped polysilicon 230$p$ and the layer of n-doped polysilicon 230$n$2'.

Figure 50A:
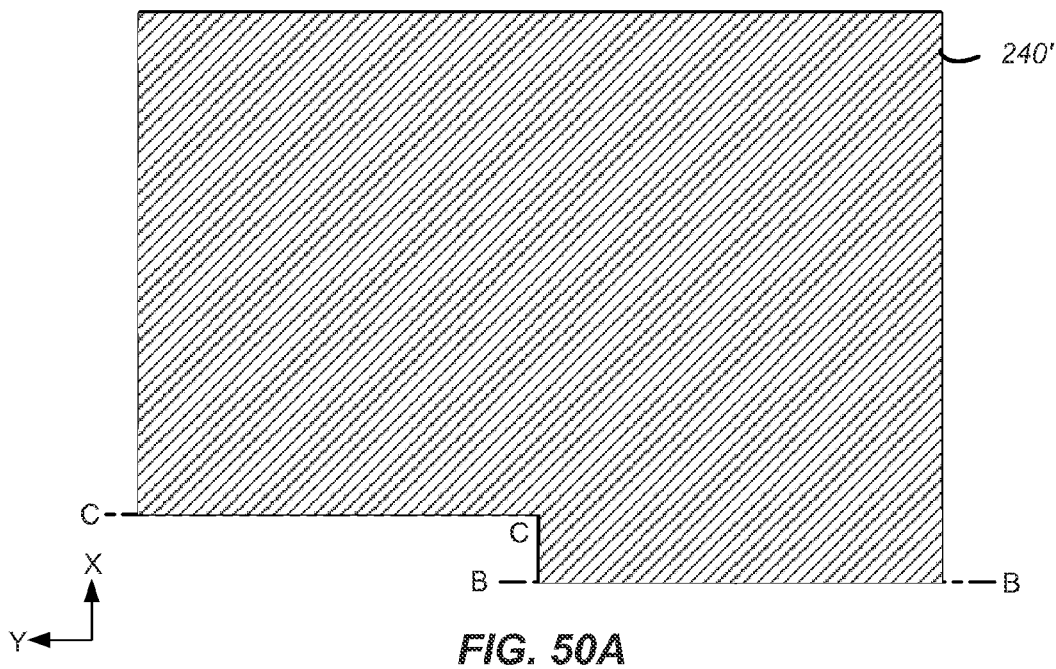
FIG. 50A is a top view of the multi-layer slab after an isotropic deposition of a layer of metal 240'.

FIG. 50A is a top view of the multi-layer slab after an isotropic deposition of a layer of metal 240'.

Figure 50B:
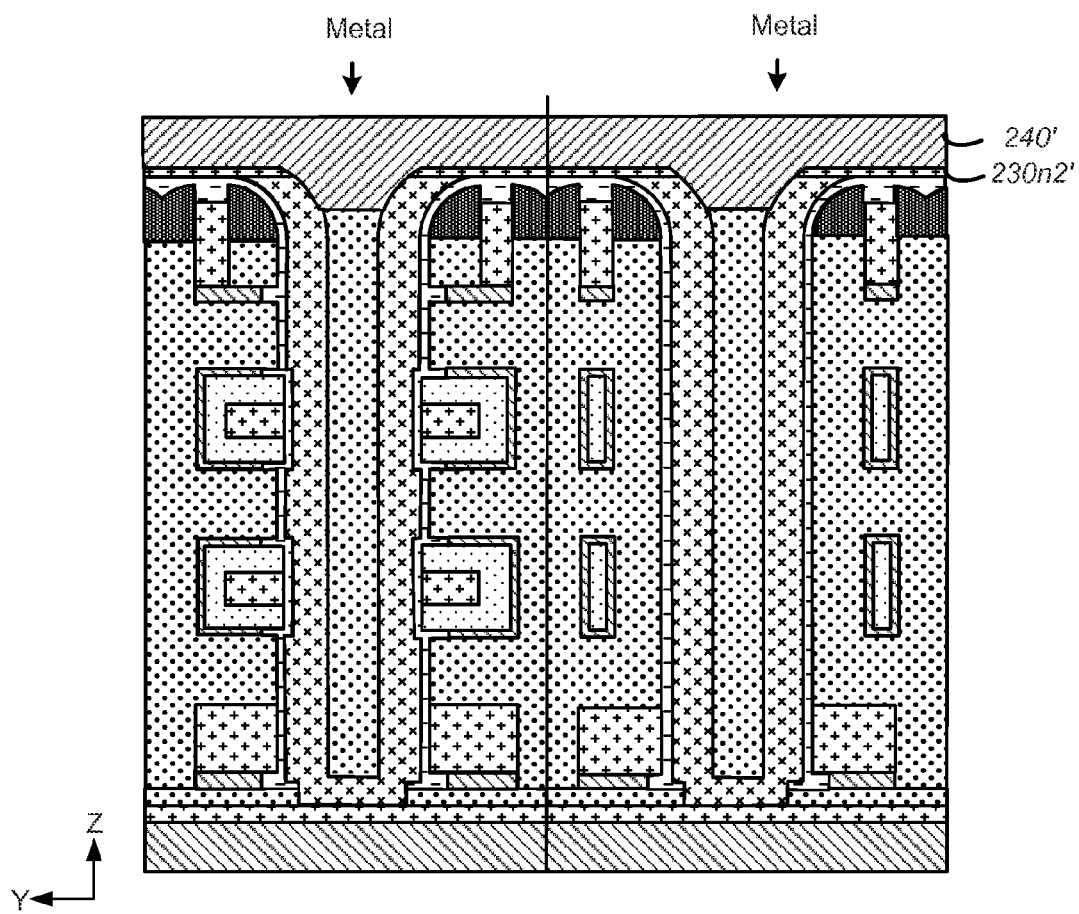
FIG. 50B is a sectional view in the y-z plane of the multi-layer slab shown in FIG. 50A.

FIG. 50B is a sectional view in the y-z plane of the multi-layer slab shown in FIG. 50A. The right section corresponds to the section taken at the cut B-B, which is shown in FIG. 9A and FIG. 50A. The left section corresponds to the section taken at the cut C-C, which is shown in FIG. 9A and FIG. 50A. As can be more clearly seen in this view, the isotropic deposition of the layer of metal 240' is over the layer of n-doped polysilicon 230$n$2'. This metal layer 240' will form the global bit lines 240.

Figure 51A:
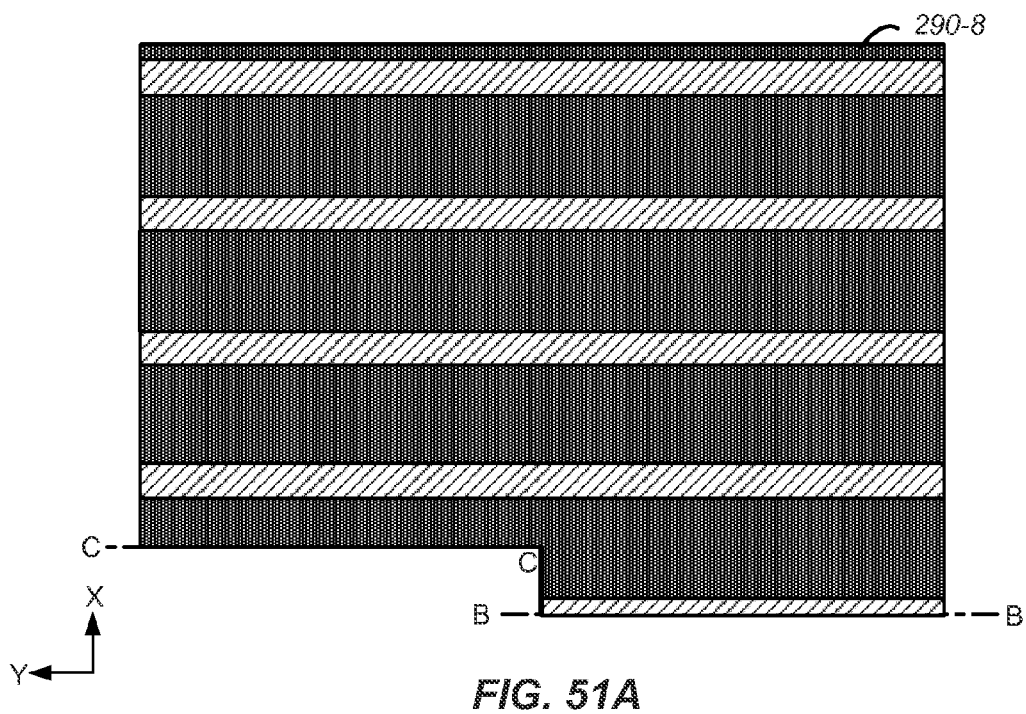
FIG. 51A is a top view of the multi-layer slab after masking with a mask 290-8 to enable isolation of the metal layer 240' to form global bit line 240 that are spaced apart in the x-direction.

FIG. 51A is a top view of the multi-layer slab after masking with a mask 290-8 to enable isolation of the metal layer 240' to form global bit line 240 that are spaced apart in the x-direction. The mask 290-8 masks portions where the memory cells reside along a word line in the x-direction and provides exposing strips in between the memory cells.

Figure 51B:
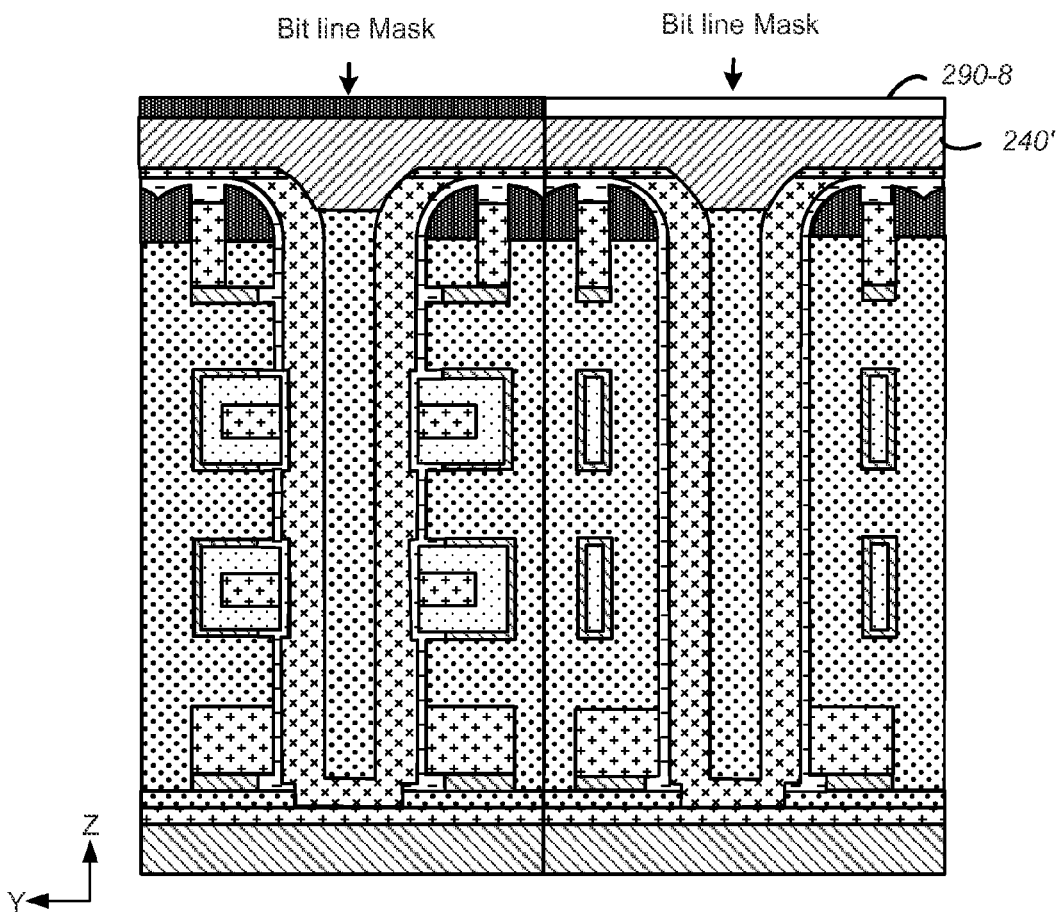
FIG. 51B is a sectional view in the y-z plane of the multi-layer slab shown in FIG. 51A.

FIG. 51B is a sectional view in the y-z plane of the multi-layer slab shown in FIG. 51A. The right section corresponds to the section taken at the cut B-B, which is shown in FIG. 9A and FIG. 23A. The left section corresponds to the section taken at the cut C-C, which is shown in FIG. 9A and FIG. 23A. As can be more clearly seen in this view, the section taken at the cut B-B is in the middle of an exposing strip and therefore will expose the underlying layer of metal 240'. The section taken at the cut C-C, is in the middle of a memory cell along a word line and will be masked.

Global Bit Lines Isolation

Figure 52A:
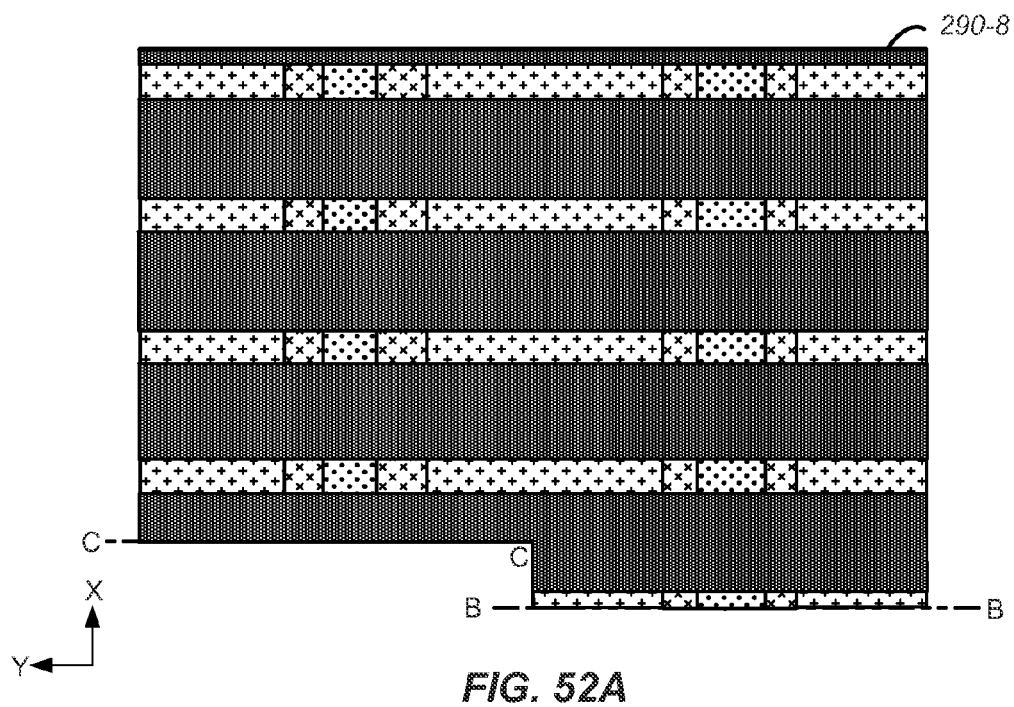
FIG. 52A is a top view of the multi-layer slab after an anisotropic metal etch to remove regions of the layer of metal 240' through the exposing strips.

FIG. 52A is a top view of the multi-layer slab after an anisotropic metal etch to remove regions of the layer of metal 240' through the exposing strips.

Figure 52B:
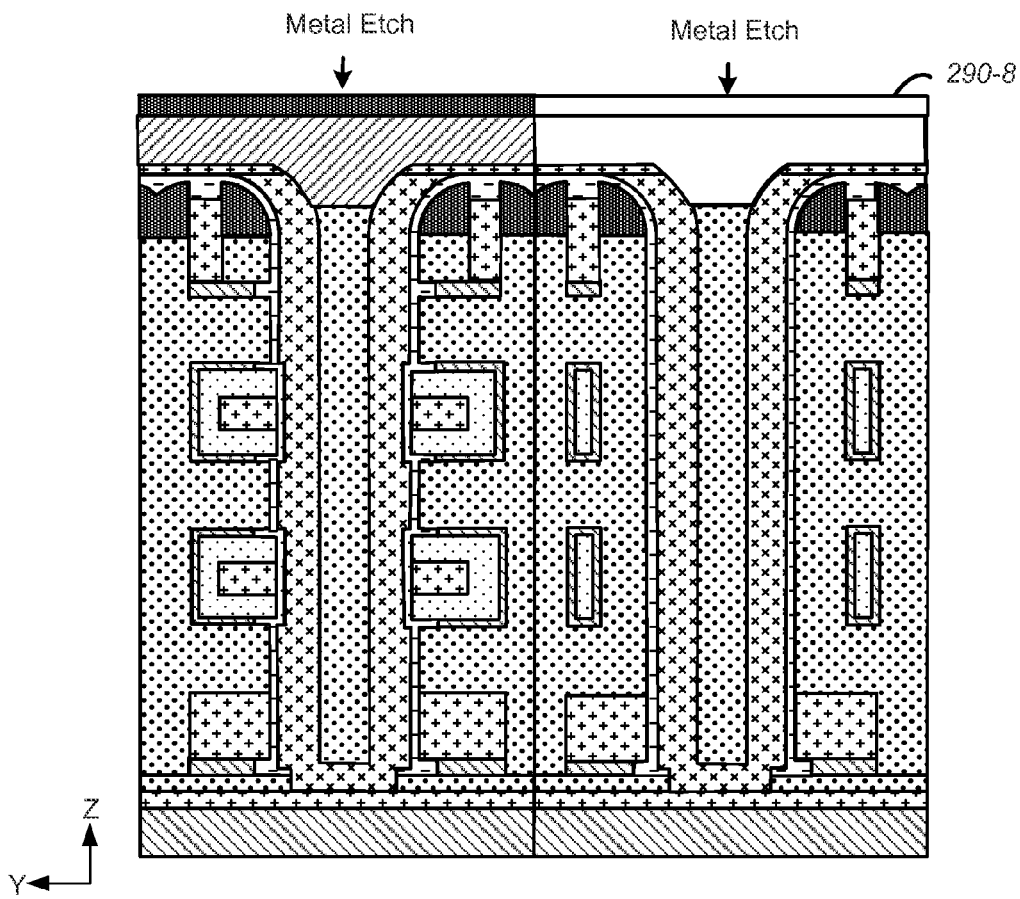
FIG. 52B is a sectional view in the y-z plane of the multi-layer slab shown in FIG. 52A.

FIG. 52B is a sectional view in the y-z plane of the multi-layer slab shown in FIG. 52A. The right section corresponds to the section taken at the cut B-B, which is shown in FIG. 9A and FIG. 52A. The left section corresponds to the section taken at the cut C-C, which is shown in FIG. 9A and FIG. 52A. As can be more clearly seen in this view, the anisotropic metal etch removes regions of the layer of metal 240' through the exposing strips. This will isolate the metal layer 240' into individual global bit lines 240 that running along the y-direction and spaced apart in the x-direction.

CONCLUSION

The foregoing detailed description of the subject matter has been presented for purposes of illustration and description. It is not intended to be exhaustive or to limit the subject matter to the precise form disclosed. Many modifications and variations are possible in light of the above teaching. The described embodiments were chosen in order to best explain the principles of the present subject matter and its practical application. It is intended that the scope of the subject matter be defined by the claims appended hereto.

It is claimed:

1. A 3D nonvolatile memory, comprising:
   a semiconductor substrate;
   a 3D array of memory cells arranged in a three-dimensional pattern on top of said semiconductor substrate;
   said 3D array of memory cells being organized into a 2D array of NAND strings aligned vertically relative to the substrate, each NAND string comprising a daisy-chain of vertically stacked memory cells;
   corresponding memory cells of said vertically stacked memory cells from said 2D array of NAND strings forming a 2D array of memory cells in each of a corresponding stack of memory planes;
   a plurality of word lines in each memory plane for accessing respective groups of memory cells in the memory plane, each word line having a socket component for each memory cell of the group; and
   said each memory cell of the group having a floating gate embedded into said socket component of said each word line.

2. The 3D nonvolatile memory as in claim 1, wherein:
   said socket component has a closed end and an open end; and
   said floating gate has a long axis in the memory plane and has an embedded end being embedded in the closed end of said socket component and an open end being at the open end of said socket component.

3. The 3D nonvolatile memory as in claim 1, further comprising:
   a dielectric insulating said floating gate from said socket component.

4. The 3D nonvolatile memory as in claim 1, wherein said floating gate is of doped polysilicon material.

5. The 3D nonvolatile memory as in claim 1, wherein said plurality of word lines are metallic.

6. The 3D nonvolatile memory as in claim 1, wherein each NAND string further comprises:
   a channel having first and second ends terminated by a source-side transistor on the first end and a drain-side transistor on the second end.

7. The 3D nonvolatile memory as in claim 6, further comprising:
   a tunnel oxide insulating the open end of said floating gate from said channel.

8. The 3D nonvolatile memory as in claim 6, further comprising:
   a tunnel oxide insulating between the open end of said socket component from said channel; and
   wherein the open end of said socket component is recessed from the open end of the floating gate such that the tunnel oxide is thicker between the channel and the open end of said socket component than between the channel and the open end of said floating gate.

9. The 3D nonvolatile memory as in claim 6, wherein said channel of each NAND string is of doped polysilicon material.

10. The 3D nonvolatile memory as in claim 6, wherein
    the drain-side transistor has a control gate; and
    the drain-side transistors of a group of NAND strings have associated control gates interconnected by a metal line.

11. The 3D nonvolatile memory as in claim 6, wherein
    the source-side transistor has a control gate; and
    the source-side transistors of a group of NAND strings have associated control gates interconnected by a metal line.

12. The 3D nonvolatile memory as in claim 6, further comprising:
    a plurality of global bit lines, each global bit line connected to each respective NAND string via each respective drain-side transistor.

13. The 3D nonvolatile memory as in claim 12, wherein:
    the plurality of global bit lines are metal lines on top of said stack of memory planes.

14. The 3D nonvolatile memory as in claim 1, wherein individual memory cells each stores more than one bit of data.

15. A 3D nonvolatile memory, comprising:
    an array of memory cells arranged in a three-dimensional pattern defined by rectangular coordinates having x-, y- and z-directions;
    said array of memory cells being organized into NAND strings aligned vertically in the z-direction to form a 2D array of NAND strings on top of a semiconductor substrate in the x-y plane, each NAND string comprising a daisy-chain of vertically stacked memory cells;
    corresponding memory cells of said vertically stacked memory cells from said 2D array of NAND strings forming a 2D array of memory cells in each of a corresponding stack of memory planes in the x-y plane;
    a plurality of word lines along the x-direction in each memory plane for accessing respective groups of memory cells in the memory plane, each word line having a socket component for each memory cell of the group; and said each memory cell of the group having a floating gate embedded into said socket component of said each word line.

16. A 3D nonvolatile memory as in claim 15, wherein:
said socket component has a closed end and an open end; and
said floating gate has a long axis in the memory plane and has an embedded end being embedded in the closed end of said socket component and an open end being at the open end of said socket component.

17. The 3D nonvolatile memory as in claim 15, further comprising:
a dielectric insulating said floating gate from said socket component.

18. The 3D nonvolatile memory as in claim 15, wherein said floating gate is of doped polysilicon material.

19. The 3D nonvolatile memory as in claim 15, further comprising:
a plurality of global bit lines along the y-direction and spaced apart in the x-direction;
each global bit line connected to each respective NAND string via each respective drain-side transistor.

20. A 3D nonvolatile memory, comprising:
a semiconductor substrate;
a 3D array of memory cells arranged in a three-dimensional pattern on top of said semiconductor substrate;
said 3D array of memory cells being organized into a 2D array of NAND strings aligned vertically relative to the substrate, each NAND string comprising a daisy-chain of vertically stacked memory cells;
a plurality of word lines for accessing respective groups of memory cells, each word line having a socket component for each memory cell of the group; and
said each memory cell of the group having a floating gate embedded into said socket component of said each word line.

* * * * *